(12) United States Patent
Kawata

(10) Patent No.: US 9,768,198 B2
(45) Date of Patent: *Sep. 19, 2017

(54) DISPLAY DEVICE AND ELECTRONIC DEVICE

(71) Applicant: Semiconductor Energy Laboratory Co., Ltd., Kanagawa-ken (JP)

(72) Inventor: Takuya Kawata, Atsugi (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/160,168

(22) Filed: May 20, 2016

(65) Prior Publication Data

US 2016/0268315 A1  Sep. 15, 2016

Related U.S. Application Data

(63) Continuation of application No. 14/577,166, filed on Dec. 19, 2014, now Pat. No. 9,356,246.

(30) Foreign Application Priority Data

Dec. 25, 2013  (JP) ................................. 2013-267177

(51) Int. Cl.
*H01L 29/786* (2006.01)
*H01L 27/12* (2006.01)
*H01L 51/00* (2006.01)
*H01L 51/52* (2006.01)

(52) U.S. Cl.
CPC ...... *H01L 27/1225* (2013.01); *H01L 27/1218* (2013.01); *H01L 27/1266* (2013.01); *H01L 29/7869* (2013.01); *H01L 51/0097* (2013.01); *H01L 51/5253* (2013.01); *H01L 2251/5338* (2013.01); *Y02E 10/549* (2013.01)

(58) Field of Classification Search
CPC ............................................... H01L 2251/5338
See application file for complete search history.

(56) References Cited

U.S. PATENT DOCUMENTS

| | | | |
|---|---|---|---|
| 4,934,306 A | 6/1990 | Rudolph | |
| 8,476,828 B2 | 7/2013 | Hayashi et al. | |
| 9,356,246 B2 * | 5/2016 | Kawata | ............... H01L 29/7869 |
| 2010/0007942 A1 | 1/2010 | Oikawa et al. | |
| 2010/0096633 A1 * | 4/2010 | Hatano | ............... H01L 27/1214 257/59 |
| 2010/0171138 A1 * | 7/2010 | Yamazaki | ........... H01L 27/3246 257/98 |
| 2012/0273834 A1 * | 11/2012 | Hatano | ................ H01L 51/003 257/99 |

(Continued)

FOREIGN PATENT DOCUMENTS

| | | |
|---|---|---|
| JP | 2004-077784 A | 3/2004 |
| JP | 2011-007986 A | 1/2011 |

*Primary Examiner* — Thao P Le
(74) *Attorney, Agent, or Firm* — Husch Blackwell LLP

(57) ABSTRACT

A bendable display device, lighting device, or electronic device which is unlikely to be broken when handled. The display device, lighting device, or electronic device includes two flexible substrates, and at least one of the two flexible substrates contains a plurality of glass fibers extending in one direction. Accordingly, the display device, lighting device, or electronic device has low flexibility in the one direction and is unlikely to be broken when handled.

16 Claims, 34 Drawing Sheets

(56) References Cited

U.S. PATENT DOCUMENTS

| | | |
|---|---|---|
| 2014/0254111 A1 | 9/2014 | Yamazaki et al. |
| 2014/0306260 A1 | 10/2014 | Yamazaki et al. |
| 2014/0306288 A1 | 10/2014 | Adachi et al. |
| 2014/0307314 A1 | 10/2014 | Yanagisawa et al. |
| 2014/0319550 A1 | 10/2014 | Yamazaki et al. |
| 2014/0321074 A1 | 10/2014 | Chida et al. |
| 2015/0179717 A1* | 6/2015 | Kawata ............... H01L 29/7869 257/43 |
| 2015/0314576 A1* | 11/2015 | Sun ........................ B32B 5/02 428/221 |

* cited by examiner

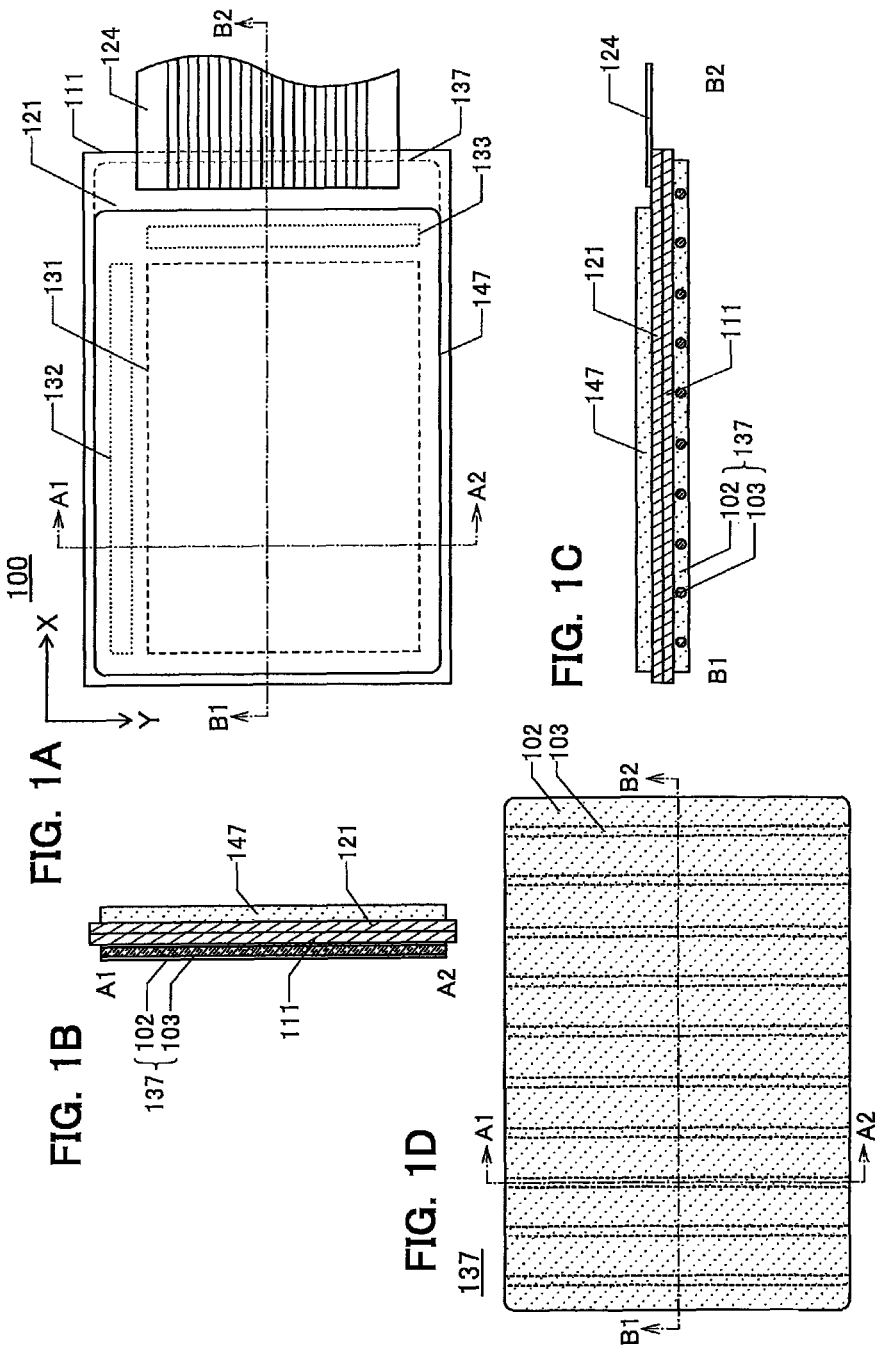

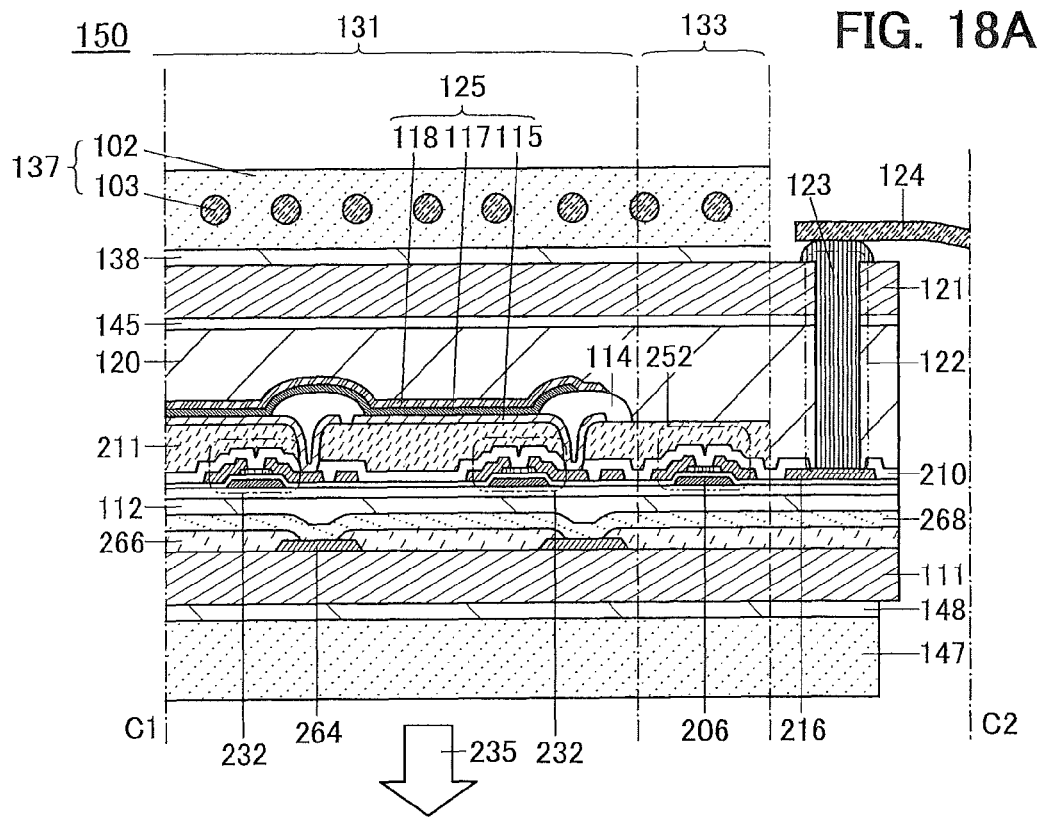
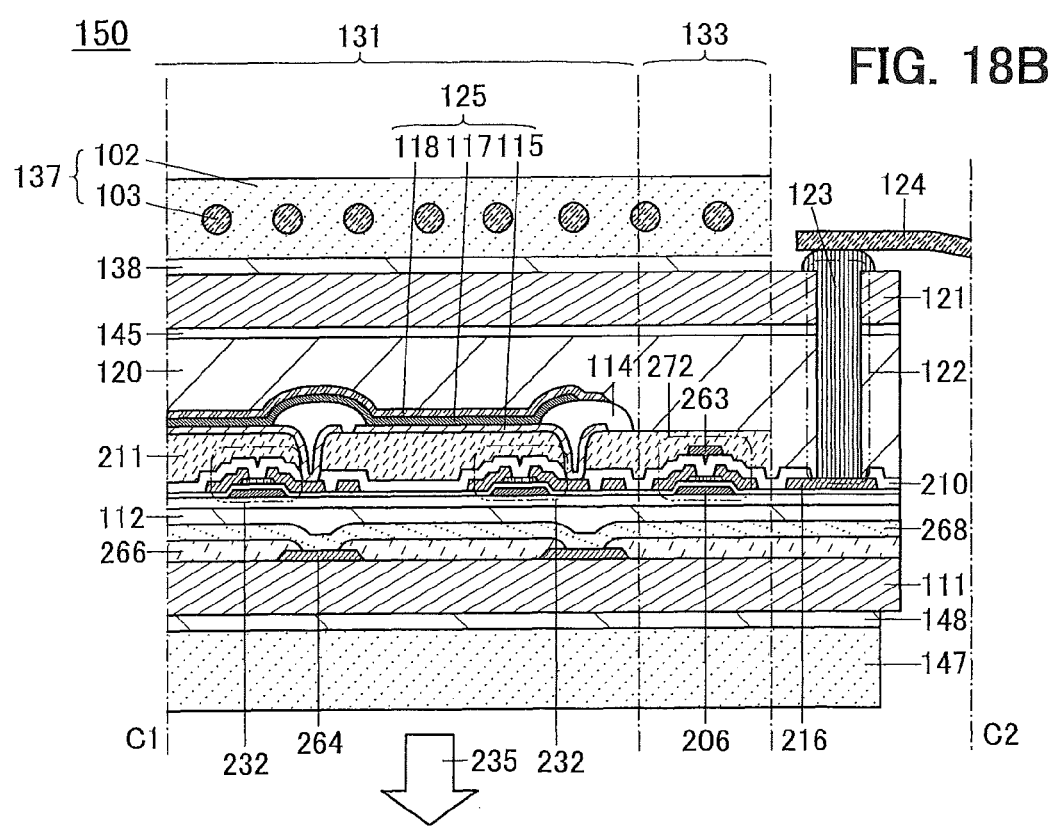

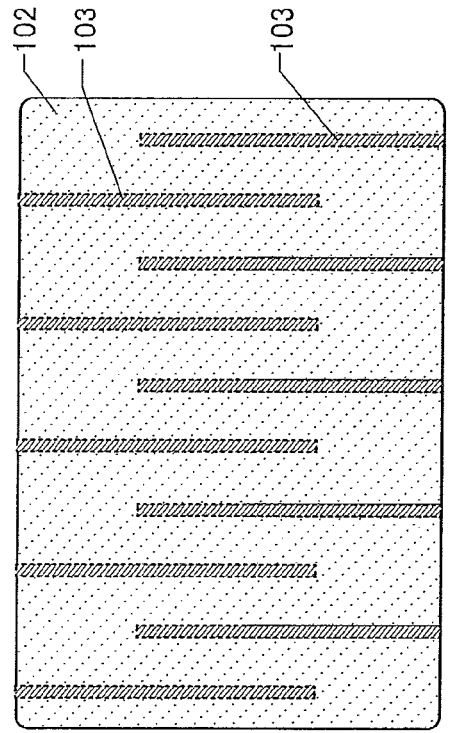
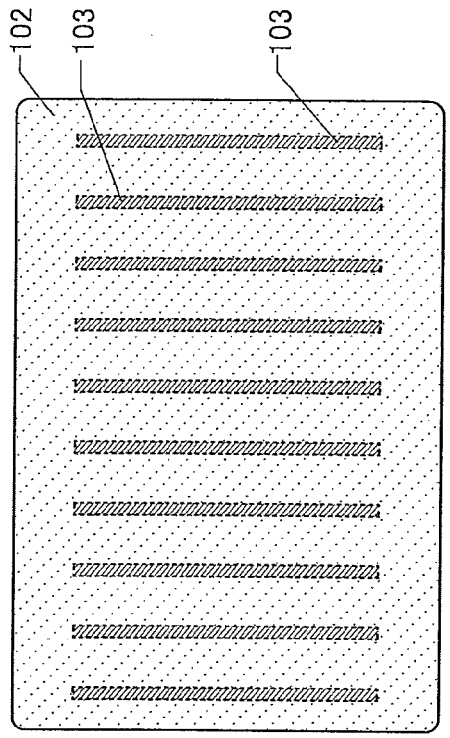
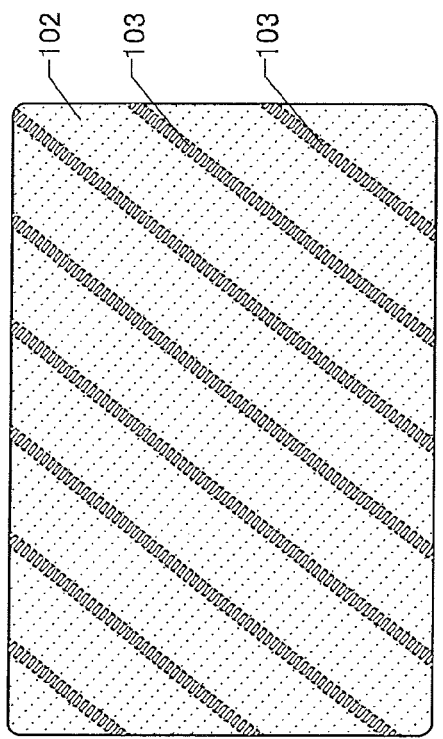
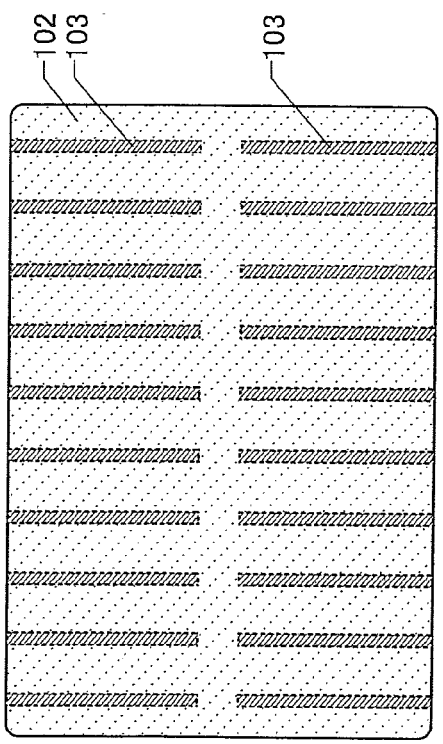

DISPLAY DEVICE AND ELECTRONIC DEVICE

This application is a continuation of copending U.S. application Ser. No. 14/577,166, filed on Dec. 19, 2014 which is incorporated herein by reference.

BACKGROUND OF THE INVENTION

1. Field of the Invention

One embodiment of the present invention relates to an object, a method, or a manufacturing method. In addition, one embodiment of the present invention relates to a process, a machine, manufacture, or a composition of matter. One embodiment of the present invention particularly relates to a light-emitting device, a display device, an electronic device, a lighting device, a manufacturing method thereof, a usage method thereof, an operation method thereof, or the like. In particular, one embodiment of the present invention relates to a light-emitting device, a display device, an electronic device, or a lighting device utilizing electroluminescence (EL), a manufacturing method thereof, a usage method thereof, an operation method thereof, or the like.

2. Description of the Related Art

The social infrastructures relating to data transmission have advanced, and it has become possible to acquire, process, and send out many pieces and various kinds of information not only at home or office but also out of home or office using a data processor. As such a data processor, a smartphone, a tablet terminal, a phablet, and the like have been developed.

Display devices for the above data processors are required to be thin and lightweight, for example, in view of portability. Display devices for the above data processors are required to be flexible and bendable for higher portability or the like.

For example, in a display device disclosed in Patent Document 1, a display panel using an EL element is covered with two films and a reinforcement member containing carbon fibers is provided, whereby the display device has both flexibility and practical strength.

REFERENCE

Patent Document

[Patent Document 1] Japanese Published Patent Application No. 2011-007986

SUMMARY OF THE INVENTION

During handling of a bendable display device, great force is applied to a certain region thereof and a malfunction might be caused in the region. For example, when such a display device is bent vertically and horizontally as a handkerchief is folded, in a region where a bending axis in the vertical direction intersects a bending axis in the horizontal direction, large distortion due to stress occurs in the display device and a short circuit might be generated.

An object of one embodiment of the present invention is to provide a display device, a lighting device, or an electronic device that is thin, lightweight, flexible, bendable, and highly reliable.

Another object of one embodiment of the present invention is to provide a repeatedly bendable display device, lighting device, or electronic device.

Another object of one embodiment of the present invention is to provide a display device, lighting device, or electronic device that is unlikely to be broken.

Another object of one embodiment of the present invention is to provide a display device, a lighting device, or an electronic device that can be easily stored and is excellent in portability.

Another object of one embodiment of the present invention is to provide a display device, lighting device, or electronic device with low power consumption.

Another object of one embodiment of the present invention is to provide a novel display device, lighting device, or electronic device.

Note that the description of these objects does not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

A display device of one embodiment of the present invention includes two flexible substrates that overlap with each other with a display element positioned therebetween. At least one of the two flexible substrates contains a plurality of glass fibers extending in one direction.

A display device of one embodiment of the present invention includes a flexible first substrate, a flexible second substrate, and a display element. The first substrate and the second substrate overlap with each other with the display element positioned therebetween. The first substrate contains a plurality of glass fibers. The plurality of glass fibers extend in one direction. Flexibility in the one direction is lower than flexibility in another direction intersecting the one direction.

A display device of one embodiment of the present invention includes a flexible first substrate, a flexible second substrate, a third substrate, a fourth substrate, and a display element. The first substrate and the second substrate overlap with each other with the third substrate and the fourth substrate positioned therebetween. The third substrate and the fourth substrate overlap with each other with the display element positioned therebetween. The first substrate contains a plurality of glass fibers. The plurality of glass fibers extend in one direction. Flexibility in the one direction is lower than flexibility in another direction intersecting the one direction.

In the above display device of one embodiment of the present invention, the one direction is a lateral direction of the display device, and the another direction is a longitudinal direction of the display device.

In the above display device of one embodiment of the present invention, the first substrate containing the glass fibers is on a non-display surface side.

In the above display device of one embodiment of the present invention, the first substrate includes silicone rubber.

In the above display device of one embodiment of the present invention, the display element is a light-emitting element, and specifically, an organic EL element, an inorganic EL element, or the like.

One embodiment of the present invention makes it possible to provide a display device, a lighting device, or an electronic device that is thin, lightweight, flexible, bendable, and highly reliable.

One embodiment of the present invention makes it possible to provide a repeatedly bendable display device, lighting device, or electronic device.

One embodiment of the present invention makes it possible to provide a display device, lighting device, or electronic device that is unlikely to be broken.

One embodiment of the present invention makes it possible to provide a display device, a lighting device, or an electronic device that can be easily stored and is excellent in portability.

One embodiment of the present invention makes it possible to provide a display device, lighting device, or electronic device with low power consumption.

One embodiment of the present invention makes it possible to provide a novel display device, lighting device, or electronic device.

Note that the description of these effects does not disturb the existence of other effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

FIGS. 1A to 1D illustrate one mode of a display device.

FIGS. 18A and 18B are cross-sectional views illustrating modes of a display device.

FIGS. 34A to 34D illustrate modes of a display device.

DETAILED DESCRIPTION OF THE INVENTION

Figure 2A:
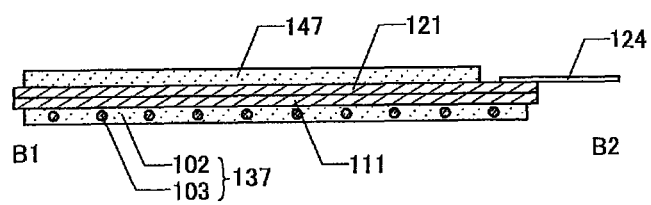
FIGS. 2A to 2D are cross-sectional views illustrating examples of bending of a display device.

Embodiments will be described in detail with reference to the drawings. Note that one embodiment of the present invention is not limited to the following description, and it will be easily understood by those skilled in the art that various changes and modifications can be made without departing from the spirit and scope of the present invention. Therefore, one embodiment of the present invention should not be construed as being limited to the description in the following embodiments. Note that in the structures of the invention described below, the same portions or portions having similar functions are denoted by the same reference numerals in different drawings, and description of such portions is not repeated.

Note that in each drawing referred to in this specification, the size of each component or the thickness of each layer might be exaggerated or a region might be omitted for clarity of the invention. Therefore, embodiments of the invention are not limited to such scales. Especially in a top view (a plan view) and a perspective view, some components might be omitted for easy understanding.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Further, functions of a source and a drain might be switched depending on operation condition, e.g., when a transistor having a different polarity is employed or a direction of current flow is changed in circuit operation. Therefore, it is difficult to define which is the source (or the drain). Thus, the terms "source" and "drain" can be used to denote the drain and the source, respectively.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used in this specification, there is a case in which no physical connection is made and a wiring is just extended in an actual circuit.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "equal" allows for a maximum error of ±5%.

In this specification, in the case where an etching step is performed after a photolithography process, a resist mask formed in the photolithography process is removed after the etching step, unless otherwise specified.

Embodiment 1

In this embodiment, a structure of a display device of one embodiment of the present invention is described with reference to FIGS. 1A to 1D, FIGS. 2A to 2D, and FIGS. 3A and 3B. In this embodiment, a longitudinal direction of a display device 100 is referred to as an X direction, and a lateral direction thereof is referred to as a Y direction for convenience of explanation. Specifically, the direction denoted by X in the drawings is referred to as the X direction and the direction denoted by Y in the drawings is referred to as the Y direction, and the X direction and the Y direction intersect each other.

FIG. 1A is a top view of the display device 100 and FIG. 1B is a cross-sectional view taken along a dashed-dotted line A1-A2 in FIG. 1A. FIG. 1C is a cross-sectional view taken along a dashed-dotted line B1-B2 in FIG. 1A. FIG. 1D is a top view of a substrate 137 which is a component of the display device 100.

The display device 100 illustrated in FIG. 1A includes a substrate 111, a substrate 121, the substrate 137, and a substrate 147. The display device 100 also includes a display region 131, a driver circuit 132, a driver circuit 133, and an external electrode 124.

As shown in FIGS. 1B and 1C, the substrate 111 and the substrate 121 overlap with each other and the substrate 137 and the substrate 147 overlap with each other with the substrate 111 and the substrate 121 positioned therebetween.

The substrate 137 includes, as illustrated in FIG. 1D, an insulator 102 and a plurality of glass fibers 103. Each of the plurality of glass fibers 103 extends in the Y direction. The substrate 137 can increase the rigidity of the display device 100 against bending in the Y direction. That is, the flexibility of the display device 100 in the Y direction can be low. Meanwhile, by extending in the Y direction, the glass fibers 103 do not affect the rigidity of the display device 100 against bending in the X direction. In other words, the glass fibers 103 do not affect the flexibility of the display device 100 in the X direction. Thus, by including the substrate 137, the display device 100 can be easily bent in the X direction but not in the Y direction.

In this manner, since the display device 100 illustrated in FIG. 1A includes the substrate 137 illustrated in FIG. 1D, the flexibility of the display device 100 in the Y direction is sufficiently lower than that in the X direction. As a result, the display device 100 is easily bent in the X direction but not in the Y direction when handled, and thus, a region where a bending axis in the X direction intersects a bending axis in the Y direction is unlikely to be formed, which can inhibit large distortion due to stress in the display device 100.

Figure 2B:
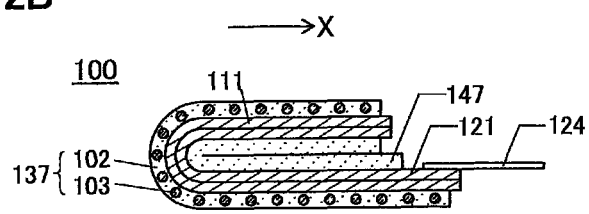
Figure 2C:
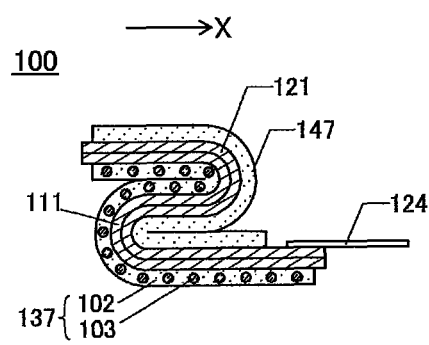
Figure 2D:
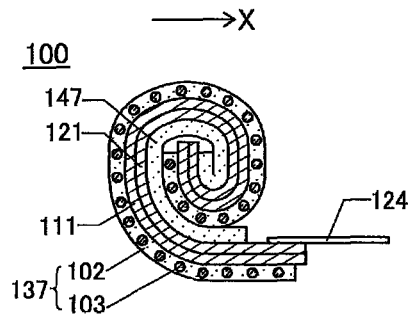

Next, the display device 100 in a bent state is described with reference to FIGS. 2A to 2D. FIG. 2A corresponds to FIG. 1C. FIGS. 2B to 2D each illustrate a state where the display device 100 illustrated in FIG. 2A is bent in the X direction. Specifically, FIG. 2B illustrates the display device 100 that is bent in the X direction to be folded double. FIG. 2C illustrates the display device 100 that is bent in the X direction to be folded in three. FIG. 2D illustrates the display device 100 that is bent in the X direction to be rolled up. In this manner, because of the substrate 137 containing the plurality of glass fibers 103 extending in the Y direction, the display device 100 is not easily bent in the Y direction but can be easily bent in the X direction.

The restorability of the glass fibers 103 is so high that the glass fibers 103 are not easily broken and are preferable as a material for controlling the flexibility of the display device 100 in the Y direction.

In addition, because of not being conductive, the glass fibers 103 do not form unintended capacitance with another component in the display device 100, so that favorable display in the display region 131 is secured.

Each of the plurality of glass fibers 103 has a thread-like shape and its length is sufficiently larger than its thickness or width. Since each of the plurality of glass fibers 103 has a thread-like shape instead of a bead-like shape or a powder-like shape, the flexibility of the display device 100 in the Y direction can be reduced with high controllability.

When the direction in which the plurality of glass fibers 103 extend and the direction in which a wiring of the display device 100 extends are the same, the wiring can be prevented from being broken. For example, when the plurality of glass fibers 103 extend in the Y direction and the flexibility of the display device 100 in the Y direction is low, scan lines or signal lines of the display device 100 can be prevented from being broken when arranged in the Y direction.

As described above, one embodiment of the present invention makes it possible to provide a display device, a lighting device, or an electronic device that is flexible, bendable, and highly reliable.

One embodiment of the present invention makes it possible to provide a repeatedly bendable display device, lighting device, or electronic device.

One embodiment of the present invention makes it possible to provide a display device, lighting device, or electronic device that is unlikely to be broken.

One embodiment of the present invention makes it possible to provide a display device, a lighting device, or an electronic device that can be easily stored and is excellent in portability.

Note that in the display device 100 in this embodiment, the flexibility in the Y direction is made lower than that in the X direction with the use of the substrate 137 containing the plurality of glass fibers 103 extending in the Y direction; however, one embodiment of the present invention is not limited thereto. For example, the flexibility of the display device 100 in the X direction may be made lower than that in the Y direction with the use of the substrate 137 containing the plurality of glass fibers 103 extending in the X direction. Alternatively, the plurality of glass fibers 103 may extend in a diagonal direction. An example of this structure is shown in FIG. 34A.

In the display device 100 in this embodiment, the glass fibers 103 extend in the Y direction without a break from one side of the substrate to the other; however, one embodiment of the present invention is not limited thereto. For example, the glass fibers 103 may extend in the Y direction from a portion on an inner side than one side of the substrate to a portion on an inner side than the other side of the substrate. The glass fibers 103 may be discontinuous. Examples of these structures are shown in FIGS. 34B to 34D. The flexibility of the display device 100 may be adjusted by adjustment of the thickness or density of the glass fibers 103.

In this embodiment, Young's modulus can be used as an index of the flexibility of the display device 100. For example, by comparing the Young's modulus measured when the display device 100 is bent in the X direction and the Young's modulus measured when the display device 100 is bent in the Y direction, the flexibility of the display device 100 in the X direction and that in the Y direction can be evaluated. When the Young's modulus of the display device 100 bent in the Y direction is larger than the Young's modulus of the display device 100 bent in the X direction, the flexibility of the display device 100 in the Y direction is lower than the flexibility thereof in the X direction. Note that in measurement of Young's modulus, ISO527, JISK7161, JISK7162, JISK7127, ASTMD638, ASTMD882, or the like can be referred to.

The radius of curvature can also be used as an index of the flexibility of the display device 100. For example, the display device 100 is bent in the X direction with predetermined force and the radius of curvature of the display device 100 at this time is measured. Then, the display device 100 is bent in the Y direction with the same force and the radius of curvature of the display device 100 at this time is measured. By comparing the radii of curvature, the flexibility of the display device 100 in the X direction and that in the Y direction can be evaluated. When the radius of curvature of the display device 100 bent in the Y direction is larger than the radius of curvature of the display device 100 bent in the X direction, the flexibility of the display device 100 in the Y direction is lower than the flexibility thereof in the X direction. For example, the display device 100 can be bent in the X direction with a radius of curvature less than or equal to 20 mm but cannot be easily bent in the Y direction with a radius of curvature less than or equal to 50 mm in this embodiment. That is, in this case, the minimum radius of curvature of the display device 100 in this embodiment that is bent in the Y direction is 50 mm. Further preferably, for example, the display device 100 can be bent in the X direction with a radius of curvature less than or equal to 5 mm but cannot be easily bent in the Y direction with a radius of curvature less than or equal to 100 mm in this embodiment. That is, in this case, the minimum radius of curvature of the display device 100 in this embodiment that is bent in the Y direction is 100 mm.

Figure 3A:
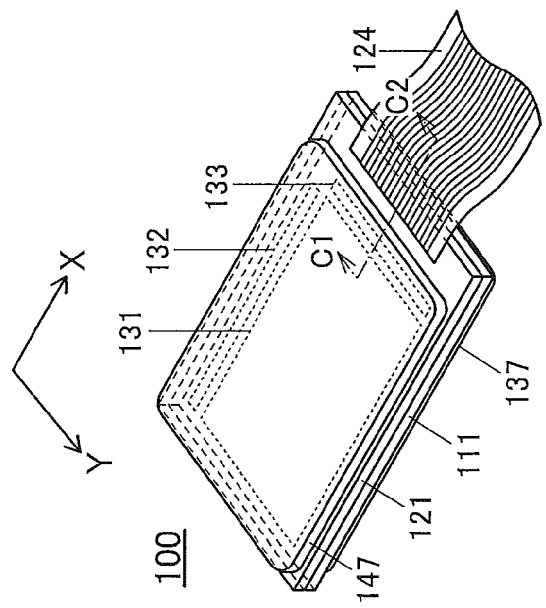
FIGS. 3A and 3B illustrate one mode of a display device.

Next, the structure of the display device 100 is described in more detail with reference to FIGS. 3A and 3B. FIG. 3A is a perspective view of the display device 100 and FIG. 3B is a cross-sectional view taken along a dashed-dotted line C1-C2 in FIG. 3A.

<Configuration Example of Display Device>

Figure 3B:
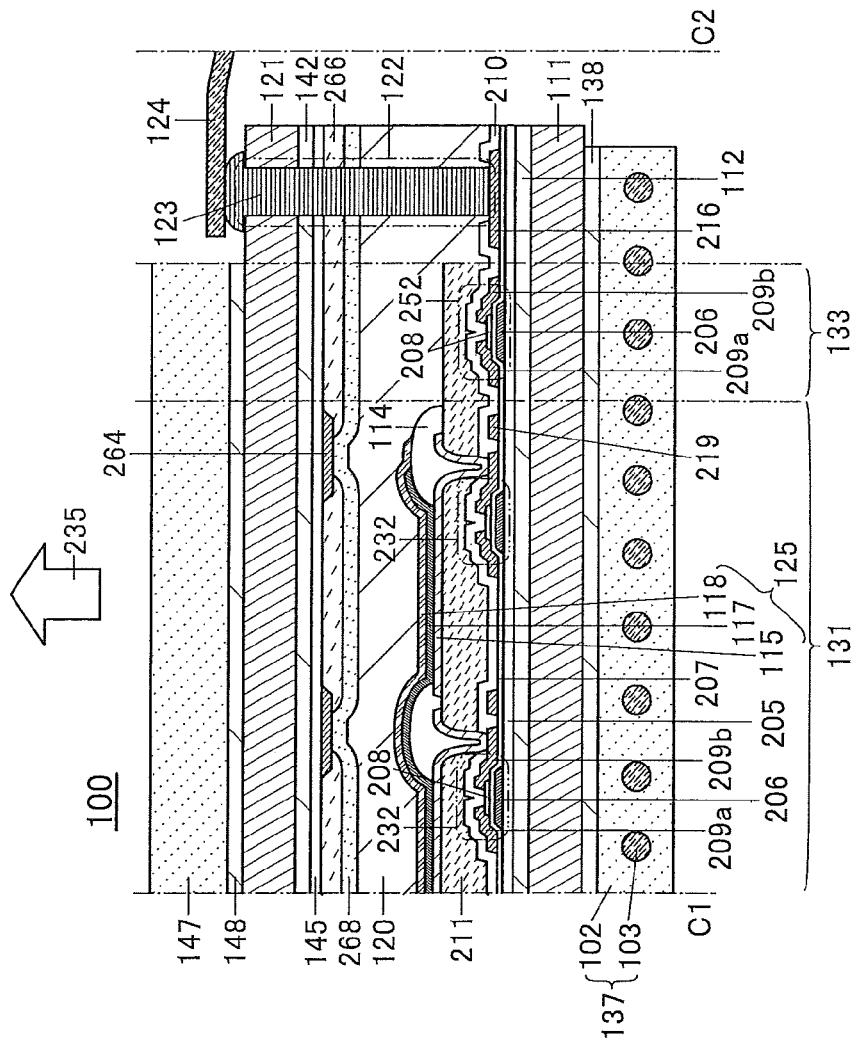

The display device 100 in this embodiment that is illustrated in FIGS. 3A and 3B includes the display region 131, the driver circuit 132, and the driver circuit 133. The display device 100 also includes a terminal electrode 216 and a light-emitting element 125 including an electrode 115, an EL layer 117, and an electrode 118. A plurality of light-emitting elements 125 are formed in the display region 131. A transistor 232 for controlling the amount of light emitted from the light-emitting element 125 is connected to each of the light-emitting elements 125.

The terminal electrode 216 is electrically connected to the external electrode 124 through an anisotropic conductive connection layer 123 formed in an opening 122. In addition, the terminal electrode 216 is electrically connected to the driver circuit 132 and the driver circuit 133. Note that the terminal electrode 216 may be electrically connected to a component in the display region 131.

The driver circuit 132 and the driver circuit 133 each include a plurality of transistors 252. The driver circuit 132 and the driver circuit 133 each have a function of determining which of the light-emitting elements 125 in the display region 131 is supplied with a signal from the external electrode 124.

The transistor 232 and the transistor 252 each include a gate electrode 206, a gate insulating layer 207, a semiconductor layer 208, a source electrode 209a, and a drain electrode 209b. Furthermore, a wiring 219 obtained by processing the film from which the source electrode 209a and the drain electrode 209b are formed is provided. In addition, an insulating layer 210 is formed over the transistor 232 and the transistor 252, and an insulating layer 211 is formed over the insulating layer 210. The electrode 115 is formed over the insulating layer 211. The electrode 115 is electrically connected to the drain electrode 209b through an opening formed in the insulating layer 210 and the insulating layer 211. A partition 114 is formed over the electrode 115, and the EL layer 117 and the electrode 118 are formed over the electrode 115 and the partition 114.

In the display device 100, the substrate 111 and the substrate 121 are attached to each other with a bonding layer 120 positioned therebetween. One surface of the substrate 111 is provided with the substrate 137 with a bonding layer 138 positioned therebetween. One surface of the substrate 121 is provided with the substrate 147 with a bonding layer 148 positioned therebetween. Note that the substrate 137 includes the insulator 102 and the plurality of glass fibers 103, and the plurality of glass fibers 103 each extend in the Y direction. At this time, the wiring 219 obtained by processing the film from which the source electrode 209a and the drain electrode 209b are formed extends in the Y direction as the glass fibers 103 do, whereby the wiring 219 is not easily broken. Furthermore, a wiring (not illustrated) that is obtained by processing the film from which the gate electrode 206 is formed may also be provided to extend in the Y direction as the glass fibers 103 do, in which case the wiring is not easily broken. Since the glass fiber 103 is not conductive, unintended capacitance is not caused between the glass fiber 103 and the gate electrode 206, for example. Thus, favorable display in the display region 131 is secured.

The other surface of the substrate 111 is provided with an insulating layer 205 with a bonding layer 112 positioned therebetween. Note that the insulating layer 205 functions as a base layer and can prevent or reduce diffusion of moisture and impurity elements from the substrate 111, the bonding layer 112, or the like to the transistor 232 or the light-emitting element 125.

The other surface of the substrate 121 is provided with an insulating layer 145 with a bonding layer 142 positioned therebetween. The other surface of the substrate 121 is provided with a light-blocking layer 264 with the insulating layer 145 positioned therebetween. The other surface of the substrate 121 is also provided with a coloring layer 266 and an overcoat layer 268 with the insulating layer 145 positioned therebetween. Note that the insulating layer 145 functions as a base layer and can prevent or reduce diffusion of moisture and impurity elements from the substrate 121, the bonding layer 142, or the like to the transistor 232 or the light-emitting element 125.

A flexible material such as an organic resin material, or the like can be used for the substrate 111 and the substrate 121. If the mechanical strength of a material used for the substrate 111 and the substrate 121 is too low, the substrates easily become deformed at the time of manufacture of the display device 100, which reduces yield and thus, contributes to a reduction in productivity. Yet, if the mechanical strength of the material used for the substrate 111 and the substrate 121 is too high, the display device becomes difficult to bend. An index of the mechanical strength of a material is Young's modulus. The Young's modulus of a material suitable for the substrate 111 and the substrate 121 is larger than or equal to 1 GPa ($1 \times 10^9$ Pa) and smaller than or equal to 100 GPa ($100 \times 10^9$ Pa), preferably larger than or equal to 2 GPa and smaller than or equal to 50 GPa, further preferably larger than or equal to 2 GPa and smaller than or equal to 20 GPa. Note that in measurement of Young's modulus, ISO527, JISK7161, JISK7162, JISK7127, ASTMD638, ASTMD882, or the like can be referred to.

The thickness of each of the substrate 111 and the substrate 121 is preferably greater than or equal to 5 μm and less than or equal to 100 μm, further preferably greater than or equal to 10 μm and less than or equal to 50 μm. One or both of the substrate 111 and the substrate 121 may be a stacked-layer substrate that includes a plurality of layers. The material and thickness of each of the substrate 111 and the substrate 121 can be appropriately selected depending on the purpose.

The thermal expansion coefficients of the substrate 111 and the substrate 121 are preferably less than or equal to 30 ppm/K, further preferably less than or equal to 10 ppm/K. In addition, on surfaces of the substrate 111 and the substrate 121, a protective film having low water permeability may be formed in advance; examples of the protective film include a film containing nitrogen and silicon such as a silicon nitride film or a silicon oxynitride film and a film containing nitrogen and aluminum such as an aluminum nitride film.

Since the display device 100 in this embodiment has what is called a top-emission structure, in which light 235 is emitted through the top surface, a material that transmits light emitted from the EL layer 117 is used for the substrate 121. In the case where the display device 100 is what is called a bottom-emission display device, a material that transmits light emitted from the EL layer 117 is used for the substrate 111. In the case where the display device 100 is a dual-emission display device, a material that transmits light emitted from the EL layer 117 is used for the substrate 111 and the substrate 121.

Examples of materials that have flexibility and transmit visible light, which can be used for the substrate 111 and the substrate 121, include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, and the like. Note that when a light-transmitting property is not necessary, a non-light-transmitting substrate may be used. For example, aluminum or the like may be used for the substrate 121 or the substrate 111.

The insulator 102 containing the plurality of glass fibers 103 can be used as the substrate 137.

Examples of a material for the insulator 102 include viscoelastic high molecular materials such as silicone rubber and fluorine rubber. For example, the substrate 137 may be two silicone rubber films that are bonded to each other with the plurality of glass fibers 103 positioned therebetween.

As the glass fiber 103, glass fiber using E glass, S glass, D glass, Q glass, or the like can be used. The thickness of the glass fiber 103 can be, for example, greater than or equal to 5 μm and less than or equal to 100 μm. Note that a cross section of the glass fiber 103 may be circular, elliptical, or rectangular.

The Young's modulus of the substrate 137 bent in the X direction is larger than or equal to 0.001 GPa and smaller than or equal to 5 GPa, and the Young's modulus of the substrate 137 bent in the Y direction is larger than that of the substrate 137 bent in the X direction. Further preferably, the Young's modulus of the substrate 137 bent in the X direction is larger than or equal to 0.01 GPa and smaller than or equal to 1 GPa, and that of the substrate 137 bent in the Y direction is larger than or equal to 50 GPa.

Each of the glass fibers 103 has a thread-like shape and its length is sufficiently larger than its thickness or width. When each of the glass fibers 103 has not a bead-like shape or a powder-like shape but a thread-like shape and its length is sufficiently larger than its thickness or width, it is possible to appropriately reduce the flexibility of the display device 100 in a desired direction.

A structure in which the plurality of glass fibers 103 are impregnated with the insulator 102 (also called prepreg) may be used as the substrate 137. The prepreg is specifically formed in a following manner: after a fibrous body is impregnated with a varnish in which a matrix resin is diluted with an organic solvent, drying is performed so that the organic solvent is volatilized and the matrix resin is semi-cured. In this case, as the insulator 102, a thermosetting resin such as an epoxy resin, an unsaturated polyester resin, a polyimide resin, a bismaleimide-triazine resin, or a cyanate resin can be used. Alternatively, a thermoplastic resin such as a polyphenylene oxide resin, a polyetherimide resin, or a fluorine resin may be used.

Note that although the glass fibers 103 are used in the display device 100 in this embodiment, one embodiment of the present invention is not limited thereto. For example, it is possible to use a high-strength fiber, which is a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, and a carbon fiber. Note that the high-strength fiber may be formed of one kind of the above high-strength fibers or plural kinds of the above high-strength fibers.

The thickness of the substrate 137 is preferably greater than or equal to 2 times and less than or equal to 100 times that of the substrate 111, further preferably greater than or equal to 5 times and less than or equal to 50 times that of the substrate 111. The thickness of the substrate 147 is preferably greater than or equal to 2 times and less than or equal to 100 times that of the substrate 121, further preferably greater than or equal to 5 times and less than or equal to 50 times that of the substrate 121. When the substrate 137 is thicker than the substrate 111 and the substrate 147 is thicker than the substrate 121, stress relaxation and the effect of buffers can be enhanced.

One or both of the substrate 137 and the substrate 147 may be a stacked-layer substrate that includes a plurality of layers. The material and thickness of each of the substrate 137 and the substrate 147 can be appropriately selected depending on the purpose.

In the display device 100 in this embodiment, the substrate 137 is provided on the side through which the light 235 is not emitted (the non-display surface side), and the substrate 147 is provided on the side through which the light 235 is emitted (the display surface side). In this manner, the glass fibers 103 contained in the substrate 137 do not interfere with the light 235, whereby favorable display in the display region 131 can be achieved.

Note that the substrate 137 containing the glass fibers 103 may be provided on the side through which the light 235 is emitted (the display surface side), and the substrate 147 may be provided on the side through which the light 235 is not emitted (the non-display surface side). Because of the excellent light-transmitting property of the glass fibers 103, when the thickness, density, or the like of the glass fibers 103 is adjusted, the substrate 137 containing the glass fibers 103 can be provided on the side through which the light 235 is emitted (the display surface side) without hindering favorable display in the display region 131.

Not only the substrate 137 but also the substrate 147 may contain the glass fibers 103. In that case, the glass fibers 103 contained in the substrate 137 and the glass fibers 103 contained in the substrate 147 preferably extend in the same direction. For example, when the plurality of glass fibers 103 contained in the substrate 137 each extend in the Y direction, the plurality of glass fibers 103 contained in the substrate 147 each preferably extend in the Y direction, too. Thus, the flexibility of the display device 100 in the Y direction can be sufficiently low.

<Modification Example>

Figure 4A:
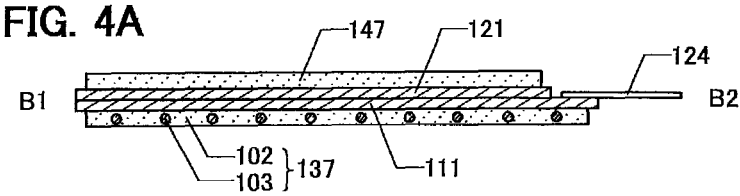
FIGS. 4A to 4F are cross-sectional views illustrating modes of a display device.
Figure 4B:
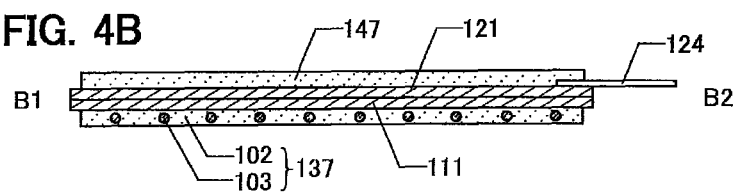
Figure 4C:
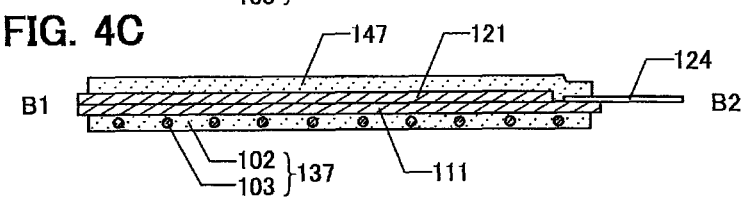
Figure 4D:
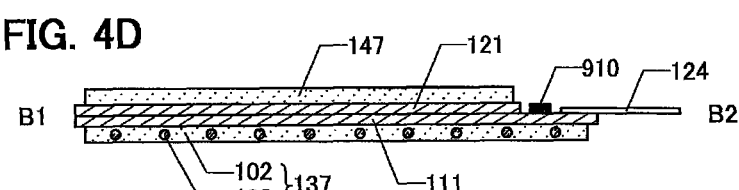
Figure 4E:
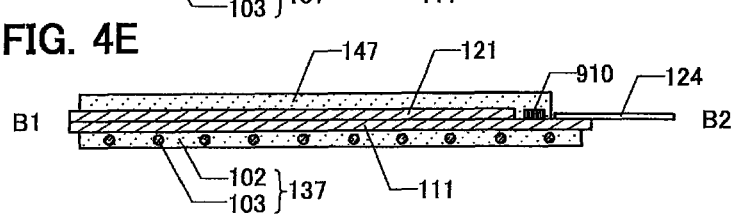
Figure 4F:
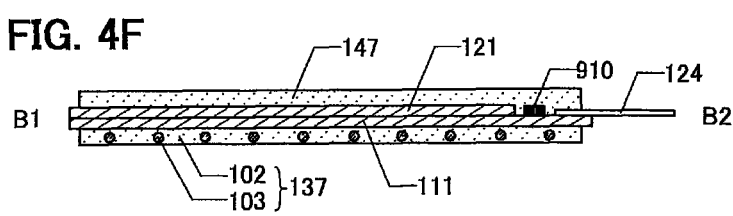
Figure 5:
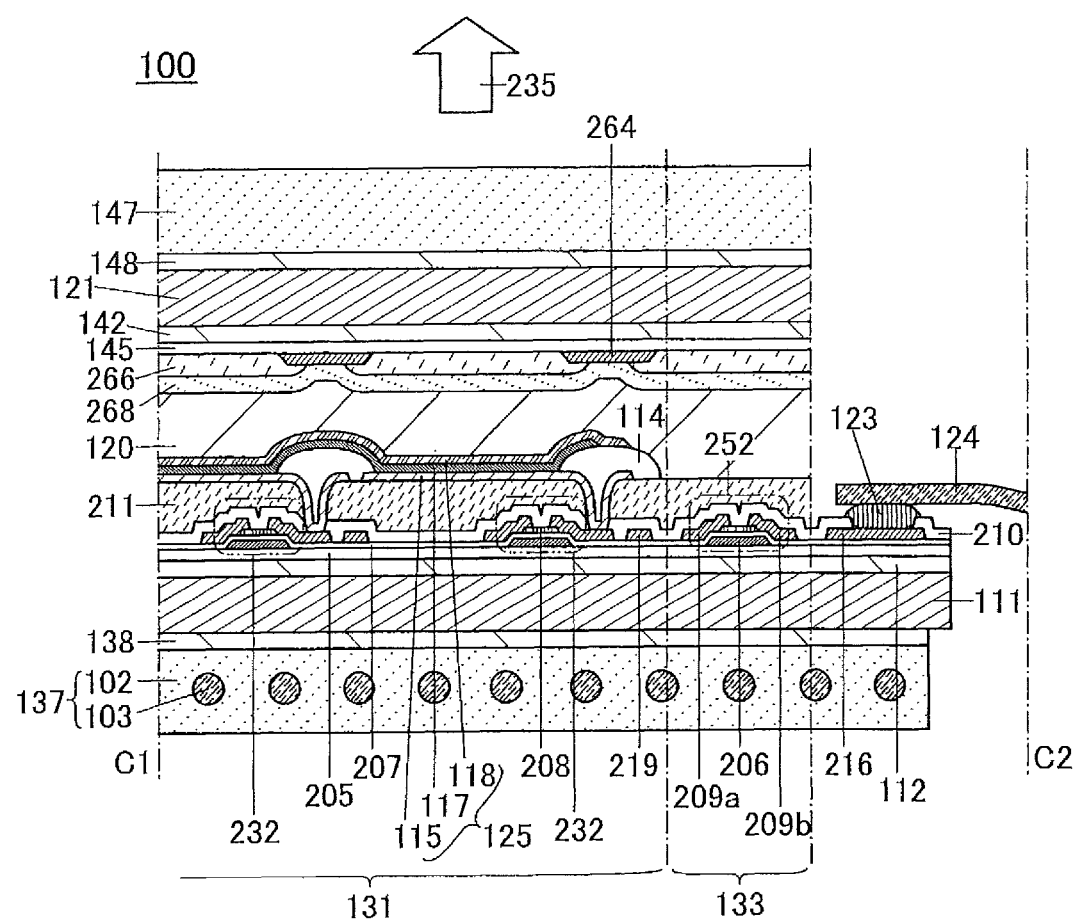
FIG. 5 is a cross-sectional view illustrating one mode of a display device.

FIGS. 4A to 4F and FIG. 5 illustrate modification examples of the display device 100. One embodiment of the present invention is not limited to the structure illustrated in FIG. 1C, which is a cross-sectional view of a portion of the display device 100 taken along the dashed-dotted line B1-B2 in FIG. 1A. FIGS. 4A to 4F illustrate modification examples of a cross-sectional structure of the display device 100 illustrated in FIG. 1C. Furthermore, one embodiment of the present invention is not limited to the structure illustrated in FIG. 3B, which is a cross-sectional view of a portion of the display device 100 taken along the dashed-dotted line C1-C2 in FIG. 3A. FIG. 5 illustrates a modification example of a cross-sectional structure of the display device 100 illustrated in FIG. 3B.

As shown in FIGS. 4A, 4C, 4D, 4E, and 4F, the external electrode 124 can be easily bonded by being connected to the substrate 111. As shown in FIG. 5, the terminal electrode 216 formed over the substrate 111 and the external electrode 124 are connected through an anisotropic conductive connection layer 123. When the external electrode 124 is covered with the substrate 147 as illustrated in FIGS. 4B, 4C, and 4F, a connection portion of the external electrode 124 and the substrate 111 can be protected. Note that FIGS. 4D to 4F each illustrate a structure in which a semiconductor chip 910 is provided over the substrate 111 by COG or the like. When the semiconductor chip 910 is covered with the substrate 147 as illustrated in FIGS. 4E and 4F, the semiconductor chip 910 and its connection portion can be protected.

<Modification Example>

Figure 6A:
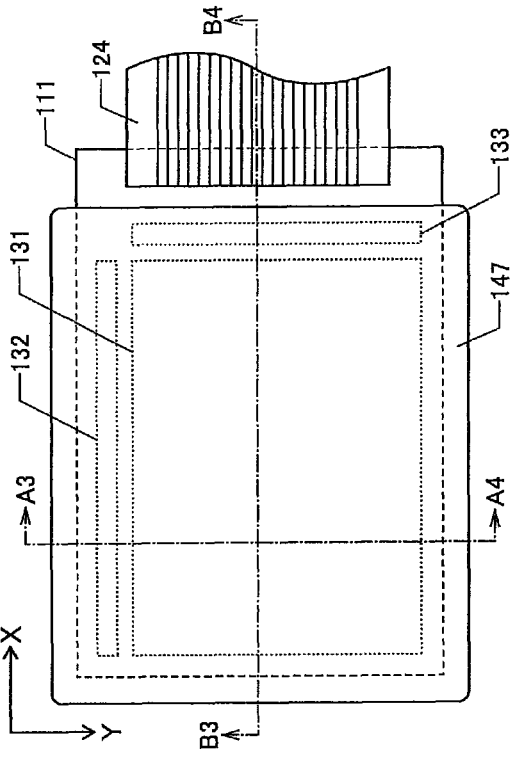
FIGS. 6A to 6C illustrate one mode of a display device.
Figure 6B:
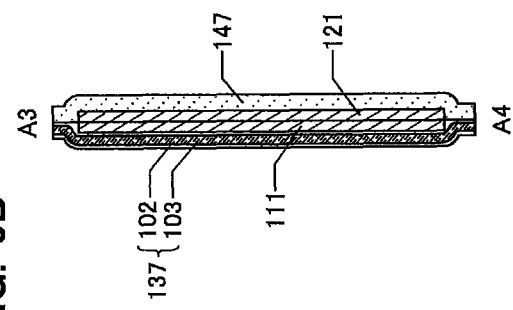
Figure 6C:
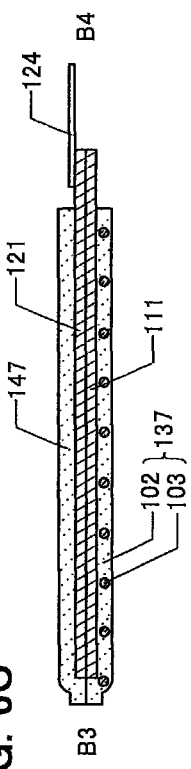

FIGS. 6A to 6C illustrate a display device 200 having a structure different from that of the display device 100. FIG. 6A is a top view of the display device 200 and FIG. 6B is a cross-sectional view taken along a dashed-dotted line A3-A4 in FIG. 6A. FIG. 6C is a cross-sectional view taken along a dashed-dotted line B3-B4 in FIG. 6A.

The display device 200 is different from the display device 100 in that at least part of the substrate 137 and part of the substrate 147 extend beyond the edges of the substrate 111 and the substrate 121 and that the extending portion of the substrate 137 and the extending portion of the substrate 147 are connected to each other. Other components can be formed in a manner similar to that of the display device 100. Note that the extending portions of the substrate 137 and the substrate 147 may be connected directly or connected indirectly with a bonding layer or the like positioned therebetween.

The structure of the display device 200 can inhibit entry of impurities from the edges of the substrate 111 and the substrate 121 and thus can further improve the reliability of the display device.

<Modification Example>

FIGS. 7A to 7H illustrate modification examples of the display device 200. One embodiment of the present invention is not limited to the structure illustrated in FIG. 6C, which is a cross-sectional view of a portion of the display device 200 taken along the dashed-dotted line B3-B4 in FIG. 6A. FIGS. 7A to 7H illustrate modification examples of a cross-sectional structure of the display device 200 illustrated in FIG. 6C.

Figure 7A:
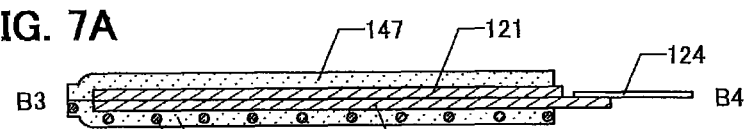
FIGS. 7A to 7H are cross-sectional views illustrating modes of a display device.
Figure 7B:
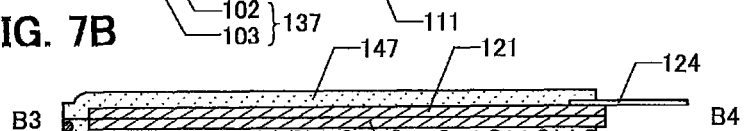
Figure 7C:
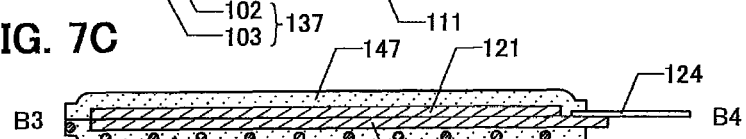
Figure 7D:
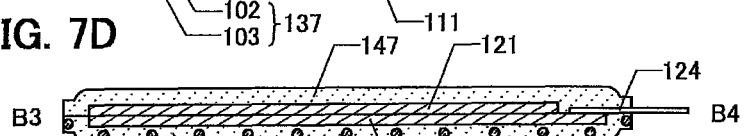
Figure 7E:
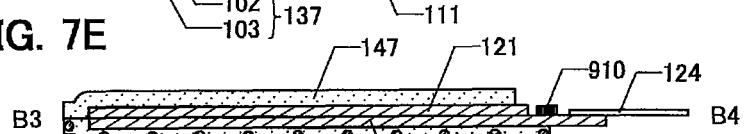
Figure 7F:
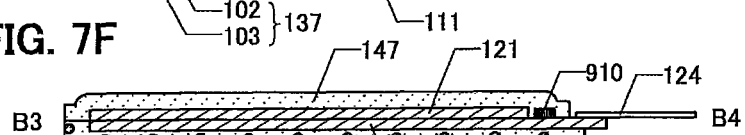
Figure 7G:
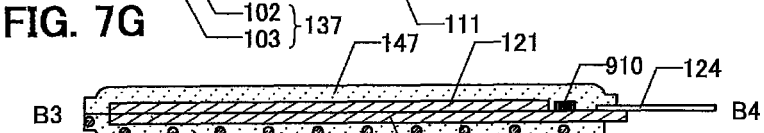
Figure 7H:
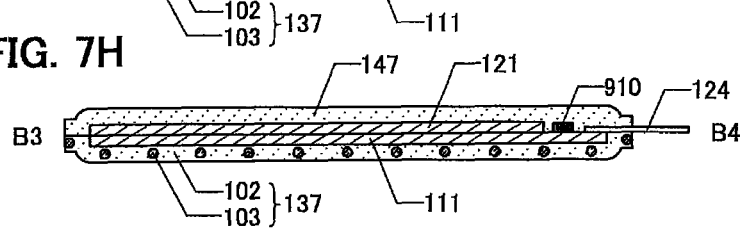

As shown in FIGS. 7A, 7C, 7D, 7E, 7F, 7G and 7H, the external electrode 124 can be easily bonded by being connected to the substrate 111. When the external electrode 124 is covered with the substrate 147 as illustrated in FIGS. 7B, 7C, 7D, 7G, and 7H, a connection portion of the external electrode 124 and the substrate to which the external electrode 124 is connected can be protected. In addition, when the external electrode 124 is covered with the substrate 147 and the substrate 137 as illustrated in FIGS. 7D and 7H, the connection portion of the external electrode 124 and the substrate to which the external electrode 124 is connected can be protected more effectively. Note that FIGS. 7E, 7F, 7G, and 7H each illustrate a structure in which the semiconductor chip 910 is provided over the substrate 111 by COG or the like. When the semiconductor chip 910 is covered with the substrate 147 as illustrated in FIGS. 7F, 7G, and 7H, the semiconductor chip 910 and its connection portion can be protected.

<Example of Pixel Circuit Configuration>

Figure 8A:
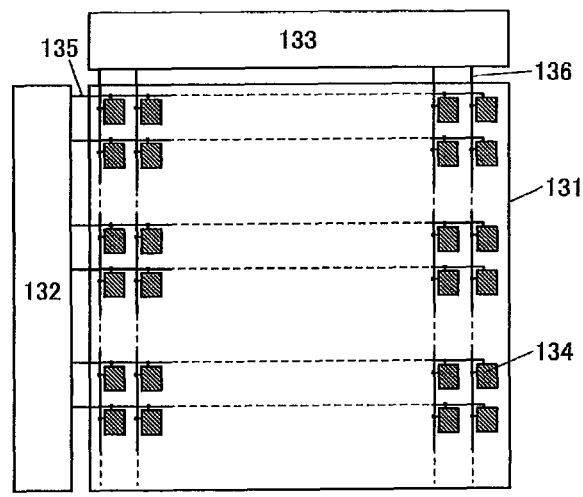
FIGS. 8A to 8C are a block diagram and circuit diagrams illustrating one mode of a display device.

Next, an example of a specific configuration of the display device 100 is described with reference to FIGS. 8A to 8C. FIG. 8A is a block diagram illustrating the configuration of the display device 100. The display device 100 includes the display region 131, the driver circuit 132, and the driver circuit 133. The driver circuit 132 functions as a scan line driver circuit, for example, and the driver circuit 133 functions as a signal line driver circuit, for example.

The display device 100 includes in scan lines 135 which are arranged parallel or substantially parallel to each other and whose potentials are controlled by the driver circuit 132, and n signal lines 136 which are arranged parallel or substantially parallel to each other and whose potentials are controlled by the driver circuit 133. When the direction in which the scan lines 135 or the signal lines 136 extend and the direction in which the glass fibers 103 extend are the same, breakage of the scan lines 135 or the signal lines 136 during handling of the display device 100 can be prevented. The display region 131 includes a plurality of pixels 134 arranged in a matrix. The driver circuit 132 and the driver circuit 133 are collectively referred to as a driver circuit portion in some cases.

Each of the scan lines 135 is electrically connected to the n pixels 134 in the corresponding row among the pixels 134 arranged in m rows and n columns in the display region 131. Each of the signal lines 136 is electrically connected to the m pixels 134 in the corresponding column among the pixels 134 arranged in m rows and n columns. Note that m and n are each an integer of 1 or more.

Figure 8B:
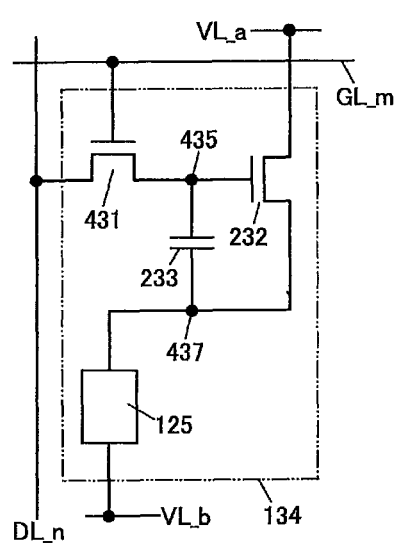
Figure 8C:
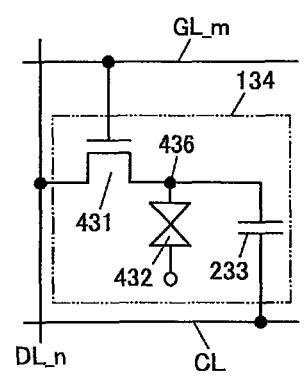

FIGS. 8B and 8C illustrate circuit configurations that can be used for the pixels 134 in the display device illustrated in FIG. 8A.

[Example of Pixel Circuit for Light-Emitting Display Device]

The pixel 134 illustrated in FIG. 8B includes a transistor 431, a capacitor 233, the transistor 232, and the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling whether to write a data signal to a node 435 by being turned on or off.

One of a pair of electrodes of the capacitor 233 is electrically connected to the node 435, and the other is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other is electrically connected to the node 437. A gate electrode of the transistor 232 is electrically connected to the node 435.

One of an anode and a cathode of the light-emitting element 125 is electrically connected to a potential supply line VL_b, and the other is electrically connected to the node 437.

As the light-emitting element 125, an organic electroluminescent element (also referred to as an organic EL element) or the like can be used, for example. Note that the light-emitting element 125 is not limited to organic EL elements; an inorganic EL element including an inorganic material can be used.

Note that a high power supply potential VDD is supplied to one of the potential supply line VL_a and the potential supply line VL_b, and a low power supply potential VSS is supplied to the other.

In the display device including the pixel 134 in FIG. 8B, the pixels 134 are sequentially selected row by row by the driver circuit 132, whereby the transistors 431 are turned on and a data signal is written to the nodes 435.

When the transistors 431 are turned off, the pixels 134 in which the data signal has been written to the nodes 435 are brought into a holding state. Further, the amount of current flowing between the source electrode and the drain electrode of the transistor 232 is controlled in accordance with the potential of the data written to the node 435. The light-emitting element 125 emits light with a luminance corresponding to the amount of flowing current. This operation is sequentially performed row by row; thus, an image is displayed.

[Example of Pixel Circuit for Liquid Crystal Display Device]

The pixel 134 illustrated in FIG. 8C includes a liquid crystal element 432, the transistor 431, and the capacitor 233.

The potential of one of a pair of electrodes of the liquid crystal element 432 is set according to the specifications of the pixels 134 as appropriate. The alignment state of the liquid crystal element 432 depends on data written to a node 436. A common potential may be applied to one of the pair of electrodes of the liquid crystal element 432 included in each of the plurality of pixels 134. Further, the potential supplied to one of a pair of electrodes of the liquid crystal element 432 in the pixel 134 in one row may be different from the potential supplied to one of a pair of electrodes of the liquid crystal element 432 in the pixel 134 in another row.

As examples of a driving method of the display device including the liquid crystal element 432, the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

The liquid crystal element 432 may be formed using a liquid crystal composition including liquid crystal exhibiting a blue phase and a chiral material. The liquid crystal exhibiting a blue phase has a short response time of 1 ms or less, and is optically isotropic, which makes the alignment process unneeded and the viewing angle dependence small.

Note that a display element other than the light-emitting element 125 and the liquid crystal element 432 can be used. For example, an electrophoretic element, an electronic ink, an electrowetting element, a micro electro mechanical system (MEMS), a digital micromirror device (DMD), a digital micro shutter (DMS), MIRASOL (registered trademark), an interferometric modulator (IMOD) element, a MEMS shutter display element; and an optical interference type MEMS display element, or the like can be used as the display element.

In the pixel 134 in the m-th row and the n-th column, one of a source electrode and a drain electrode of the transistor 431 is electrically connected to a signal line DL_n, and the other is electrically connected to the node 436. A gate electrode of the transistor 431 is electrically connected to a scan line GL_m. The transistor 431 has a function of controlling whether to write a data signal to the node 436 by being turned on or off.

One of a pair of electrodes of the capacitor 233 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel 134 as appropriate. The capacitor 233 functions as a storage capacitor for storing data written to the node 436.

For example, in the display device including the pixel 134 in FIG. 8C, the pixels 134 are sequentially selected row by row by the driver circuit 132, whereby the transistors 431 are turned on and a data signal is written to the nodes 436.

When the transistors 431 are turned off, the pixels 134 in which the data signal has been written to the nodes 436 are brought into a holding state. This operation is sequentially performed row by row; thus, an image is displayed.

For example, in this specification and the like, an active matrix method in which an active element is included in a pixel or a passive matrix method in which an active element is not included in a pixel can be used.

In the active matrix method, as an active element (a non-linear element), not only a transistor but also various active elements (non-linear elements), for example, a metal insulator metal (MIM), a thin film diode (TFD), or the like can be used. Since such an element has a small number of manufacturing steps, manufacturing cost can be reduced or yield can be improved by the use of such an element. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or the yield can be improved. Alternatively, since an active element (a non-linear element) is not used, the aperture ratio can be improved, so that power consumption can be reduced or higher luminance can be achieved, for example.

Note that an example of the case where a variety of display is performed using the display device is shown here; however, one embodiment of the present invention is not limited thereto. For example, data is not necessarily displayed. As an example, the display device may be used as a lighting device. By using the device as a lighting device, it can be used as interior lighting having an attractive design. Alternatively, in one embodiment of the present invention, it can be used as lighting from which light radiates in various directions. Further alternatively, it may be used as a light source, e.g., a backlight or a front light, not the display device. In other words, it may be used as a lighting device for the display panel.

This embodiment can be implemented in an appropriate combination with any of the structures described in other embodiments.

Embodiment 2

In this embodiment, another example of a method for manufacturing the display device 100 will be described with reference to FIGS. 9A to 9D, FIGS. 10A to 10D, FIGS. 11A and 11B, FIGS. 12A and 12B, FIGS. 13A and 13B, FIGS. 14A and 14B, FIG. 15, and FIGS. 16A to 16D. Note that FIGS. 9A to 9D, FIGS. 10A to 10D, FIGS. 11A and 11B, FIGS. 12A and 12B, FIGS. 13A and 13B, FIGS. 14A and 14B, and FIG. 15 are each a cross-sectional view taken along the dashed-dotted line C1-C2 in FIG. 3A.

<Example of Method for Manufacturing Display Device>
[Formation of Separation Layer]

Figure 9A:
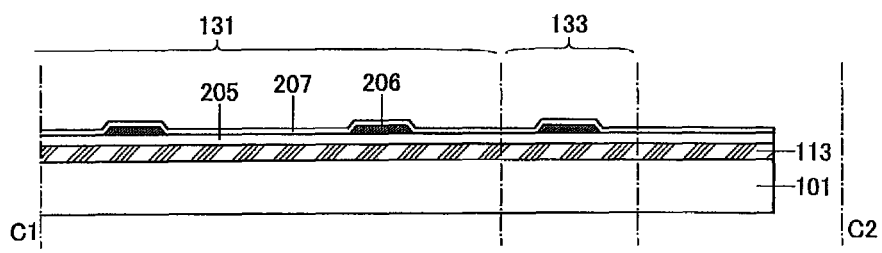
FIGS. 9A to 9D are cross-sectional views illustrating an example of a method for manufacturing a display device.
Figure 9B:
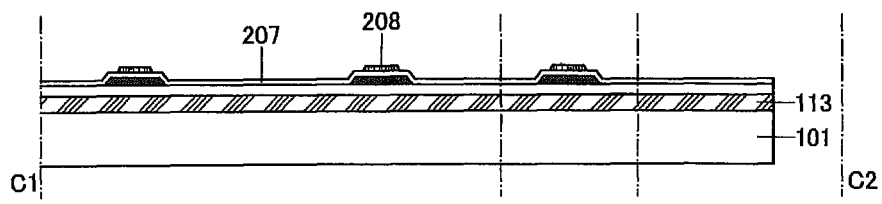

First, a Separation Layer 113 is Formed Over an Element Formation Substrate 101 (see FIG. 9A). Note that the element formation substrate 101 may be a glass substrate, a quartz substrate, a sapphire substrate, a ceramic substrate, a metal substrate, or the like. Alternatively, the element formation substrate 101 may be a plastic substrate having heat resistance to the processing temperature in this embodiment.

As the glass substrate, for example, a glass material such as aluminosilicate glass, aluminoborosilicate glass, or barium borosilicate glass is used. Note that when the glass substrate contains a large amount of barium oxide (BaO), the glass substrate can be heat-resistant and more practical. Alternatively, crystallized glass or the like may be used.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or InGaZnO (IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a tungsten-molybdenum alloy. Alternatively, the separation layer 113 is preferably formed using an oxide or oxynitride of tungsten, an oxide or oxynitride of molybdenum, or an oxide or oxynitride of a tungsten-molybdenum alloy.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an oxide insulating layer is formed in contact therewith, so that the layer containing an oxide of tungsten is formed at the interface between the layer containing tungsten and the oxide insulating layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten.

In this embodiment, a glass substrate is used as the element formation substrate 101. The separation layer 113 is formed of tungsten over the element formation substrate 101 by a sputtering method.

[Formation of Insulating Layer]

Next, the insulating layer 205 is formed as a base layer over the separation layer 113 (see FIG. 9A). The insulating layer 205 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 205 may have, for example, a two-layer structure of silicon oxide and silicon nitride or a five-layer structure in which materials selected from the above are combined. The insulating layer 205 can be formed by a sputtering method, a CVD method, a thermal oxidation method, a coating method, a printing method, or the like.

The thickness of the insulating layer 205 may be greater than or equal to 30 nm and less than or equal to 1 μm, preferably greater than or equal to 50 nm and less than or equal to 800 nm.

The insulating layer 205 can prevent or reduce diffusion of impurity elements from the element formation substrate 101, the separation layer 113, or the like. Even after the element formation substrate 101 is replaced by the substrate 111, the insulating layer 205 can prevent or reduce diffusion of impurity elements into the light-emitting element 125 from the substrate 111, the bonding layer 112, or the like. In this embodiment, the insulating layer 205 is formed by stacking a 200-nm-thick silicon oxynitride film and a 50-nm-thick silicon nitride oxide film by a plasma CVD method.

[Formation of Gate Electrode]

Next, the gate electrode 206 is formed over the insulating layer 205 (see FIG. 9A). The gate electrode 206 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 206 may have a single-layer structure or a stacked structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, an alloy film or a nitride film which contains one or more elements selected from aluminum, titanium, tantalum, tungsten, molybdenum, chromium, neodymium, and scandium may be used.

The gate electrode 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

First, a conductive film to be the gate electrode 206 is stacked over the insulating layer 205 by a sputtering method, a CVD method, an evaporation method, or the like, and a resist mask is formed over the conductive film by a photolithography process. Next, part of the conductive film to be the gate electrode 206 is etched with the use of the resist mask to form the gate electrode 206. At the same time, a wiring and another electrode can be formed.

The conductive film may be etched by a dry etching method, a wet etching method, or both a dry etching method and a wet etching method. Note that in the case where the conductive film is etched by a dry etching method, aching treatment may be performed before the resist mask is removed, whereby the resist mask can be easily removed using a stripper.

Note that the gate electrode 206 may be formed by an electrolytic plating method, a printing method, an inkjet method, or the like instead of the above formation method.

The thickness of the gate electrode 206 is greater than or equal to 5 nm and less than or equal to 500 nm, preferably greater than or equal to 10 nm and less than or equal to 300 nm, further preferably greater than or equal to 10 nm and less than or equal to 200 nm.

The gate electrode 206 may be formed using a light-blocking conductive material, whereby external light can be prevented from reaching the semiconductor layer 208 from the gate electrode 206 side. As a result, a variation in electrical characteristics of the transistor due to light irradiation can be suppressed.

[Formation of Gate Insulating Layer]

Next, the gate insulating layer 207 is formed (see FIG. 9A). The gate insulating layer 207 can be formed to have a single-layer structure or a stacked-layer structure using, for example, any of silicon oxide, silicon oxynitride, silicon nitride oxide, silicon nitride, aluminum oxide, a mixture of aluminum oxide and silicon oxide, hafnium oxide, gallium oxide, Ga—Zn-based metal oxide, and the like.

The gate insulating layer 207 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced. For example, a stacked layer of silicon oxynitride and hafnium oxide may be used.

The thickness of the gate insulating layer 207 is preferably greater than or equal to 5 nm and less than or equal to 400 nm, further preferably greater than or equal to 10 nm and less than or equal to 300 nm, still further preferably greater than or equal to 50 nm and less than or equal to 250 nm.

The gate insulating layer 207 can be found by a sputtering method, a CVD method, an evaporation method, or the like.

In the case where a silicon oxide film, a silicon oxynitride film, or a silicon nitride oxide film is formed as the gate insulating layer 207, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, nitrogen dioxide, and the like can be given.

The gate insulating layer 207 can have a stacked-layer structure in which a nitride insulating layer and an oxide insulating layer are stacked in this order from the gate electrode 206 side. When the nitride insulating layer is provided on the gate electrode 206 side, hydrogen, nitrogen, an alkali metal, an alkaline earth metal, or the like can be prevented from moving from the gate electrode 206 side to the semiconductor layer 208. Note that nitrogen, an alkali metal, an alkaline earth metal, or the like generally serves as an impurity element of a semiconductor. In addition, hydrogen serves as an impurity element of an oxide semiconductor. Thus, an "impurity" in this specification and the like includes hydrogen, nitrogen, an alkali metal, an alkaline earth metal, or the like.

In the case where an oxide semiconductor is used for the semiconductor layer 208, the density of defect states at the interface between the gate insulating layer 207 and the semiconductor layer 208 can be reduced by providing the oxide insulating layer on the semiconductor layer 208 side. Consequently, a transistor whose electrical characteristics are hardly degraded can be obtained. Note that in the case where an oxide semiconductor is used for the semiconductor layer 208, an oxide insulating layer containing oxygen in a proportion higher than that in the stoichiometric composition is preferably formed as the oxide insulating layer. This is because the density of defect states at the interface between the gate insulating layer 207 and the semiconductor layer 208 can be further reduced.

In the case where the gate insulating layer 207 is a stacked layer of a nitride insulating layer and an oxide insulating layer as described above, it is preferable that the nitride insulating layer be thicker than the oxide insulating layer.

The nitride insulating layer has a dielectric constant higher than that of the oxide insulating layer; therefore, an electric field generated from the gate electrode 206 can be efficiently transmitted to the semiconductor layer 208 even when the gate insulating layer 207 has a large thickness. When the gate insulating layer 207 has a large thickness, the withstand voltage of the gate insulating layer 207 can be increased. Accordingly, the reliability of the display device can be improved.

The gate insulating layer 207 can have a stacked-layer structure in which a first nitride insulating layer with few defects, a second nitride insulating layer with a high blocking property against hydrogen, and an oxide insulating layer are stacked in that order from the gate electrode 206 side. When the first nitride insulating layer with few defects is used in the gate insulating layer 207, the withstand voltage of the gate insulating layer 207 can be improved. Particularly when an oxide semiconductor is used for the semiconductor layer 208, the use of the second nitride insulating layer with a high blocking property against hydrogen in the gate insulating layer 207 makes it possible to prevent hydrogen contained in the gate electrode 206 and the first nitride insulating layer from moving to the semiconductor layer 208.

An example of a method for forming the first and second nitride insulating layers is described below. First, a silicon nitride film with few defects is formed as the first nitride insulating layer by a plasma CVD method in which a mixed gas of silane, nitrogen, and ammonia is used as a source gas. Next, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against hydrogen are stacked can be formed.

The gate insulating layer 207 can have a stacked-layer structure in which a third nitride insulating layer with a high blocking property against an impurity, the first nitride insulating layer with few defects, the second nitride insulating layer with a high blocking property against hydrogen, and the oxide insulating layer are stacked in that order from the gate electrode 206 side. When the third nitride insulating layer with a high blocking property against an impurity is provided in the gate insulating layer 207, hydrogen, nitrogen, alkali metal, alkaline earth metal, or the like, can be prevented from moving from the gate electrode 206 to the semiconductor layer 208.

An example of a method for forming the first to third nitride insulating layers is described below. First, a silicon nitride film with a high blocking property against an impurity is formed as the third nitride insulating layer by a plasma CVD method in which a mixed gas of silane, nitrogen, and ammonia is used as a source gas. Next, a silicon nitride film with few defects is formed as the first nitride insulating layer by increasing the flow rate of ammonia. Then, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against an impurity are stacked can be formed.

Moreover, in the case of forming a gallium oxide film as the gate insulating layer 207, a metal organic chemical vapor deposition (MOCVD) method can be employed.

Note that the threshold voltage of a transistor can be changed by stacking the semiconductor layer 208 in which a channel of the transistor is formed and an insulating layer containing hafnium oxide with an oxide insulating layer positioned therebetween and injecting electrons into the insulating layer containing hafnium oxide.

[Formation of Semiconductor Layer]

The semiconductor layer 208 can be formed using an amorphous semiconductor, a microcrystalline semiconductor, a polycrystalline semiconductor, or the like. For example, amorphous silicon, polycrystalline silicon, or microcrystalline germanium can be used. Alternatively, a compound semiconductor such as silicon carbide, gallium arsenide, an oxide semiconductor, or a nitride semiconductor, an organic semiconductor, or the like can be used. As an oxide semiconductor, a non-single-crystal oxide semiconductor, a single crystal oxide semiconductor, or the like can be used. As a non-single crystal oxide semiconductor, a c-axis aligned crystalline oxide semiconductor (CAAC-OS), a polycrystalline oxide semiconductor, a microcrystalline oxide semiconductor, an amorphous oxide semiconductor, or the like can be used. A CAAC-OS is an oxide semiconductor having a plurality of c-axis aligned crystal parts. Typical examples of an oxide semiconductor include an In—Ga oxide, an In—Zn oxide, and an In-M-Zn oxide (M represents Ti, Ga, Y, Zr, La, Ce, Nd, Sn, or Hf). It is particularly preferable to use an In-M-Zn oxide (M is Ti, Ga, Y, Zr, La, Ce, Nd, Sn, or Hf) as an oxide semiconductor. Note that the oxide semiconductor is not limited to the oxide containing indium. The oxide semiconductor may be, for example, Zn—Sn oxide or Ga—Sn oxide.

The thickness of the semiconductor layer 208 is greater than or equal to 3 nm and less than or equal to 200 nm, preferably greater than or equal to 3 nm and less than or equal to 100 nm, further preferably greater than or equal to 3 nm and less than or equal to 50 nm. In this embodiment, as the semiconductor layer 208, an oxide semiconductor film with a thickness of 30 nm is formed by a sputtering method.

Next, a resist mask is formed over the oxide semiconductor film, and part of the oxide semiconductor film is selectively etched using the resist mask to form the semiconductor layer 208. The resist mask can be formed by a photolithography method, a printing method, an inkjet method, or the like as appropriate. Formation of the resist mask by an inkjet method needs no photomask; thus, fabrication cost can be reduced.

Note that the etching of the oxide semiconductor film may be performed by either one or both of a dry etching method and a wet etching method. After the etching of the oxide semiconductor film, the resist mask is removed (see FIG. 9B).

[Formation of Electrode]

Figure 9C:
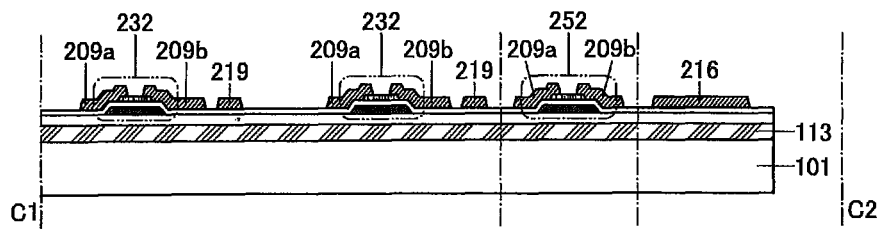

Next, the source electrode 209*a*, the drain electrode 209*b*, the wiring 219, and the terminal electrode 216 are formed (see FIG. 9C). First, a conductive film is formed over the gate insulating layer 207 and the semiconductor layer 208.

The conductive film can have a single-layer structure or a stacked-layer structure containing any of metals such as aluminum, titanium, chromium, nickel, copper, yttrium, zirconium, molybdenum, silver, tantalum, and tungsten or an alloy containing any of these metals as its main component. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a tungsten film, a copper film, and a tungsten film are stacked in this order.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and a conductive material containing nitrogen. It is also possible to use a stacked-layer structure formed using a material containing the above metal element, a conductive material containing oxygen, and a conductive material containing nitrogen.

The thickness of the conductive film is greater than or equal to 5 nm and less than or equal to 500 nm, preferably greater than or equal to 10 nm and less than or equal to 300 nm, further preferably greater than or equal to 10 nm and less than or equal to 200 nm. In this embodiment, a 300-nm-thick tungsten film is formed as the conductive film.

Then, part of the conductive film is selectively etched using a resist mask to form the source electrode 209*a*, the drain electrode 209*b*, the wiring 219, and the terminal electrode 216 (including other electrodes and wirings formed using the same layer). The resist mask can be formed by a photolithography method, a printing method, an inkjet method, or the like as appropriate. Formation of the resist mask by an inkjet method needs no photomask; thus, fabrication cost can be reduced.

The conductive film may be etched by a dry etching method, a wet etching method, or both a dry etching method and a wet etching method. Note that an exposed portion of the semiconductor layer 208 is removed by the etching step in some cases. After the etching of the conductive film, the resist mask is removed. The transistor 232 is formed in the display region 131 and the transistor 252 is formed in the driver circuit 133 (see FIG. 9C).

[Formation of Insulating Layer]

Figure 9D:
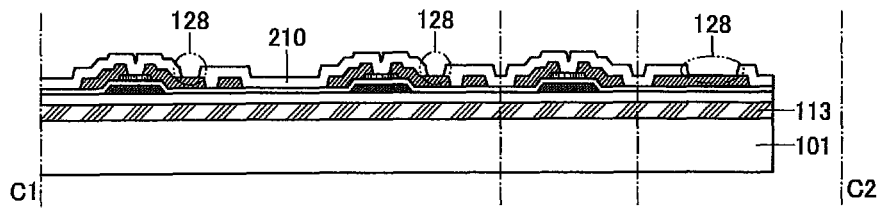

Next, the insulating layer 210 is formed over the source electrode 209*a*, the drain electrode 209*b*, the wiring 219, and the terminal electrode 216 (see FIG. 9D). The insulating layer 210 can be formed using a material and a method similar to those of the insulating layer 205.

In the case where an oxide semiconductor is used for the semiconductor layer 208, an insulating layer containing oxygen is preferably used for at least part of the insulating layer 210 that is in contact with the semiconductor layer 208. For example, in the case where the insulating layer 210 is a stack including a plurality of layers, at least a layer that is in contact with the semiconductor layer 208 is preferably formed using silicon oxide.

[Formation of Opening]

Next, part of the insulating layer 210 is selectively etched using a resist mask to form an opening 128 (see FIG. 9D). At the same time, another opening that is not illustrated is also formed. The resist mask can be formed by a photolithography method, a printing method, an inkjet method, or the like as appropriate. Formation of the resist mask by an inkjet method needs no photomask; thus, fabrication cost can be reduced.

The insulating layer 210 may be etched by a dry etching method, a wet etching method, or both a dry etching method and a wet etching method.

The drain electrode 209*b* and the terminal electrode 216 are partly exposed by the formation of the opening 128. The resist mask is removed after the formation of the opening 128.

[Formation of Planarization Film]

Figure 10A:
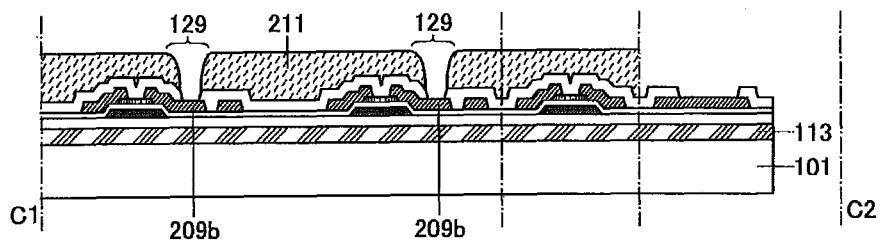
FIGS. 10A to 10D are cross-sectional views illustrating an example of a method for manufacturing a display device.

Next, the insulating layer 211 is formed over the insulating layer 210 (see FIG. 10A). The insulating layer 211 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can make polishing treatment unnecessary. As the insulating material with a planarization function, for example, an organic material such as a polyimide resin or an acrylic resin can be used. Besides such organic materials, a low-dielectric constant material (a low-k material) or the like can be used. Note that the insulating layer 211 may be formed by stacking a plurality of insulating layers formed of any of these materials.

Part of the insulating layer 211 that overlaps with the opening 128 is removed to form an opening 129. At the same time, another opening that is not illustrated is also formed. In addition, the insulating layer 211 in a region to which the external electrode 124 is connected later is removed. Note that the opening 129 or the like can be formed in such a manner that a resist mask is formed by a photolithography process over the insulating layer 211 and a region of the insulating layer 211 that is not covered with the resist mask is etched. A surface of the drain electrode 209b is exposed by the formation of the opening 129.

Formation of the resist mask by an inkjet method needs no photomask; thus, fabrication cost can be reduced. When the insulating layer 211 is formed using a photosensitive material, the opening 129 can be formed without the resist mask. In this embodiment, a photosensitive polyimide resin is used to form the insulating layer 211 and the opening 129.

[Formation of Anode]

Figure 10B:
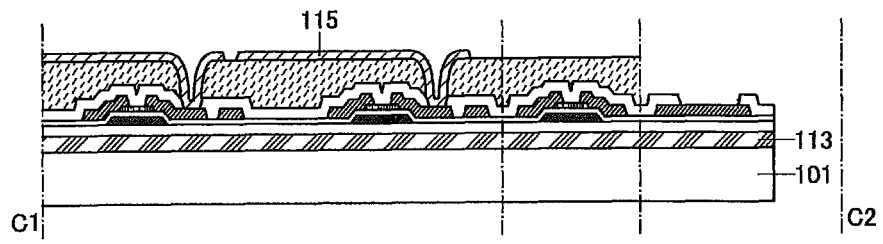

Next, the electrode 115 is formed over the insulating layer 211 (see FIG. 10B). The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, having a work function higher than that of the EL layer 117, and a layer having high reflectance (e.g., aluminum, an alloy containing aluminum, or silver) may be provided in contact with the layer.

Note that although the display device having a top-emission structure is described as an example in this embodiment, a display device having a bottom-emission structure or a dual-emission structure may be used.

In the case where the display device 100 has a bottom-emission structure or a dual-emission structure, the electrode 115 is preferably formed using a light-transmitting conductive material.

The electrode 115 can be formed in such a manner that a conductive film to be the electrode 115 is formed over the insulating layer 211, a resist mask is formed over the conductive film, and a region of the conductive film that is not covered with the resist mask is etched. The conductive film can be etched by a dry etching method, a wet etching method, or both a dry etching method and a wet etching method. The resist mask can be formed by a photolithography method, a printing method, an inkjet method, or the like as appropriate. Formation of the resist mask by an inkjet method needs no photomask; thus, fabrication cost can be reduced. The resist mask is removed after the formation of the electrode 115.

[Formation of Partition]

Figure 10C:
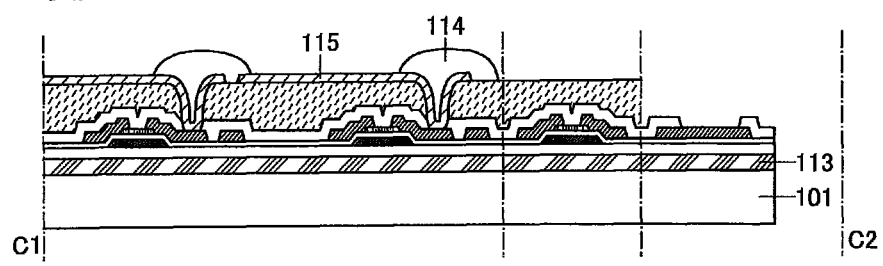
Figure 10D:
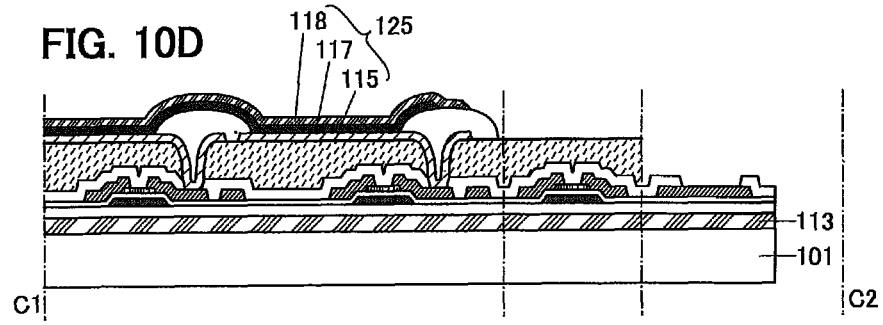

Next, the partition 114 is formed (see FIG. 10C). The partition 114 is provided in order to prevent an unintended electrical short-circuit between the light-emitting elements 125 in adjacent pixels and unintended light emission from the light-emitting elements 125. In the case of using a metal mask for formation of the EL layer 117 described later, the partition 114 has a function of preventing the contact of the metal mask with the electrode 115. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[Formation of EL Layer]

The EL layer 117 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

[Formation of Cathode]

The electrode 118 is used as a cathode in this embodiment, and thus is preferably formed using a material that has a low work function and can inject electrons into the EL layer 117. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver alloy, or the like can also be used.

In the case where light emitted from the EL layer 117 is extracted through the electrode 118, the electrode 118 preferably has a property of transmitting visible light. The light-emitting element 125 includes the electrode 115, the EL layer 117, and the electrode 118 (see FIG. 10D).

[Formation of Counter Element Formation Substrate]

Figure 11A:
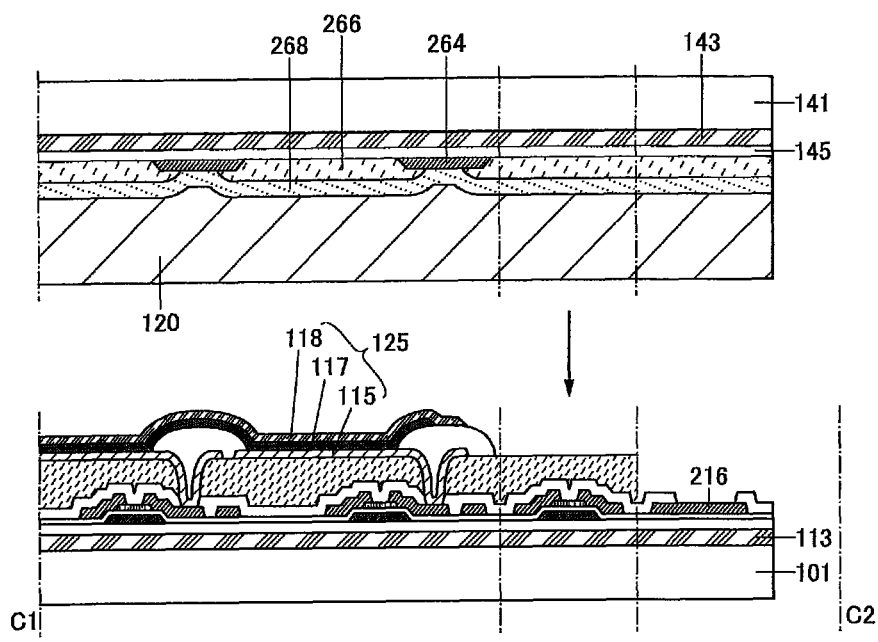
FIGS. 11A and 11B are cross-sectional views illustrating an example of a method for manufacturing a display device.

An element formation substrate 141 provided with the light-blocking layer 264, the coloring layer 266, the overcoat layer 268, the insulating layer 145, and a separation layer 143 is formed over the element formation substrate 101 with the bonding layer 120 therebetween (see FIG. 11A). Note that the element formation substrate 141 is formed to face the element formation substrate 101 and may thus be called a "counter element formation substrate". Details about a structure of the element formation substrate 141 (counter element formation substrate) is described later.

The element formation substrate 141 is fixed over the element formation substrate 101 by the bonding layer 120. A light curable adhesive, a reactive curable adhesive, a thermosetting adhesive, or an anaerobic adhesive can be used as the bonding layer 120. For example, an epoxy resin, an acrylic resin, or an imide resin can be used. In a top-emission structure, a drying agent (e.g., zeolite) having a size less than or equal to the wavelength of light or a filler (e.g., titanium oxide or zirconium) with a high refractive index is preferably mixed into the bonding layer 120, in which case the efficiency of extracting light emitted from the EL layer 117 can be improved.

[Separation of Element Formation Substrate]

Figure 11B:
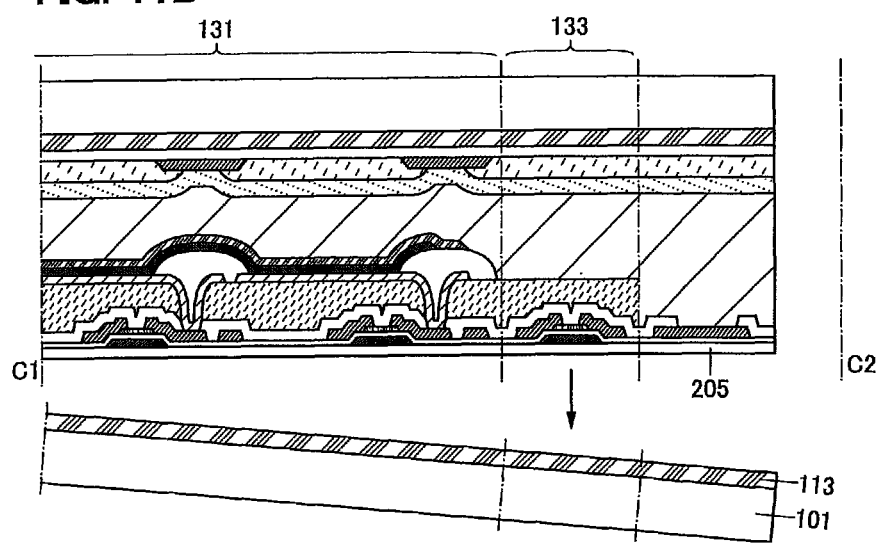

Next, the element formation substrate 101 attached to the insulating layer 205 with the separation layer 113 positioned therebetween is separated from the insulating layer 205 (see FIG. 11B). As a separation method, mechanical force (a separation process with a human hand or a gripper, a separation process by rotation of a roller, ultrasonic waves, or the like) may be used. For example, a cut is made in the separation layer 113 with a sharp edged tool, by laser light irradiation, or the like and water is injected into the cut. Alternatively, the cut is sprayed with a mist of water. A portion between the separation layer 113 and the insulating layer 205 absorbs water through capillarity action, so that the element formation substrate 101 can be separated easily from the insulating layer 205.

[Bonding of Substrate]

Figure 12A:
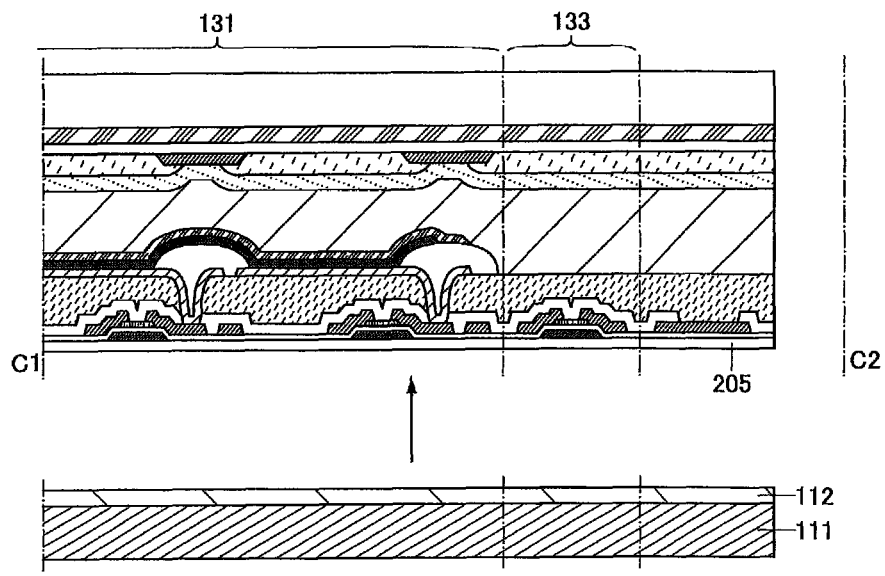
FIGS. 12A and 12B are cross-sectional views illustrating an example of a method for manufacturing a display device.
Figure 12B:
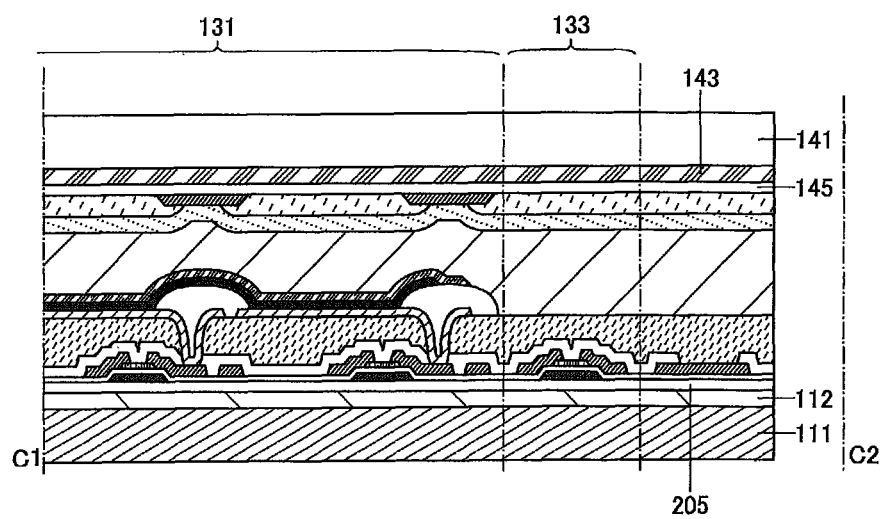

Next, the substrate 111 is attached to the insulating layer 205 with the bonding layer 112 positioned therebetween (see FIGS. 12A and 12B). The bonding layer 112 can be formed using a material similar to that of the bonding layer 120. In this embodiment, a 20-μm-thick aramid (polyamide resin) with a Young's modulus of 10 GPa is used for the substrate 111.

[Separation of Counter Element Formation Substrate]

Figure 13A:
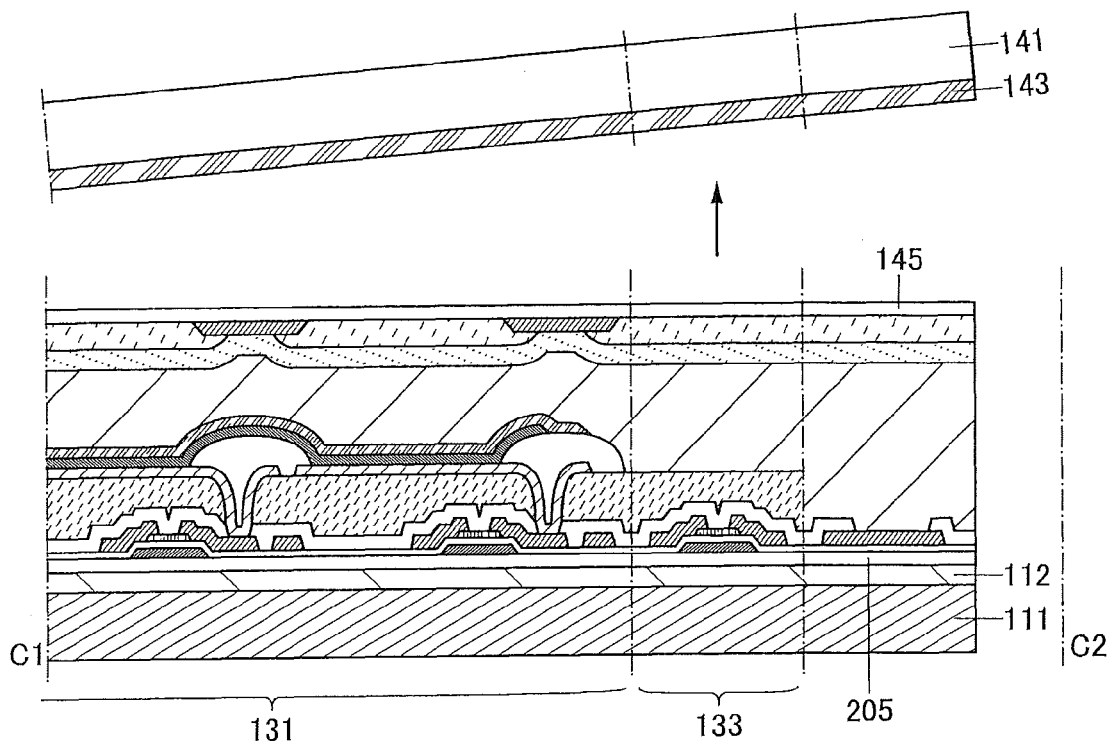
FIGS. 13A and 13B are cross-sectional views illustrating an example of a method for manufacturing a display device.

Next, the element formation substrate 141 overlapping with the insulating layer 145 with the separation layer 143 positioned therebetween is separated from the insulating layer 145 (see FIG. 13A). The element formation substrate 141 can be separated in a manner similar to that of the above-described separation method of the element formation substrate 101.

[Bonding of Substrate]

Figure 13B:
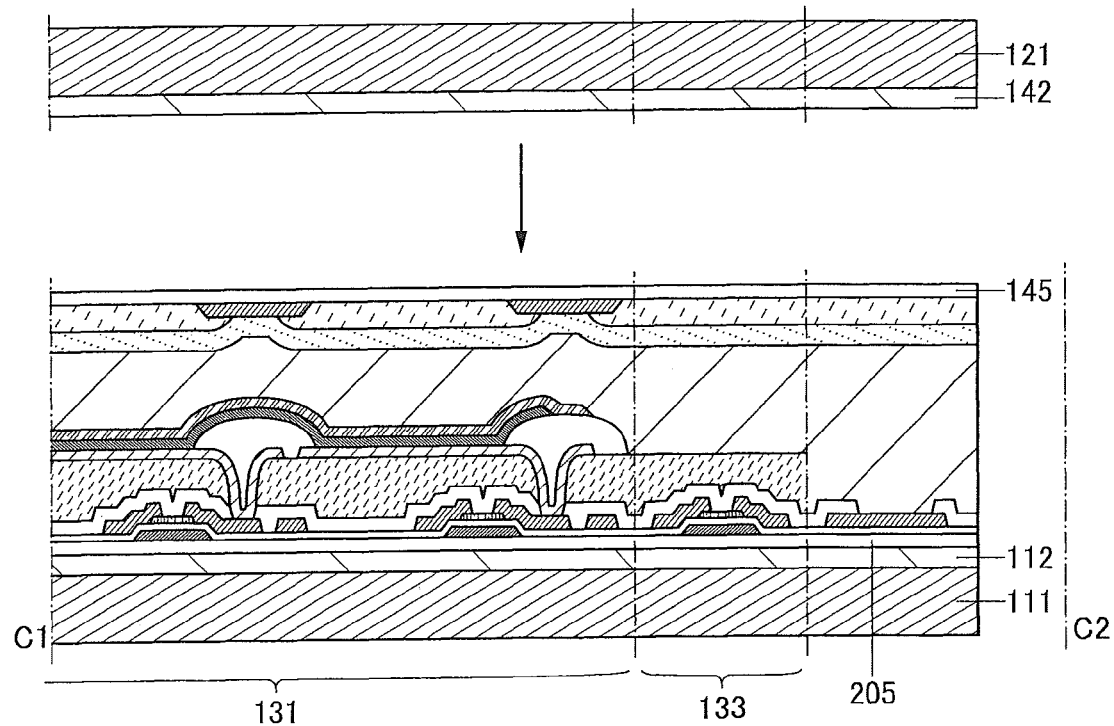

Next, the substrate 121 is attached to the insulating layer 145 with the bonding layer 142 positioned therebetween (see FIG. 13B). The bonding layer 142 can be formed using a material similar to that of the bonding layer 120. The substrate 121 can be formed using a material similar to that of the substrate 111.

[Formation of Opening]

Figure 14A:
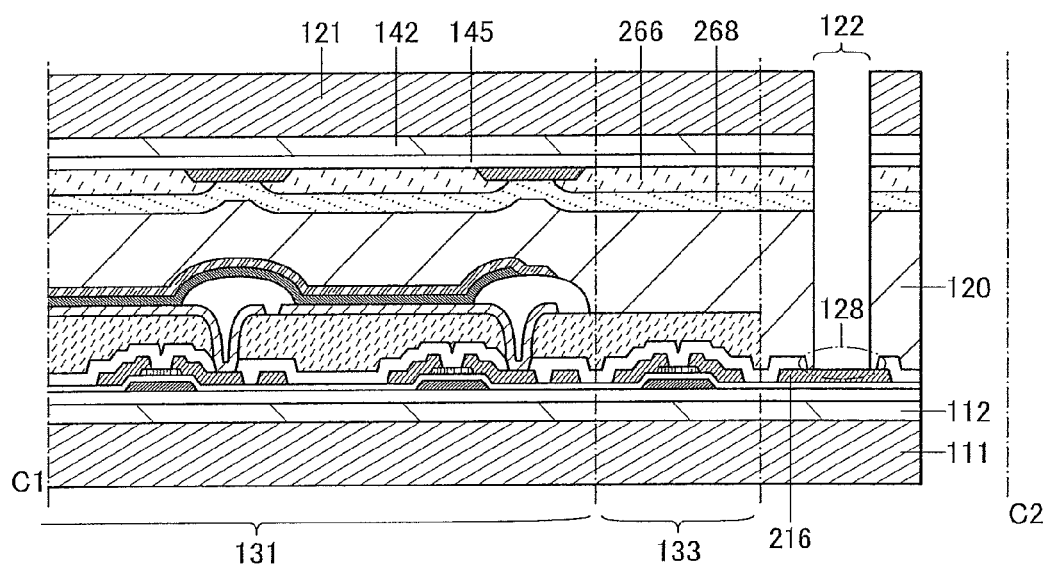
FIGS. 14A and 14B are cross-sectional views illustrating an example of a method for manufacturing a display device.

Next, the substrate 121, the bonding layer 142, the insulating layer 145, the coloring layer 266, the overcoat layer 268, and the bonding layer 120 in a region overlapping with the terminal electrode 216 and the opening 128 are removed to form the opening 122 (see FIG. 14A). A surface of the terminal electrode 216 is partly exposed by the formation of the opening 122.

[Formation of External Electrode]

Figure 14B:
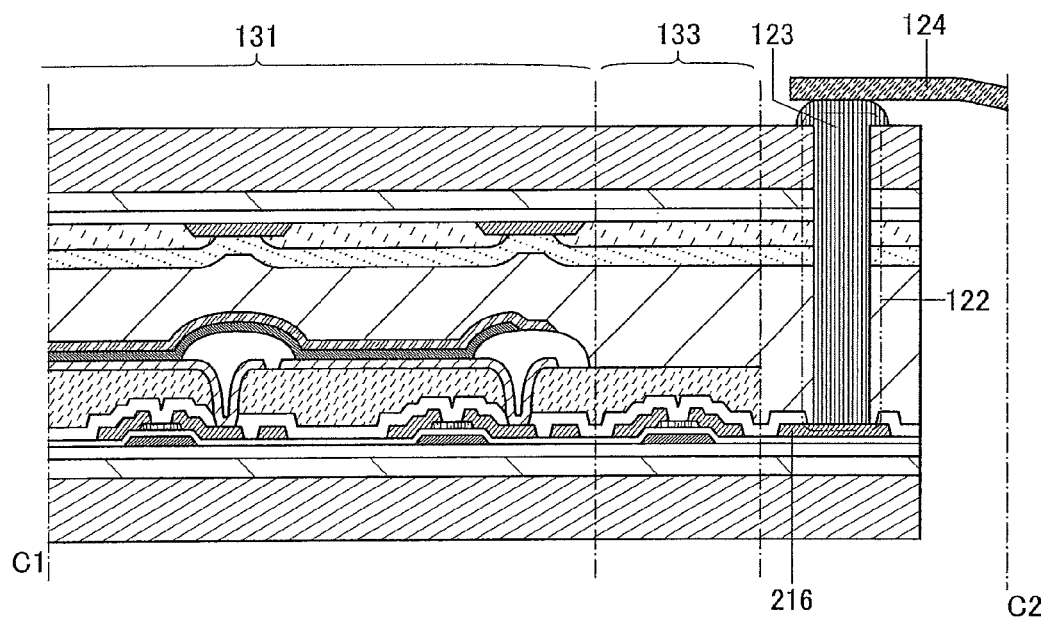
Figure 15:
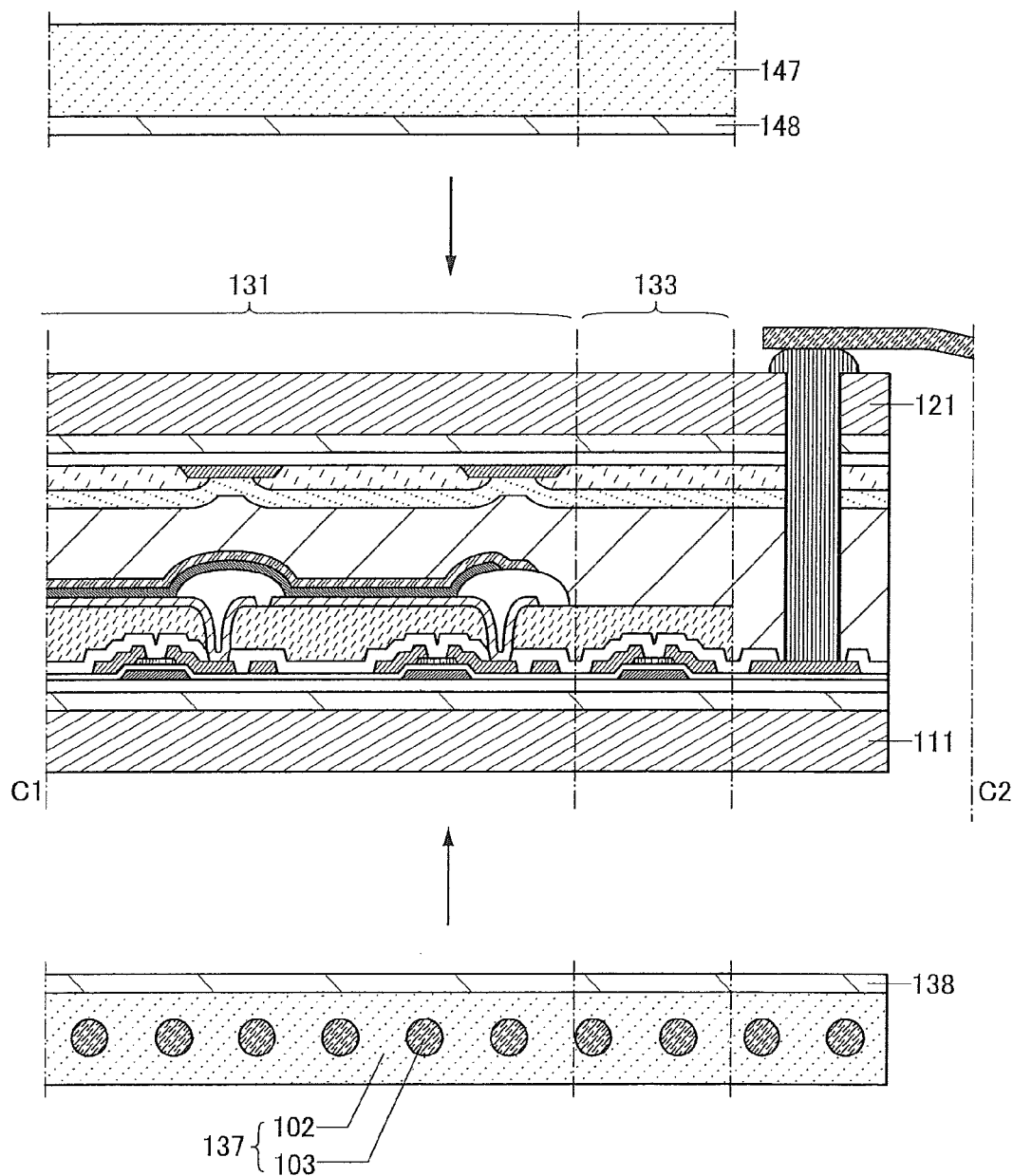
FIG. 15 is a cross-sectional view illustrating an example of a method for manufacturing a display device.

Next, the anisotropic conductive connection layer 123 is formed in and on the opening 122, and the external electrode 124 for inputting electric power or a signal to the display device 100 is formed over the anisotropic conductive connection layer 123 (see FIG. 14B). The terminal electrode 216 is electrically connected to the external electrode 124 through the anisotropic conductive connection layer 123. For example, a flexible printed circuit (FPC) can be used as the external electrode 124.

The anisotropic conductive connection layer 123 can be formed using an anisotropic conductive film (ACF), an anisotropic conductive paste (ACP), or the like.

The anisotropic conductive connection layer 123 is formed by curing a paste-form or sheet-form material that is obtained by mixing conductive particles to a thermosetting resin or a thermosetting, light curable resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as gold, nickel, or cobalt can be used.

[Bonding of Substrates]

Then, the substrate 137 is bonded to the substrate 111 with the bonding layer 138 positioned therebetween. The substrate 147 is bonded to the substrate 121 with the bonding layer 148 positioned therebetween (see FIG. 15). The bonding layers 138 and 148 can be formed using a material similar to that of the bonding layer 120.

The insulator 102 containing the plurality of glass fibers 103 is used as the substrate 137. Each of the plurality of glass fibers 103 extends in the Y direction. The plurality of glass fibers 103 are arranged substantially parallel with each other leaving a predetermined space therebetween.

In this embodiment, for the insulator 102, silicone rubber that has a light-transmitting property with respect to visible light, a thickness of 200 μm, and a Young's modulus of 0.03 GPa is used. As the glass fiber 103, a glass fiber having a circular cross section and a diameter of 50 μm is used.

In this embodiment, for the substrate 147, silicone rubber that has a light-transmitting property with respect to visible light, a thickness of 200 μm, and a Young's modulus of 0.03 GPa is used.

[Components Formed Over Counter Element Formation Substrate]

Next, components, such as the light-blocking layer 264, formed over the element formation substrate 141 are described with reference to FIGS. 16A to 16D.

First, the element formation substrate 141 is prepared. The element formation substrate 141 can be formed using a material similar to that of the element formation substrate 101. Then, the separation layer 143 and the insulating layer 145 are formed over the element formation substrate 141 (see FIG. 16A). The separation layer 143 can be formed using a material and a method similar to those of the separation layer 113. The insulating layer 145 can be formed using a material and a method similar to those of the insulating layer 205.

Figure 16A:
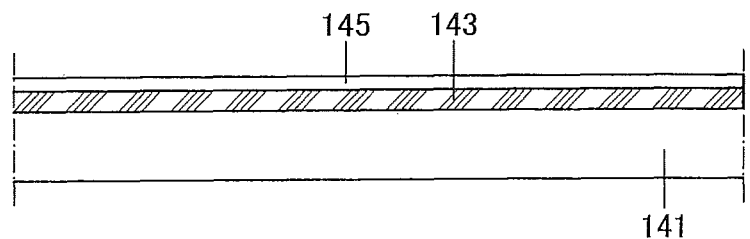
FIGS. 16A to 16D are cross-sectional views illustrating an example of a method for manufacturing a display device.
Figure 16B:
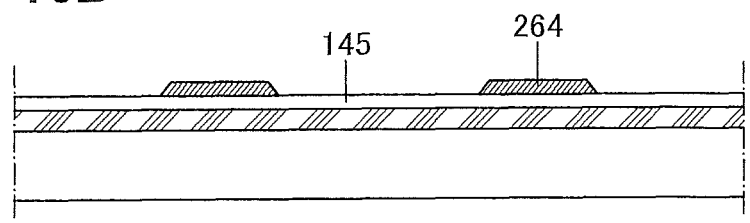
Figure 16C:
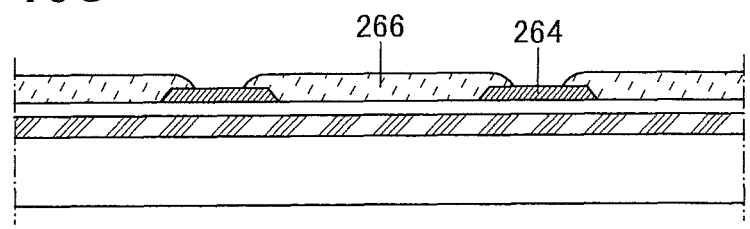

Next, the light-blocking layer 264 is formed over the insulating layer 145 (see FIG. 16B). After that, the coloring layer 266 is formed (see FIG. 16C).

The light-blocking layer 264 and the coloring layer 266 each are formed in a desired position with any of various materials by a printing method, an inkjet method, a photolithography method, or the like.

Figure 16D:
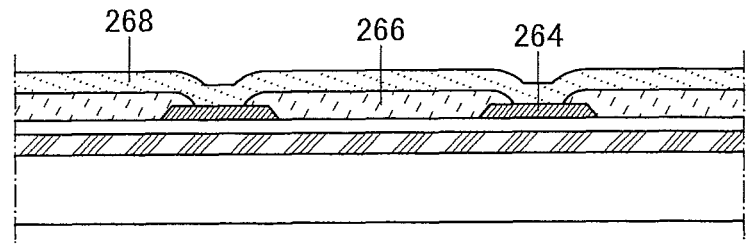

Next, the overcoat layer 268 is formed over the light-blocking layer 264 and the coloring layer 266 (see FIG. 16D).

For the overcoat layer 268, an organic insulating layer of an acrylic resin, an epoxy resin, polyimide, or the like can be used. With the overcoat layer 268, for example, an impurity or the like contained in the coloring layer 266 can be prevented from diffusing to the light-emitting element 125 side. Note that the overcoat layer 268 is not necessarily formed.

A light-transmitting conductive film may be formed as the overcoat layer 268. The light-transmitting conductive film is formed as the overcoat layer 268, so that the light 235 emitted from the light-emitting element 125 can be transmitted through the overcoat layer 268 and layers overlapping with the overcoat layer 268, while ionized impurities can be prevented from passing through the overcoat layer 268.

The light-transmitting conductive film can be formed using, for example, indium oxide, indium tin oxide (ITO), indium zinc oxide, zinc oxide, or zinc oxide to which gallium is added. Graphene or a metal film that is thin enough to have a light-transmitting property can also be used.

Through the above-described steps, the components such as the light-blocking layer 264 can be formed over the element formation substrate 141.

This embodiment can be implemented in an appropriate combination with any of the structures described in other embodiments.

Embodiment 3

In this embodiment, structure examples of a light-emitting element that can be applied to the light-emitting element 125 are described with reference to FIGS. 17A and 17B.

<Structure of Light-Emitting Element>

Figure 17A:
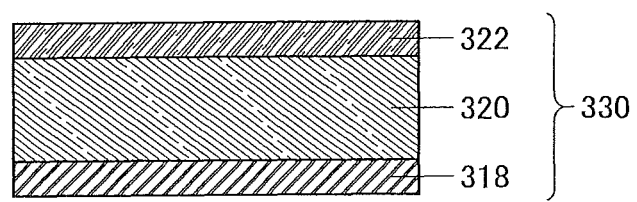
FIGS. 17A and 17B illustrate structure examples of light-emitting elements.

In a light-emitting element 330 illustrated in FIG. 17A, the EL layer 320 is interposed between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 330 illustrated in FIG. 17A emits light when current flows because of a potential difference generated between the electrode 318 and the electrode 322 and holes and electrons are recombined in the EL layer 320. That is, the light-emitting region is formed in the EL layer 320.

In the present invention, light emitted from the light-emitting element 330 is extracted to the outside from the electrode 318 side or the electrode 322 side. Therefore, one of the electrode 318 and the electrode 322 is formed of a light-transmitting substance.

Figure 17B:
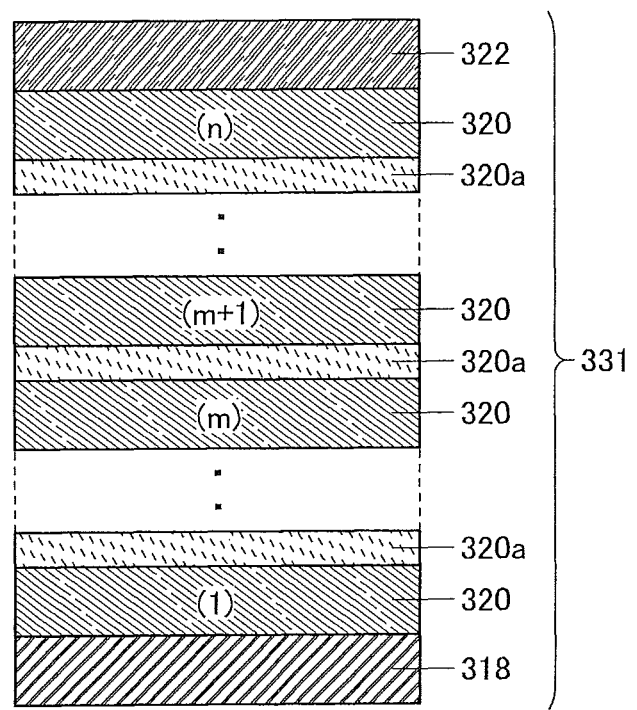

Note that a plurality of the EL layers 320 may be stacked between the electrode 318 and the electrode 322 as in a light-emitting element 331 illustrated in FIG. 17B. In the case where n (n is a natural number of 2 or more) layers are stacked, a charge generation layer 320a is preferably provided between the m-th EL layer 320 and the (m+1)-th EL layer 320. Note that m is a natural number greater than or equal to 1 and less than n.

The charge generation layer 320a can be formed by appropriately combining at least one of a composite material of an organic compound and a metal oxide, a metal oxide, and a composite material of an organic compound and an alkali metal, an alkaline earth metal, or a compound thereof. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, substances other than the substances given above may also be used as long as the substances have hole-transport properties higher than electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide with another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The light-emitting element 331 having such a structure is unlikely to suffer the problem of energy transfer, quenching, or the like and has an expanded choice of materials, and thus can easily have both high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 331 illustrated in FIG. 17B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 17B, as for the combination of a plurality of EL layers, a structure for emitting white light including red light, green light, and blue light may be used; for example, the structure may include a light-emitting layer containing a blue fluorescent substance as a light-emitting substance and a light-emitting layer containing red and green phosphorescent substances as light-emitting substances. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from a first light-emitting layer and light emitted from a second light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the light-emitting element can emit light in a high luminance region while the current density is kept low. Since the current density can be kept low, the element can have a long lifetime. In addition, the voltage drop due to the resistance of the electrode material can be reduced, whereby uniform light emission in a large area is possible.

This embodiment can be implemented in an appropriate combination with any of the structures described in other embodiments.

Embodiment 4

A display device 150 having a bottom-emission structure can be fabricated by modification of the structure of the display device 100 having a top-emission structure.

FIGS. 18A and 18B illustrate examples of a cross-sectional structure of the display device 150 having a bottom-emission structure. Note that FIGS. 18A and 18B are cross-sectional views of a portion similar to the portion denoted by the dashed-dotted line C1-C2 in FIG. 3A that is a perspective view of the display device 100. The display device 150 having a bottom-emission structure in FIGS. 18A and 18B differs from the display device 100 in the position where the light-blocking layer 264, the coloring layer 266, and the overcoat layer 268 are formed. Specifically, in the display device 150, the light-blocking layer 264, the coloring layer 266, and the overcoat layer 268 are formed over the substrate 111.

In the display device 150, the substrate 121 on which the insulating layer 145 is directly formed can be attached to the substrate 111 with the bonding layer 120 positioned therebetween. In other words, the insulating layer 145 does not need to be transferred from the element formation substrate 141; thus, the element formation substrate 141, the separation layer 143, and the bonding layer 142 are not needed. This can improve the productivity, yield, and the like of the display device.

Note that other components of the display device 150 can be formed as in the case of the display device 100.

In the display device 150 having a bottom-emission structure, the electrode 115 is formed using a light-transmitting conductive material, and the electrode 118 is formed using a conductive material that efficiently reflects light emitted from the EL layer 117.

In the display device 150, the light 235 emitted from the EL layer 117 can be extracted from the substrate 111 side through the coloring layer 266.

Note that the display device 150 illustrated in FIG. 18B is an example of a display device in which a transistor 272 is used as a transistor included in the driver circuit 133. Although the transistor 272 can be formed in a manner similar to that of the transistor 252, the transistor 272 differs from the transistor 252 in that an electrode 263 is formed over the insulating layer 210 in a region overlapping with the semiconductor layer 208. The electrode 263 can be formed using a material and a method similar to those of the gate electrode 206.

The electrode 263 can also serve as a gate electrode. In the case where one of the gate electrode 206 and the electrode 263 is simply referred to as a "gate electrode", the other may be referred to as a "back gate electrode". One of the gate electrode 206 and the electrode 263 may be referred to as a "first gate electrode", and the other may be referred to as a "second gate electrode".

In general, the back gate electrode is formed using a conductive film and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Furthermore, the gate electrode and the back gate electrode are formed using conductive films and thus each have a function of preventing an electric field generated outside the transistor from influencing the semiconductor layer in which the channel is formed (in particular, a function of blocking static electricity).

In the case where light is incident on the back gate electrode side, when the back gate electrode is formed using a light-blocking conductive film, light can be prevented from entering the semiconductor layer from the back gate electrode side. Thus, photodegradation of the semiconductor layer can be prevented and deterioration in electrical characteristics of the transistor, such as a shift of the threshold voltage, can be prevented.

By providing the gate electrode 206 and the electrode 263 with the semiconductor layer 208 therebetween and setting the potentials of the gate electrode 206 and the electrode 263 to be equal, a region of the semiconductor layer 208 through which carriers flow is enlarged in the film thickness direction; thus, the number of transferred carriers is increased. As a result, the on-state current and the field-effect mobility of the transistor are increased.

The gate electrode 206 and the electrode 263 each have a function of blocking an external electric field; thus, influence of charges in a layer under the gate electrode 206 and in a layer over the electrode 263 on the semiconductor layer 208 can be inhibited. Thus, there is little change in the threshold voltage in a stress test (e.g., a negative gate bias temperature (−GBT) stress test in which a negative voltage is applied to a gate or a +GBT stress test in which a positive voltage is applied to a gate). In addition, changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor in the BT stress test is an important indicator when examining the reliability of the transistor. As the amount of change in the threshold voltage in the BT stress test is small, the transistor has higher reliability.

By providing the gate electrode 206 and the electrode 263 and setting the potentials of the gate electrode 206 and the electrode 263 to be the same, the amount of change in the threshold voltage is reduced. Accordingly, variation in electrical characteristics among a plurality of transistors is also reduced.

Note that a back gate electrode may be provided in the transistor 232 formed in the display region 131.

This embodiment can be implemented in an appropriate combination with any of the structures described in other embodiments.

Embodiment 5

A display device 160 in which the light-blocking layer 264, the coloring layer 266, the overcoat layer 268, and the like are not provided can be manufactured by modification of the structure of the display device 100 having a top-emission structure.

Figure 19A:
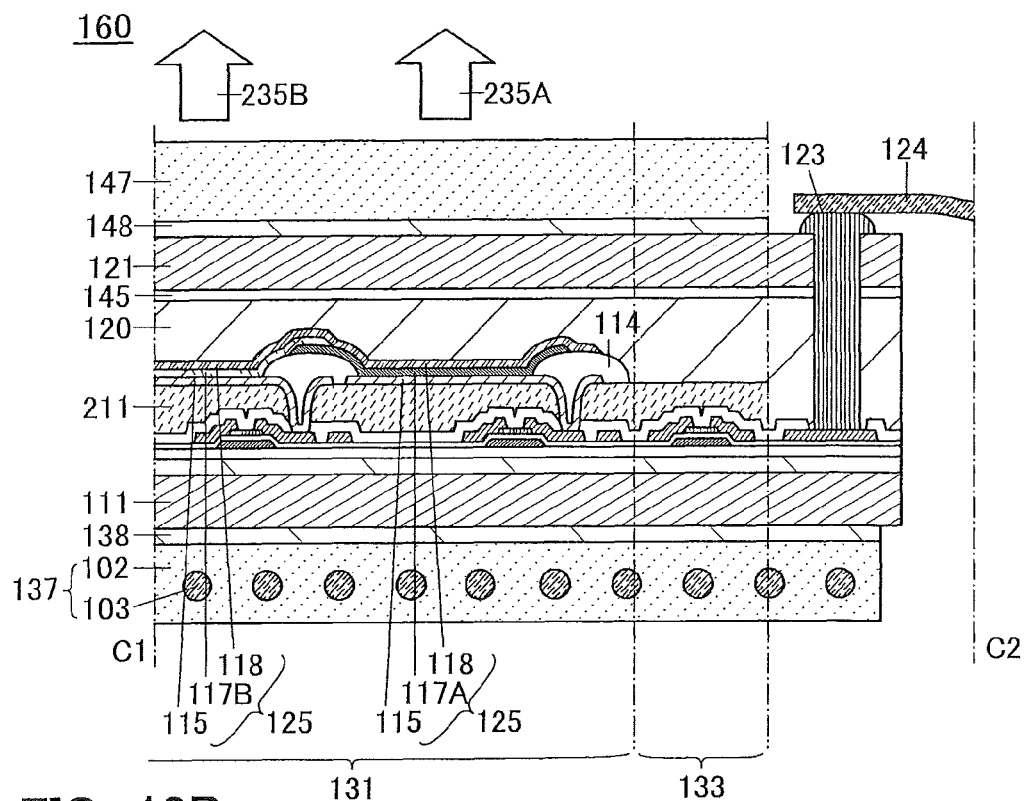
FIGS. 19A and 19B are cross-sectional views illustrating modes of a display device.
Figure 19B:
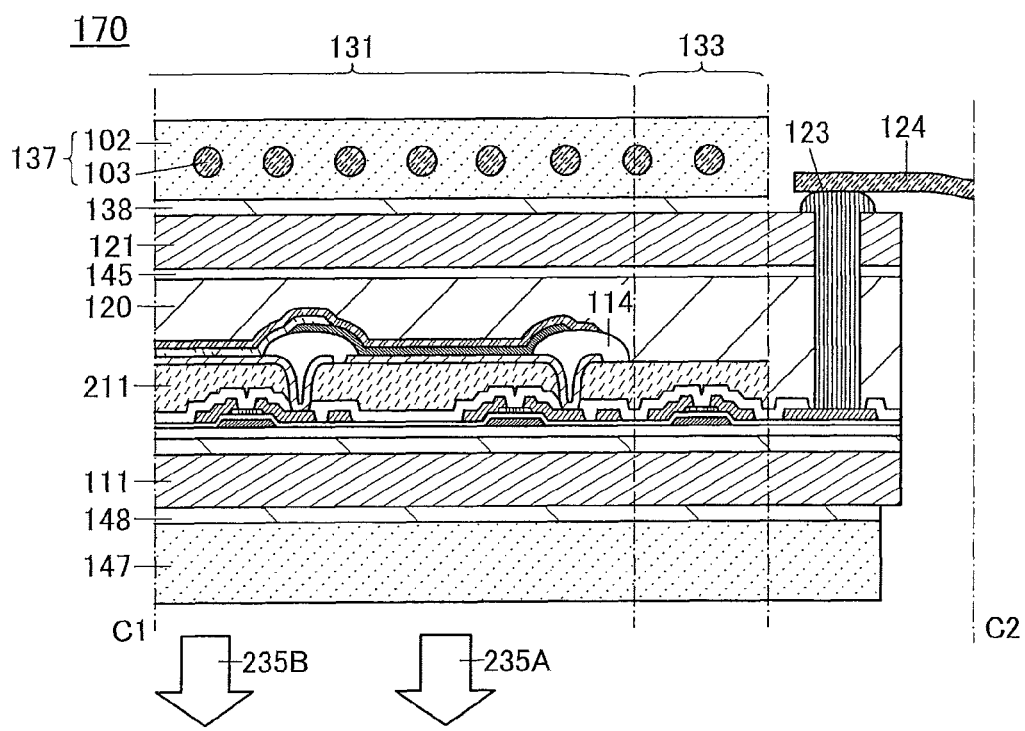

FIG. 19A illustrates an example of a cross-sectional structure of the display device 160. Note that FIGS. 19A and 19B are cross-sectional views of a portion similar to the portion denoted by the dashed-dotted line C1-C2 in FIG. 3A that is a perspective view of the display device 100. In the display device 160, color display can be performed by using an EL layer 117A, an EL layer 117B, an EL layer 117C (not shown), and the like instead of the light-blocking layer 264, the coloring layer 266, and the overcoat layer 268. The EL layer 117A, the EL layer 117B, and the like can emit light of the respective colors such as red, blue, and green. For example, the EL layer 117A emits light 235A of a red wavelength, the EL layer 117B emits light 235B of a blue wavelength, and the EL layer 117C emits light 235C (not shown) of a green wavelength.

Since the coloring layer 266 is not provided, a reduction in luminance caused when the light 235A, light 235B, and light 235C are transmitted through the coloring layer 266 can be prevented. The thicknesses of the EL layer 117A, EL layer 117B, and EL layer 117C are adjusted in accordance with the wavelengths of the light 235A, light 235B, and light 235C, whereby a higher color purity can be achieved.

Note that in a manner similar to that of the display device 160, a display device 170 in which the light-blocking layer 264, the coloring layer 266, the overcoat layer 268, and the like are not provided can also be manufactured by modification of the structure of the display device 150 having a bottom-emission structure. FIG. 19B illustrates an example of a cross-sectional structure of the display device 170.

Figure 20A:
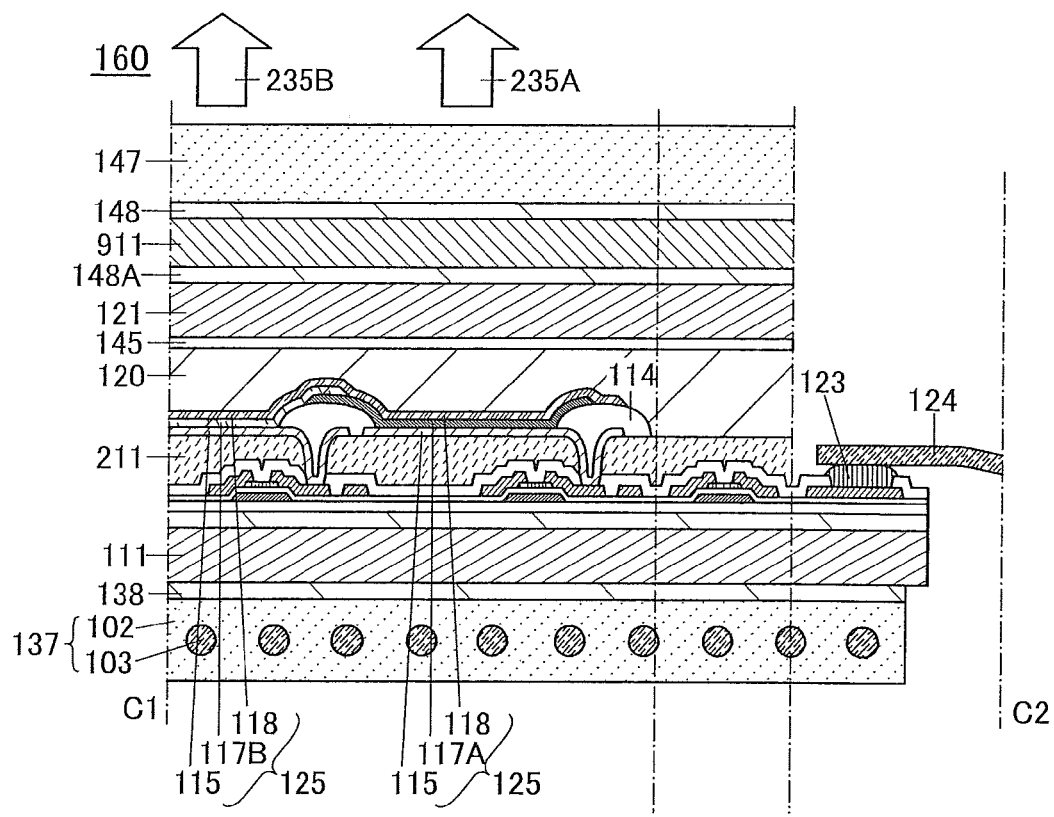
FIGS. 20A and 20B are cross-sectional views illustrating modes of a display device.
Figure 20B:
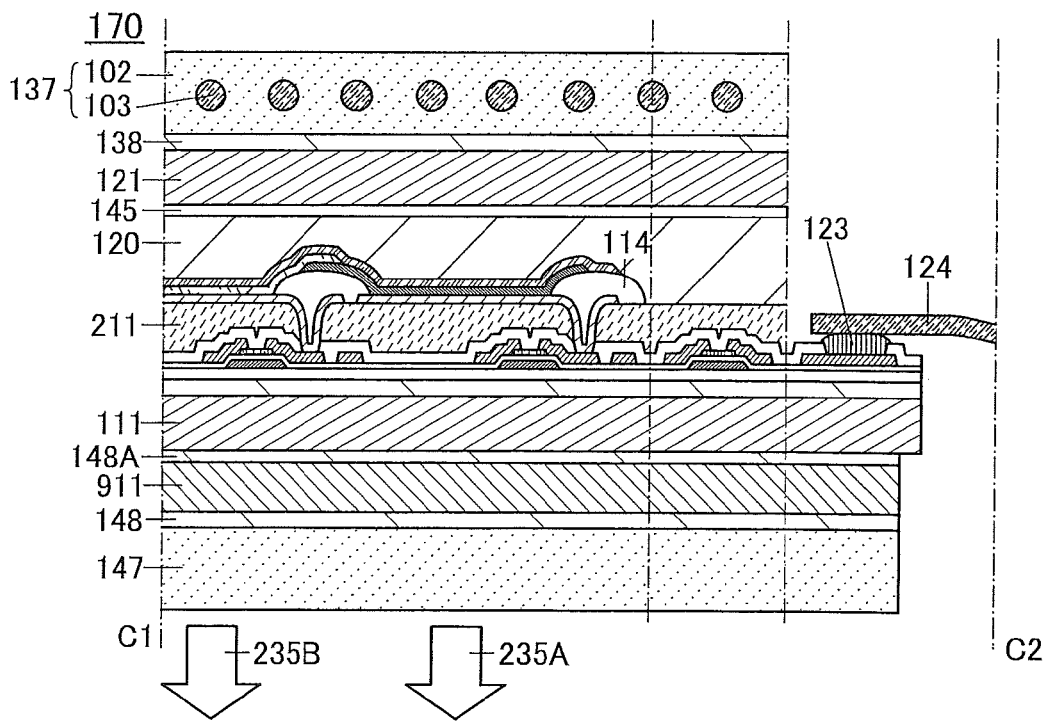

Note that as illustrated in FIGS. 20A and 20B, an optical film 911, examples of which include a polarizing plate, a retardation plate, and a quarter-wave plate, may be additionally provided. The optical film 911 is bonded to the substrate 111 or the substrate 121 with the use of a bonding layer 148A. This structure can reduce reflection at a screen surface.

Note that other components of the display devices 160 and 170 can be formed as in the case of the display device 100.

This embodiment can be implemented in an appropriate combination with any of the structures described in other embodiments.

Embodiment 6

Figure 21A:
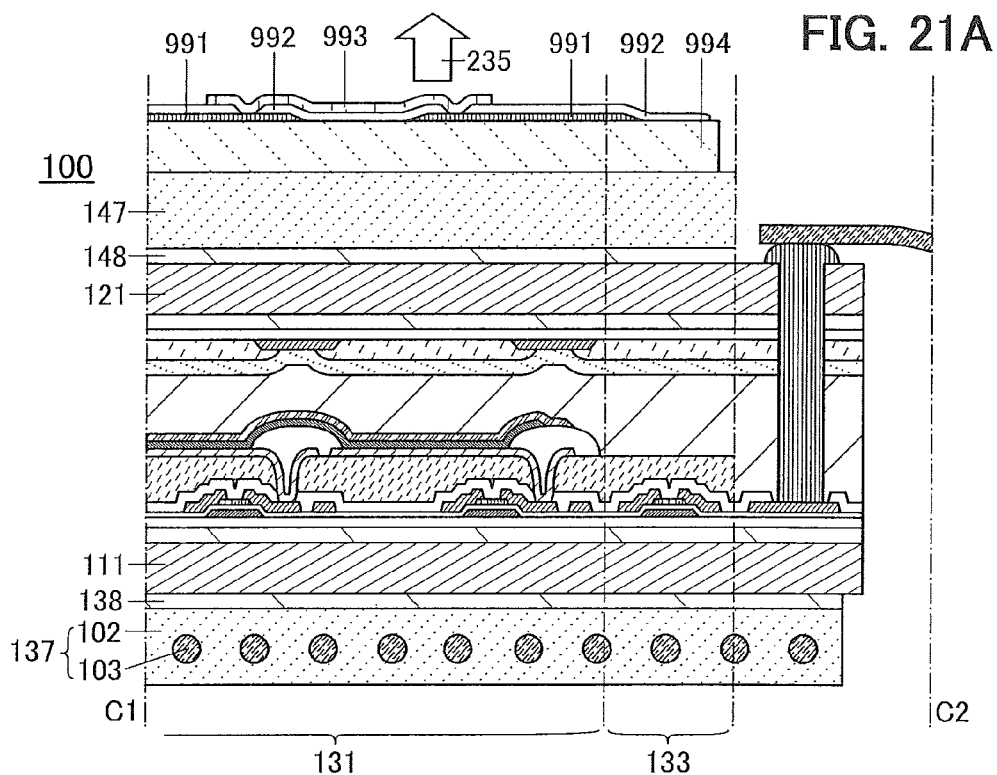
FIGS. 21A and 21B are cross-sectional views illustrating modes of a display device.

In the display device 100, a substrate provided with a touch sensor may be provided over the substrate 147 as illustrated in FIG. 21A. The touch sensor is formed using a conductive layer 991, a conductive layer 993, and the like. In addition, an insulating layer 992 is formed between the conductive layers.

As the conductive layer 991 and the conductive layer 993, a transparent conductive film of indium tin oxide, indium zinc oxide, or the like is preferably used. Note that a layer containing a low-resistance material may be used for part or the whole of the conductive layer 991 and the conductive layer 993 in order to reduce resistance. For example, the conductive layer 991 and the conductive layer 993 can be formed as a single layer or a stack using any of metals such as aluminum, titanium, chromium, nickel, copper, yttrium, zirconium, molybdenum, silver, tantalum, and tungsten or an alloy containing any of these metals as its main component. Alternatively, a metal nanowire may be used as the conductive layer 991 and the conductive layer 993. Silver or the like is preferably used as a metal for the metal nanowire, in which case the resistance value can be reduced and the sensitivity of the sensor can be improved.

The insulating layer 992 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 992 can be formed by a sputtering method, a CVD method, a thermal oxidation method, a coating method, a printing method, or the like.

Although the touch sensor is provided over a substrate 994, one embodiment of the present invention is not limited thereto. The touch sensor may be provided under the substrate 994 (i.e., between the substrate 121 and the substrate 994).

Figure 21B:
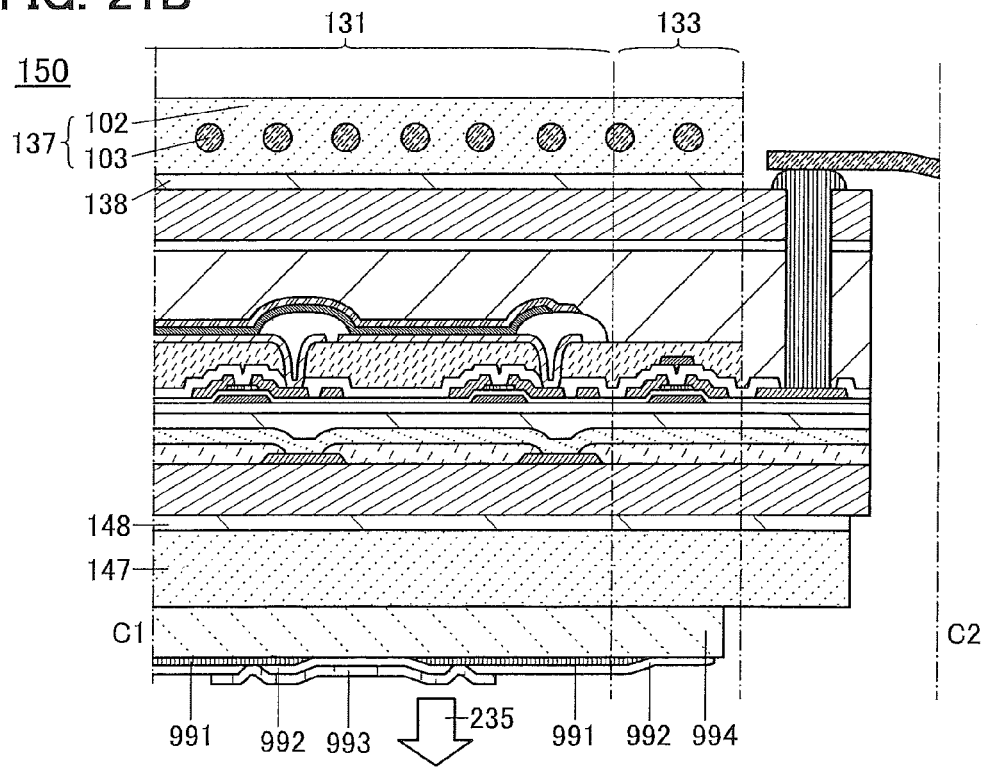

The substrate provided with the touch sensor may be positioned under the substrate 147 in the display device 150 as illustrated in FIG. 21B.

Figure 22A:
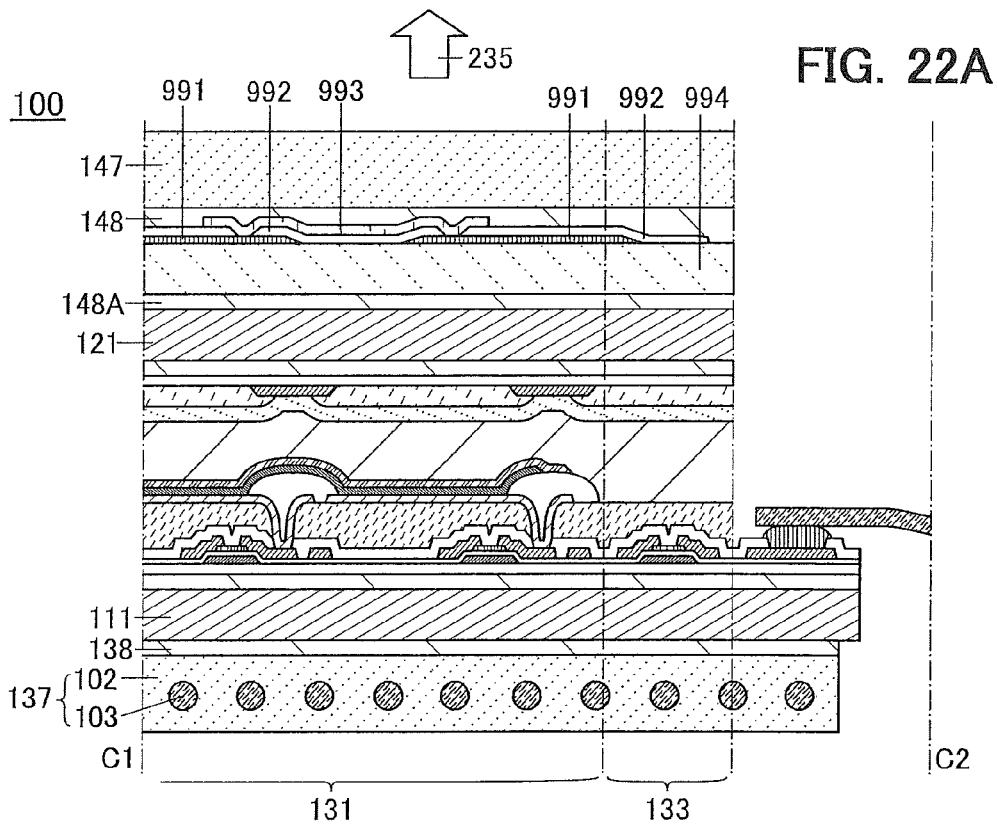
FIGS. 22A and 22B are cross-sectional views illustrating modes of a display device.
Figure 22B:
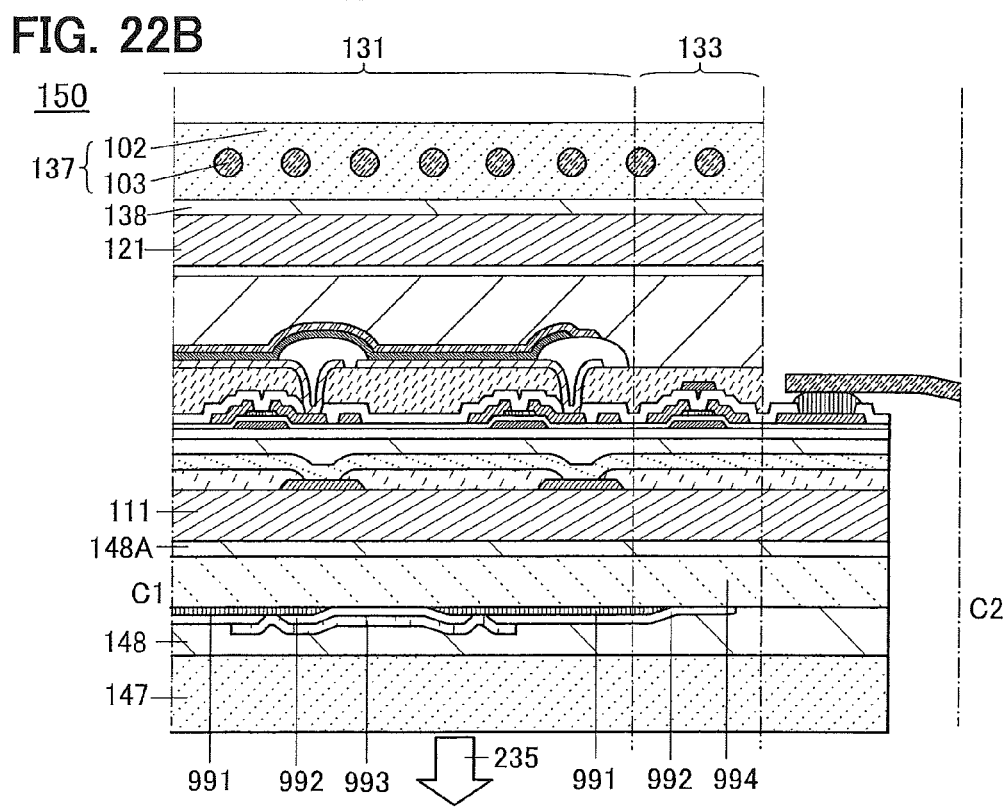

The touch sensor may be positioned over the substrate 121 with the bonding layer 148A positioned therebetween as illustrated in FIG. 22A, or may be positioned under the substrate 111 with the bonding layer 148A positioned therebetween as illustrated in FIG. 22B.

Note that the substrate 994 may have a function of an optical film. That is, the substrate 994 may have a function of a polarizing plate, a retardation plate, or the like.

Figure 23A:
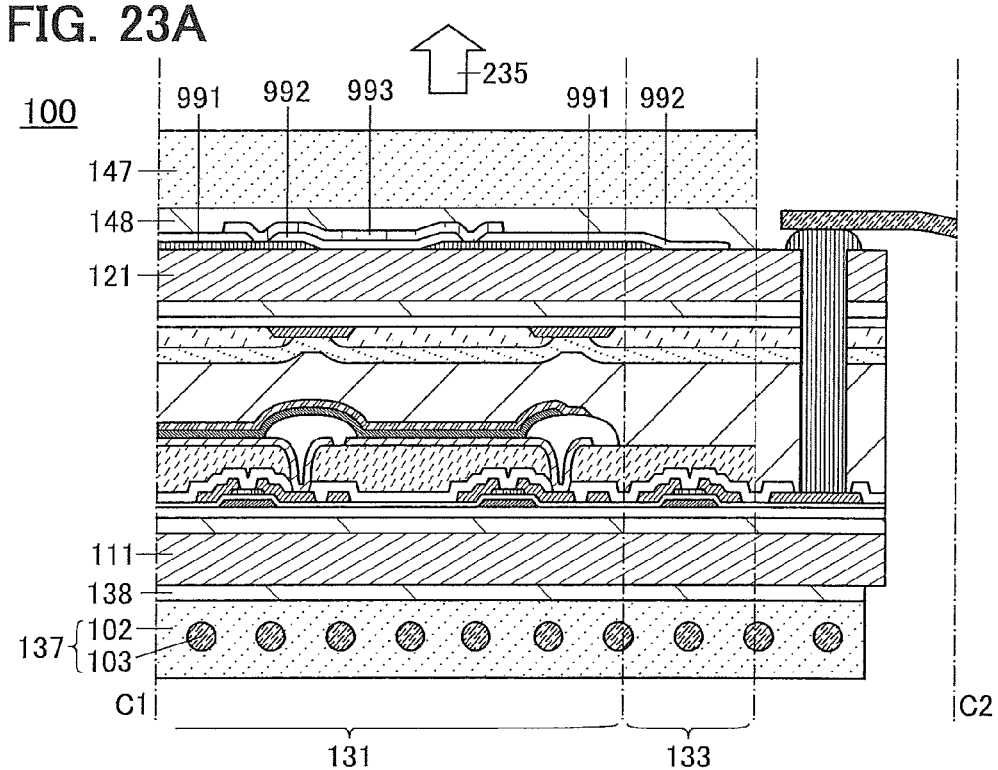
FIGS. 23A and 23B are cross-sectional views illustrating modes of a display device.

In the display device 100, the substrate 121 may be provided with a touch sensor. FIG. 23A illustrates an example in which the substrate 121 is provided with a touch sensor and the substrate 147 is formed over the touch sensor and the bonding layer 148.

Figure 23B:
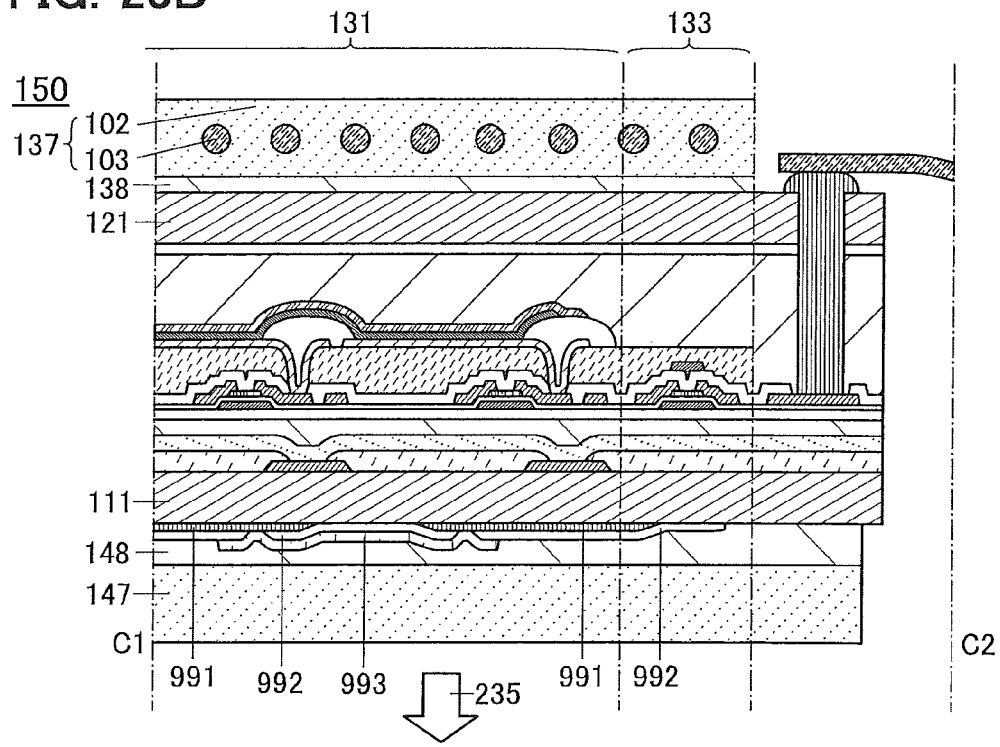

In the display device 150, the substrate 111 may be provided with a touch sensor. FIG. 23B illustrates an example in which the substrate 111 is provided with a touch sensor and the substrate 147 is formed under the touch sensor and the bonding layer 148.

Figure 24A:
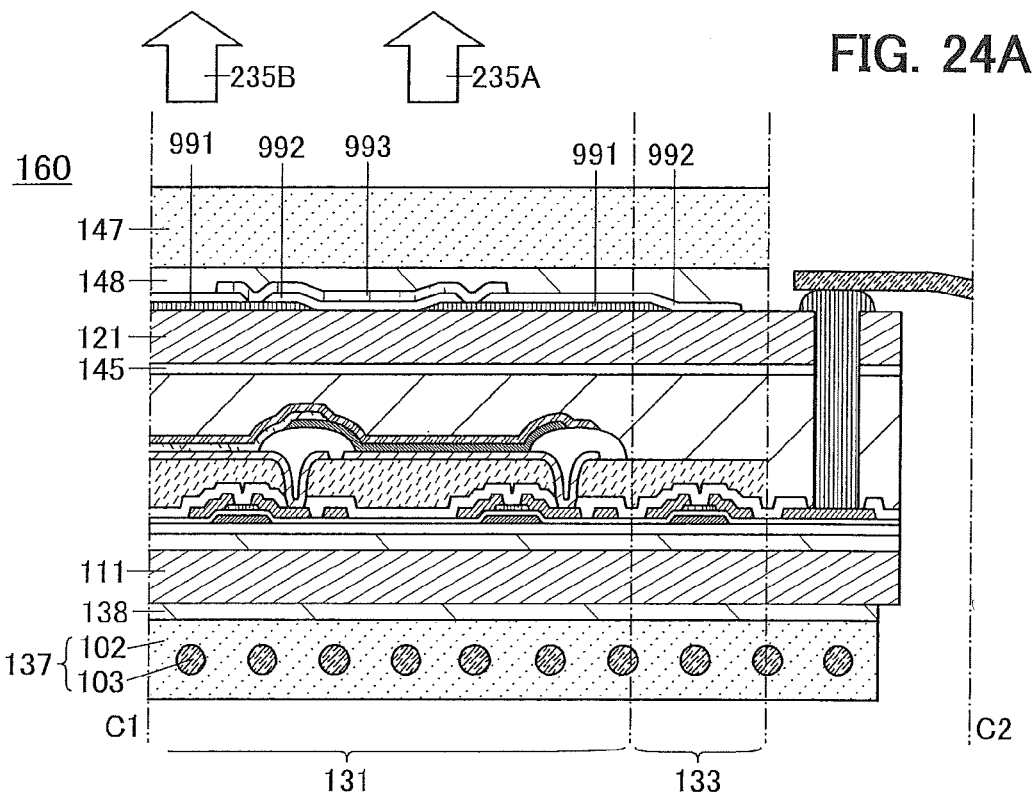
FIGS. 24A and 24B are cross-sectional views illustrating modes of a display device.

In the display device 160, the substrate 121 may be provided with a touch sensor. FIG. 24A illustrates an example in which the substrate 121 is provided with a touch sensor and the substrate 147 is formed over the touch sensor and the bonding layer 148.

Figure 24B:
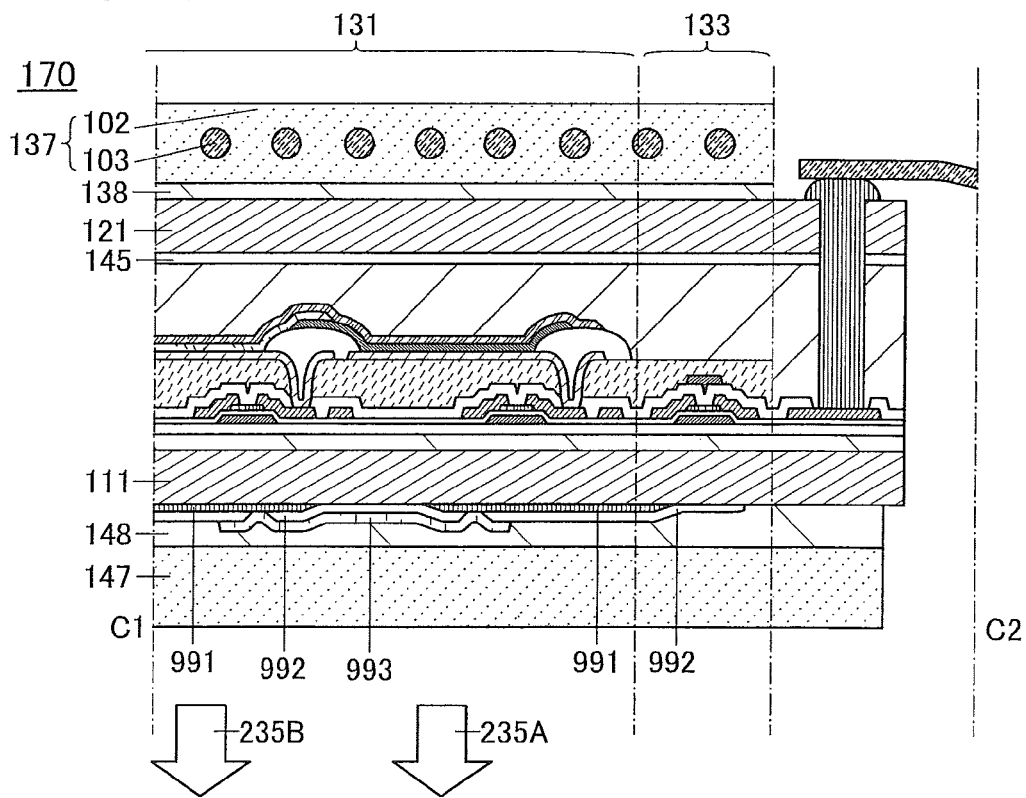

In the display device 170, the substrate 111 may be provided with a touch sensor. FIG. 24B illustrates an example in which the substrate 111 is provided with a touch sensor and the substrate 147 is formed under the touch sensor and the bonding layer 148.

Figure 25A:
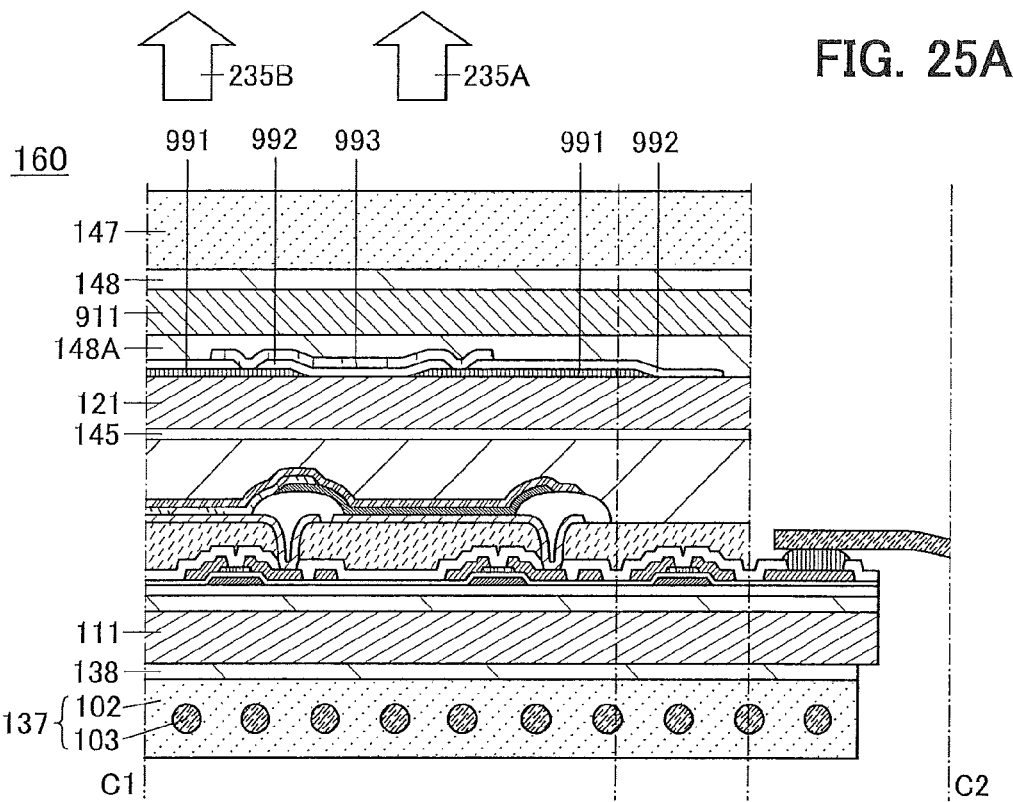
FIGS. 25A and 25B are cross-sectional views illustrating modes of a display device.
Figure 25B:
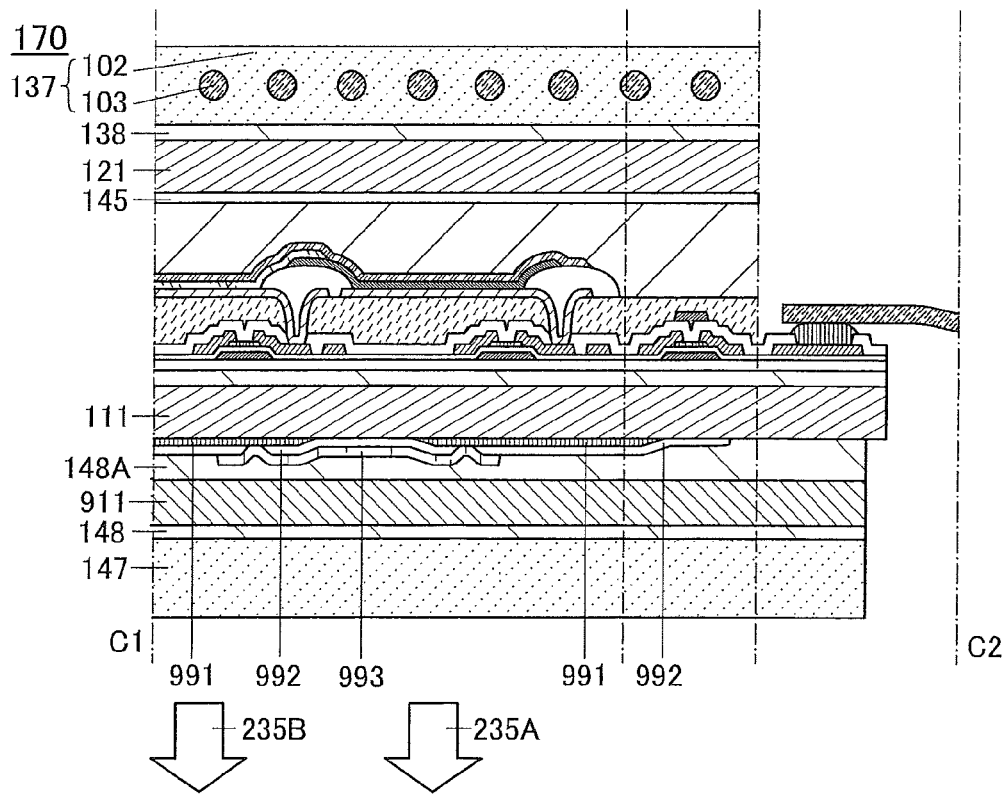

Note that in the display device 160 in FIG. 24A and the display device 170 in FIG. 24B, the optical film 911 may be provided. FIGS. 25A and 25B each illustrate an example of this case. The optical film 911 is bonded to the substrate 111 or the substrate 121 with the use of a bonding layer 148A.

Note that as the touch sensor, a capacitive touch sensor or a touch sensor provided with a light-receiving element such as a p-n photodiode or a p-i-n photodiode can be used.

This embodiment can be implemented in an appropriate combination with any of the structures described in other embodiments.

Embodiment 7

Figure 26A:
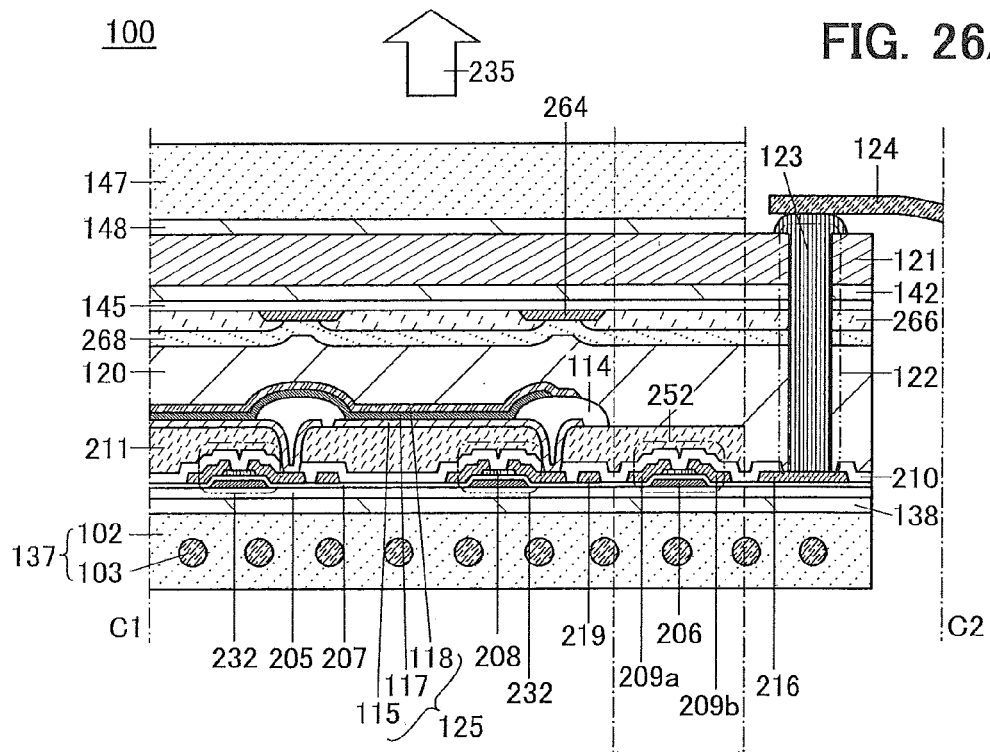
FIGS. 26A and 26B are cross-sectional views illustrating modes of a display device.
Figure 26B:
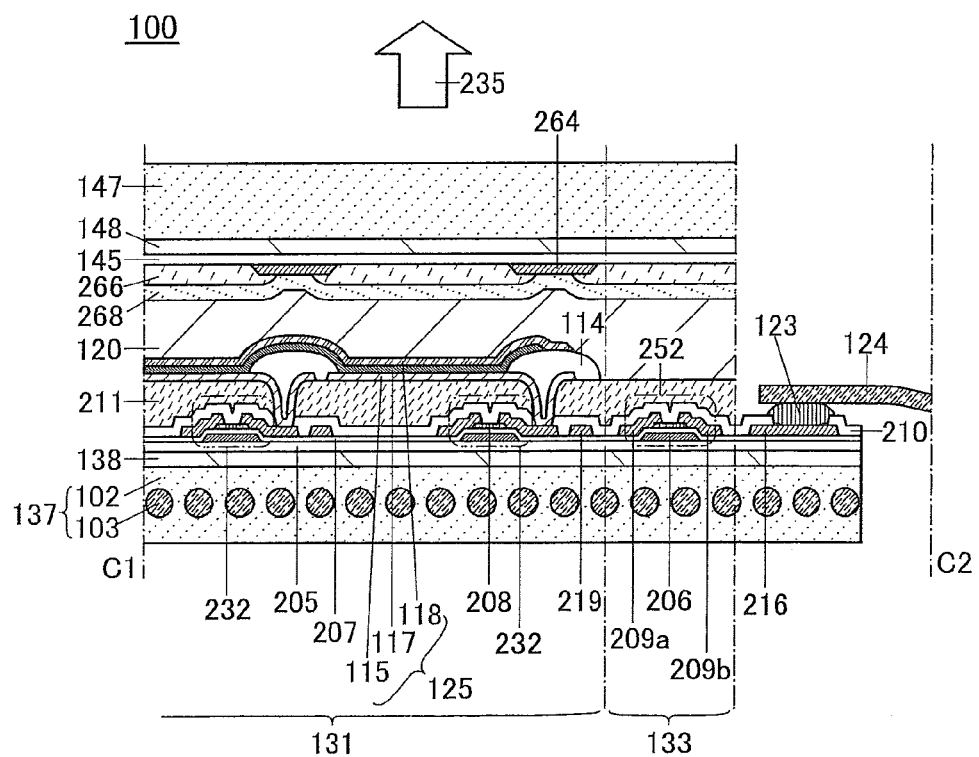

In this embodiment, the cases where the substrate 111 and the substrate 121 are omitted from the display device 100 are described with reference to FIGS. 26A and 26B. FIGS. 26A and 26B are cross-sectional views of a portion similar to the portion denoted by the dashed-dotted line C1-C2 in FIG. 3A that is a perspective view of the display device 100.

The display device 100 in FIG. 26A is different from the display device 100 in FIG. 3B in that the substrate 111 is not provided.

In the display device 100 in FIG. 26A, since the substrate 137 contains the plurality of glass fibers 103, the substrate 137 has high mechanical strength. Therefore, deformation of a substrate in manufacture of the display device 100 can be prevented without the substrate 111. Furthermore, mechanical strength of the display device 100 when handled can be sufficiently high without the substrate 111.

In addition, by increasing the thickness or density of the glass fibers 103 contained in the substrate 137, the substrate 137 can have higher mechanical strength. As a result, deformation of a substrate in manufacture of the display device 100 can be prevented more reliably without the substrate 111. Furthermore, the display device 100 when handled can have further increased mechanical strength without the substrate 111.

Since the substrate 111 can be omitted from the display device 100 in FIG. 26A, the bonding layer 112 for bonding the substrate 111 can also be omitted. Thus, a display device, a lighting device, or an electronic device with reduced thickness and weight and excellent portability can be provided.

A structure may be employed where a substrate other than the substrate 137 is not included in the bottom portion of the display device 100, in which case the substrate 111 that is easily creased is not used. Thus, the display device 100 is not easily creased, even after repetitive bending. Examples of the crease include a crease causing the display device 100 to be bent in the X direction, and residual strain and a wrinkle caused after the display device 100 is repeatedly bent in the X direction. Thus, it is possible to provide a display device, a lighting device, or an electronic device that can be repeatedly bent almost without being creased when handled.

In the display device 100 illustrated in FIG. 26B, both the substrate 111 and the substrate 121 are omitted. The display device 100 in FIG. 26B is different from the display device 100 in FIG. 5 in that the substrate 111 and the substrate 121 are not provided. When the substrate 137 contains the plurality of glass fibers 103 such that the substrate is not deformed in manufacture of the display device 100 and the substrate 137 thus has high mechanical strength, both the substrate 111 and the substrate 121 can be omitted.

Since the substrate 111 and the substrate 121 can be omitted in this embodiment, the bonding layer 112 and the bonding layer 142 for bonding the substrate 111 and the substrate 121 can also be omitted. Thus, a display device, a lighting device, or an electronic device with further reduced thickness and weight and excellent portability can be provided.

A structure may be employed where the substrate 111 and the substrate 121 that are easily creased are not used but only the substrate 147 and the substrate 137 are used as the substrates of the display device 100. Thus, the display device 100 is not easily creased, even after repetitive bending. Examples of the crease include a crease causing the display device 100 to be bent in the X direction, and residual strain and a wrinkle caused after the display device 100 is repeatedly bent in the X direction. Thus, it is possible to provide a display device, a lighting device, or an electronic device that can be repeatedly bent almost without being creased when handled.

This embodiment can be implemented in an appropriate combination with any of the structures described in other embodiments.

Embodiment 8

Figure 27A:
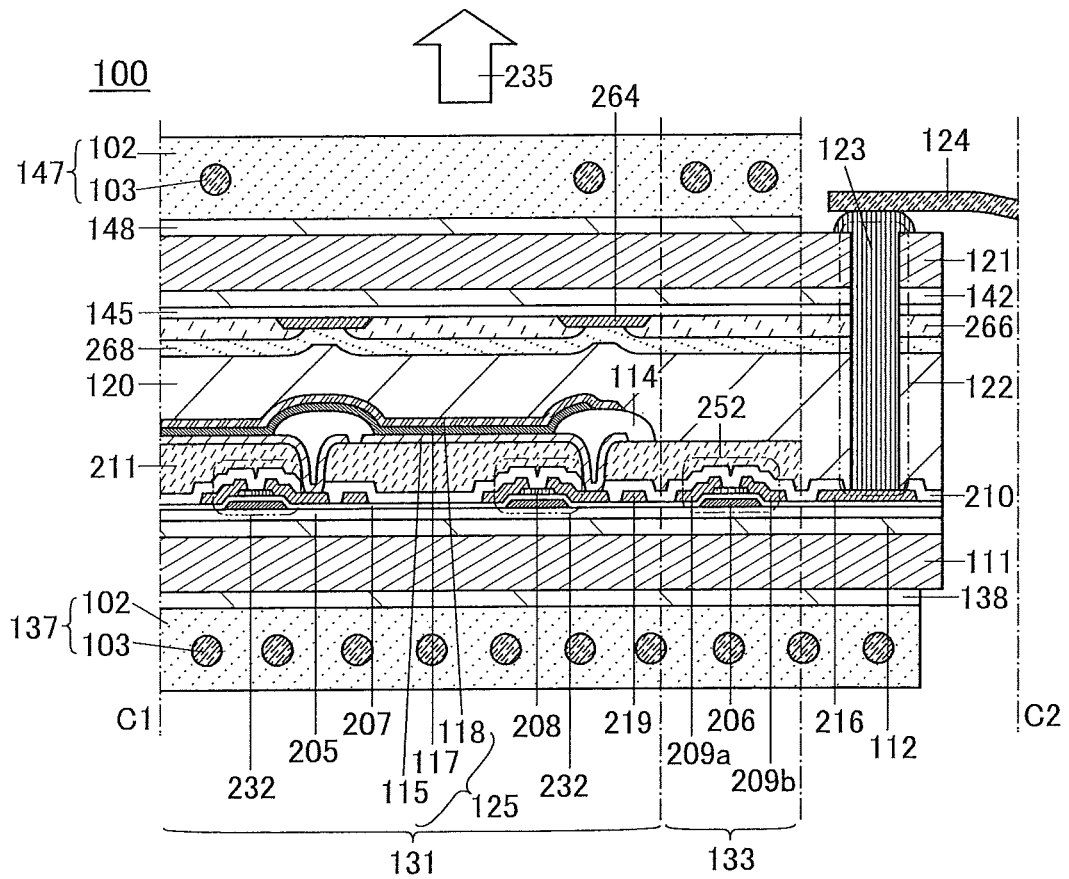
FIGS. 27A and 27B illustrate one mode of a display device.

In this embodiment, the display device 100 in which the plurality of glass fibers 103 are provided on the side through which the light 235 is emitted (display surface side) is described with reference to FIGS. 27A and 27B. Specifically, the case where the plurality of glass fibers 103 are contained in the substrate 147 provided on the side through which the light 235 is emitted (display surface side) is described. FIG. 27A is a cross-sectional view of a portion similar to the portion denoted by the dashed-dotted line C1-C2 in FIG. 3A that is a perspective view of the display device 100.

The display device 100 in FIG. 27A is different from the display device 100 in FIG. 3B in that the substrate 147 contains the plurality of glass fibers 103.

In the display device 100 in FIG. 27A, the substrate 147 contains the plurality of glass fibers 103. The substrate 147 can be formed using a material and a method similar to those of the substrate 137. As illustrated in FIG. 27B, the plurality of glass fibers 103 in the substrate 147 extend in the Y direction.

When both the plurality of glass fibers 103 in the substrate 147 and the plurality of glass fibers 103 in the substrate 137 extend in the Y direction, the flexibility of the display device 100 in the Y direction can be sufficiently low. As a result, it is easy to bend the display device 100 in the X direction but it is more difficult to bend the display device 100 in the Y direction. A region where a bending axis in the X direction intersects a bending axis in the Y direction is unlikely to be formed, which can more reliably prevent a phenomenon in which great force is applied to a certain region during handling of the display device 100 and a malfunction such as a short circuit between wirings is caused in the region.

The glass fibers 103 may have different densities in the substrate 147 in an appropriate manner. Specifically, the density of the glass fibers 103 in the substrate 147 is preferably low in the display region 131.

Figure 27B:
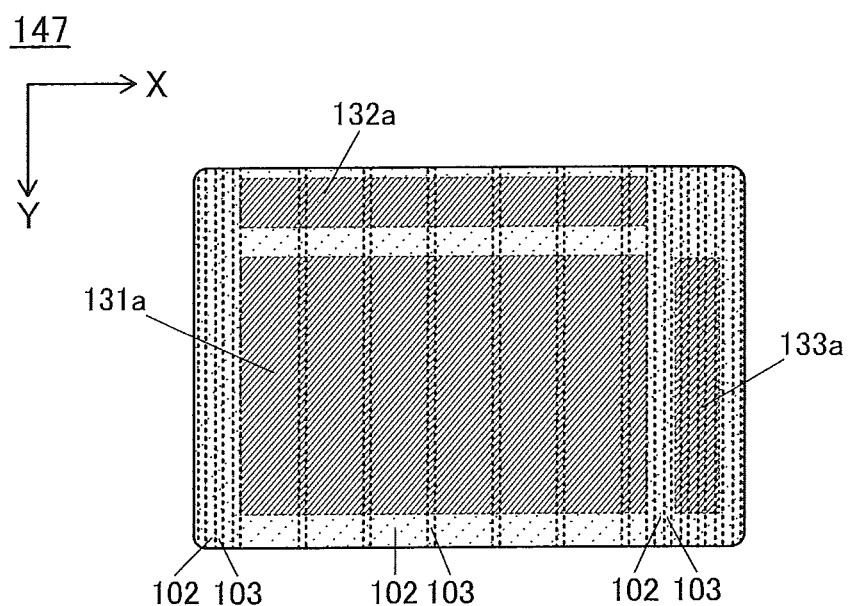

FIG. 27B illustrates the substrate 147 in this embodiment. Note that in FIG. 27B, a region 131a corresponds to the display region 131, a region 132a corresponds to the driver circuit 132, and a region 133a corresponds to the driver circuit 133. The density of the glass fibers 103 in the substrate 147 can be low in the region 131a and high in the region 133a as shown in FIG. 27B. Accordingly, interference between the glass fibers 103 in the substrate 147 and the light 235 can be minimized, whereby favorable display by the display device 100 can be secured. Since the glass fibers 103 with a high light-transmitting property are used in this embodiment, influence of the glass fibers 103 in the region 131a on the light 235 can be small.

In the display device 100 in this embodiment, the flexibility in the Y direction is sufficiently lower than the flexibility in the X direction while favorable display is secured. Therefore, in this embodiment, it is possible to provide a highly reliable and repeatedly bendable display device, lighting device, or electronic device that is not broken when handled and can maintain favorable display.

Note that also when the substrate 137 containing the plurality of glass fibers 103 is provided on the side through which the light 235 is emitted (display surface side), the density of the glass fibers 103 can be adjusted in the above manner.

This embodiment can be implemented in an appropriate combination with any of the structures described in other embodiments.

Embodiment 9

Figure 28A:
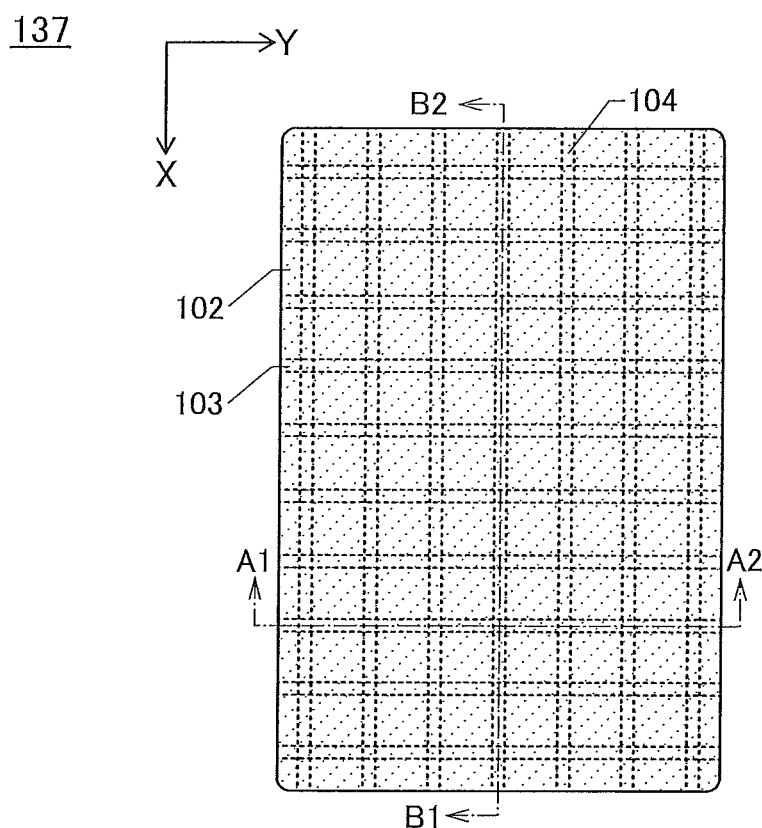
FIGS. 28A to 28C illustrate one mode of a display device.

The case where the substrate 137 contains a plurality of fibers 104 in addition to the plurality of glass fibers 103 is described with reference to FIGS. 28A to 28C. Specifically, the case where the substrate 137 contains the fibers 104 intersecting the glass fibers 103 and having a lower tensile modulus of elasticity or a lower Young's modulus than the glass fibers 103 is described. FIG. 28A corresponds to FIG. 1D that is a top view of the substrate 137.

The substrate 137 in FIG. 28A contains the plurality of glass fibers 103 extending in the Y direction and the plurality of fibers 104 extending in the X direction. In that case, it is preferable that the fibers 104 be softer than the glass fibers 103 and have a lower tensile modulus of elasticity or a lower Young's modulus than the glass fibers 103. Accordingly, the mechanical strength of the substrate 137 can be increased while the flexibility in the Y direction is lower than the flexibility in the X direction.

Figure 28B:
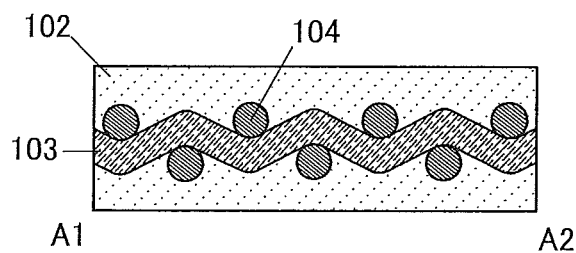
Figure 28C:
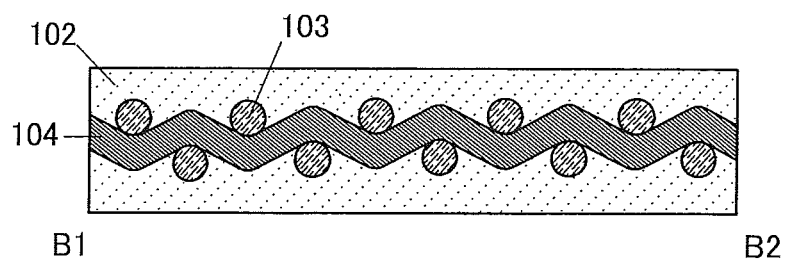

FIG. 28B is a cross-sectional view taken along a dashed-dotted line A1-A2 in FIG. 28A. FIG. 28C is a cross-sectional view taken along a dashed-dotted line B1-B2 in FIG. 28A. The fibers 104 can be provided as though they are interweaved with the glass fibers 103 as illustrated in FIGS. 28B and 28C. However, one embodiment of the present invention is not limited to this structure and a stacked-layer structure may be employed in which the fibers 104 are provided either over or under the glass fibers 103. Alternatively, the insulator 102 containing the glass fibers 103 and the insulator 102 containing the fibers 104 may be stacked, for example.

In this embodiment, since the mechanical strength of the substrate 137 can be increased, the substrate 111 and the substrate 121 included in the display device 100 can be omitted as described in Embodiment 7.

The substrate 137 in this embodiment can have a function as a diffuser plate of a display device, a lighting device, or an electronic device.

This embodiment can be implemented in an appropriate combination with any of the structures described in other embodiments.

Embodiment 10

A method for adjusting a structure of a substrate so that the light-emitting element 125 and the transistor 232 of the display device are positioned on the neutral plane is described with reference to FIGS. 29A and 29B. Note that the neutral plane is a plane in which distortion due to stress, such as compressive stress or tensile stress, is not caused (a plane which does not expand or contract) in response to deformation such as bending.

Figure 29A:
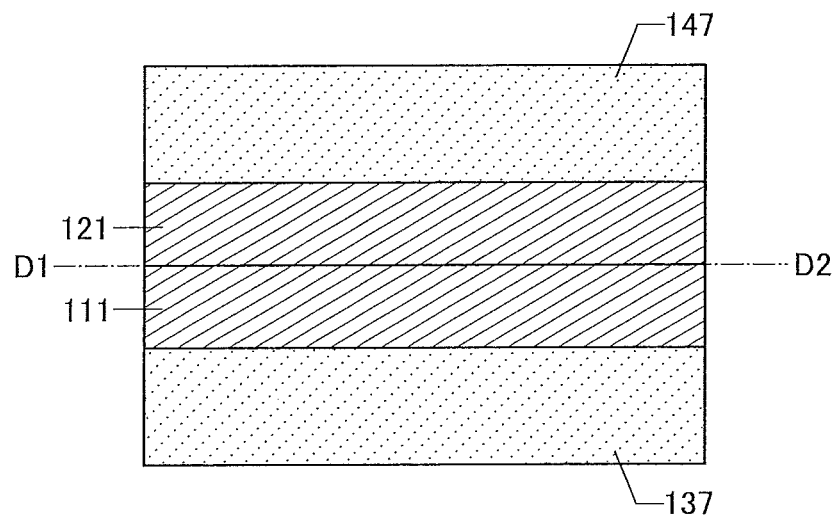
FIGS. 29A and 29B are cross-sectional views illustrating modes of a display device.

A display device illustrated in FIG. 29A includes, from the bottom, the substrate 137; the substrate 111; the light-emitting element 125, the transistor 232, and the like that are not shown; the substrate 121; and the substrate 147. The substrate 111 and the substrate 121 have the same thickness and are formed using the same material. The substrate 137 and the substrate 147 have the same thickness and are formed using the same material. In this case, the neutral plane is positioned at the middle of the display device in the thickness direction, and specifically, the neutral plane is positioned at a portion denoted by a dashed-dotted line D1-D2. Thus, the light-emitting element 125, the transistor 232, and the like are positioned on the neutral plane in the display device shown in FIG. 29A.

When the substrate 137 of the display device shown in FIG. 29A contains the plurality of glass fibers 103, the Young's modulus of the substrate 137 is higher than that of the substrate 147, so that the neutral plane is not necessarily located in the middle of the display device in the thickness direction but might be closer to the substrate 137. Specifically, the neutral plane is not necessarily located in the portion denoted by the dashed-dotted line D1-D2 but might be closer to the substrate 137. In that case, the light-emitting element 125, the transistor 232, and the like whose mechanical strength is not high are not positioned on the neutral plane and thus might be broken because of distortion due to stress when the display device is bent.

Figure 29B:
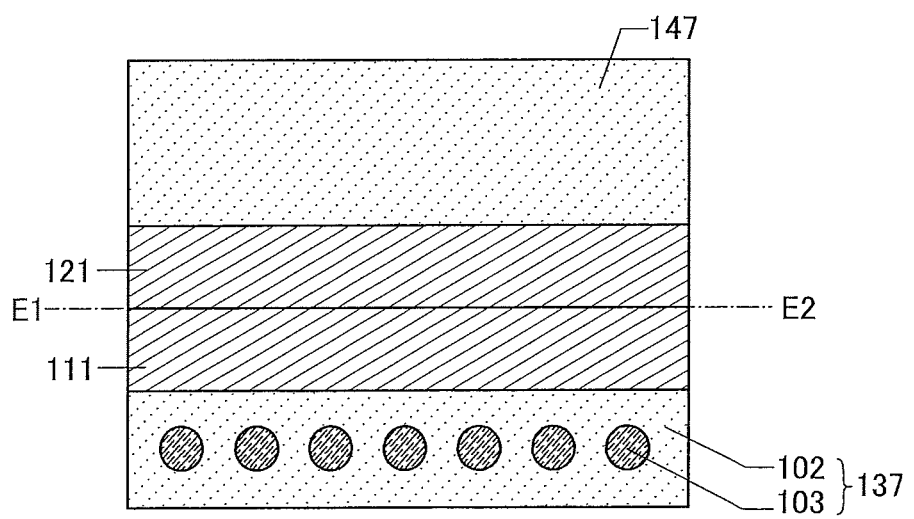

A display device illustrated in FIG. 29B includes, from the bottom, the substrate 137 including the insulator 102 and the glass fibers 103; the substrate 111; the light-emitting element 125, the transistor 232, and the like that are not shown; the substrate 121; and the substrate 147. The substrate 111 and the substrate 121 have the same thickness and are formed using the same material. The substrate 147 is thicker than the substrate 137. Since the Young's modulus of the substrate 137 containing the glass fibers 103 is higher than that of the substrate 147 without a glass fiber, the neutral plane is not located in the middle of the display device in the thickness direction but is closer to the substrate 137. However, because the substrate 147 has a larger thickness than the substrate 137, the light-emitting element 125 and the transistor 232 can be positioned on the neutral plane.

Specifically, the neutral plane in the display device shown in FIG. 29B is positioned at a portion denoted by a dashed-dotted line E1-E2, which is not located in the middle of the display device in the thickness direction but is closer to the substrate 137; however, since the substrate 147 is thicker than the substrate 137, the position of the neutral plane coincides with the positions of the light-emitting element 125 and the transistor 232 that are provided between the substrate 111 and the substrate 121. This makes it possible to prevent the light-emitting element 125 and the transistor 232 from being broken because of distortion due to stress when the display device is bent.

In this embodiment, since the light-emitting element 125, the transistor 232, and the like can be positioned on the neutral plane while the substrate 137 contains the glass fibers 103, it is possible to provide a highly reliable and repeatedly bendable display device, lighting device, or electronic device that is not broken when handled.

Although the thickness of the substrate 147 is made larger than that of the substrate 137 in the method in this embodiment, one embodiment of the present invention is not limited to this method. For example, a stacked-layer structure in which another substrate is bonded to the substrate 147 may be employed. The thickness of the substrate 121 may be made larger than that of the substrate 111.

This embodiment can be implemented in an appropriate combination with any of the structures described in other embodiments.

Embodiment 11

In this embodiment, examples of an electronic device and a lighting device including the display device of one embodiment of the present invention are described with reference to drawings.

As examples of the electronic devices including a flexible display device, the following can be given: television devices (also called televisions or television receivers), monitors of computers or the like, digital cameras, digital video cameras, digital photo frames, mobile phones (also called cellular phones or mobile phone devices), portable game machines, portable information terminals, audio reproducing devices, large game machines such as pachinko machines, and the like.

In addition, the display device can be incorporated along a curved inside/outside wall surface of a house or a building or a curved interior/exterior surface of a car.

Figure 30A:
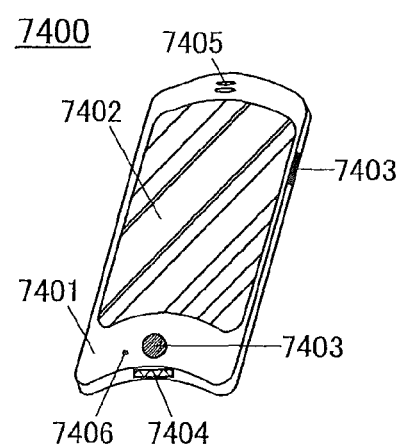
FIGS. 30A to 30E illustrate examples of electronic devices and lighting devices.

FIG. 30A illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using the display device in the display portion 7402.

When the display portion 7402 of the mobile phone 7400 illustrated in FIG. 30A is touched with a finger or the like, data can be input to the mobile phone 7400. Further, operations such as making a call and inputting a character can be performed by touch on the display portion 7402 with a finger or the like.

The power can be turned on or off with the operation button 7403. In addition, types of images displayed on the display portion 7402 can be switched; for example, switching images from a mail creation screen to a main menu screen is performed with the operation button 7403.

Here, the display portion 7402 includes the display device of one embodiment of the present invention. Thus, the mobile phone can have a curved display portion and can be repeatedly bendable and highly reliable.

Figure 30B:
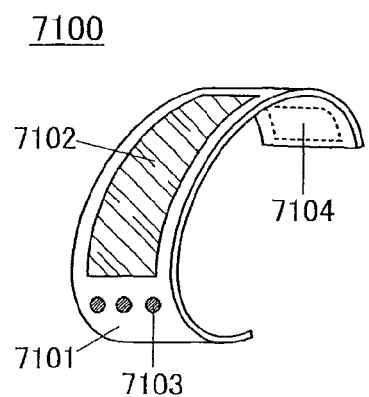

FIG. 30B illustrates an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and can be repeatedly bendable and highly reliable.

Figure 30C:
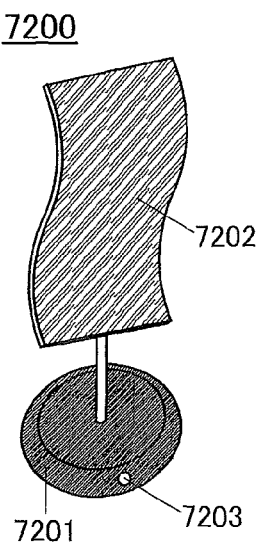
Figure 30D:
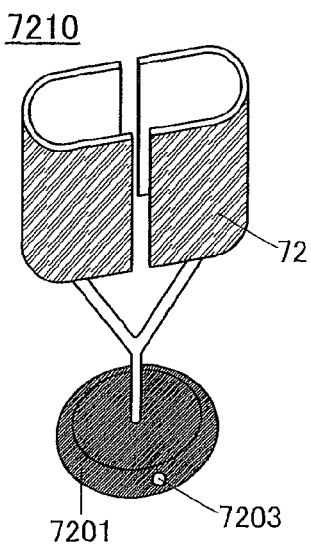
Figure 30E:
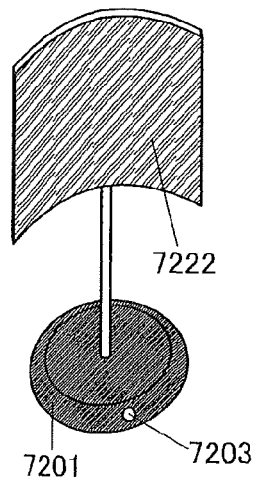

FIGS. 30C to 30E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 30C includes a light-emitting portion 7202 with a wave-shaped light-emitting surface and thus is a good-design lighting device.

A light-emitting portion 7212 included in the lighting device 7210 illustrated in FIG. 30D has two convex-curved light-emitting portions symmetrically placed. Thus, light radiates from the lighting device 7210.

The lighting device 7220 illustrated in FIG. 30E includes a concave-curved light-emitting portion 7222. This is suitable for illuminating a specific range because light emitted from the concave-curved light-emitting portion 7222 is collected to the front of the lighting device 7220.

The light-emitting portion included in each of the lighting devices 7200, 7210, and 7220 is flexible; thus, the light-emitting portion can be fixed on a plastic member, a movable frame, or the like so that an emission surface of the light-emitting portion can be curved freely depending on the intended use.

The light-emitting portions included in the lighting devices 7200, 7210, and 7220 each include the display device of one embodiment of the present invention. Thus, the light-emitting portions can be curved without being broken and the lighting devices can be repeatedly bendable and highly reliable.

Figure 33:
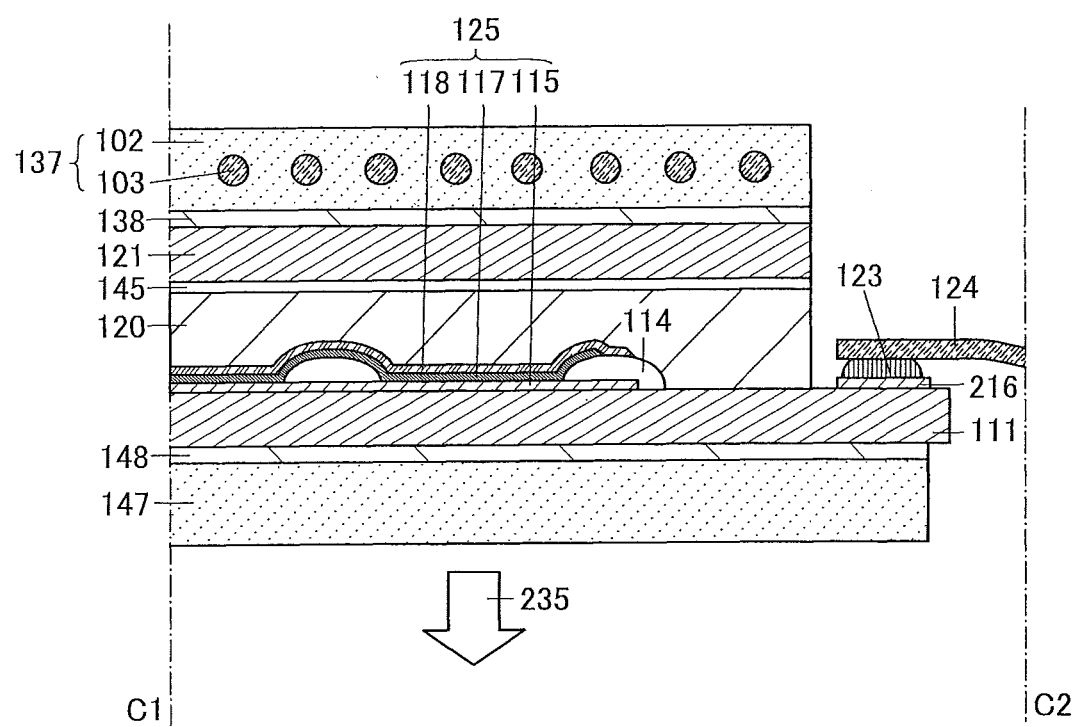
FIG. 33 is a cross-sectional view illustrating one mode of a lighting device.

FIG. 33 shows a cross-sectional view of the lighting device. The lighting device in FIG. 33 includes the light-emitting element 125, the substrate 111, the substrate 121, the substrate 137, the substrate 147, and the like as in the display device 100 illustrated in FIG. 5 but is different from the display device 100 in that the lighting device does not include a transistor and the like. The substrate 137 contains the plurality of glass fibers 103 extending in the Y direction, so that the flexibility of the lighting device in the Y direction is low. Thus, the light-emitting portion can be curved without being broken and the lighting device can be repeatedly bendable and highly reliable. Specifically, in the lighting devices illustrated in FIGS. 30C to 30E, the plurality of glass fibers 103 may extend in the direction intersecting the direction in which the lighting device is desired to be curved, in which case large distortion due to stress caused in a region of the light-emitting portion when the light-emitting portion is curved can be prevented.

Figure 31A:
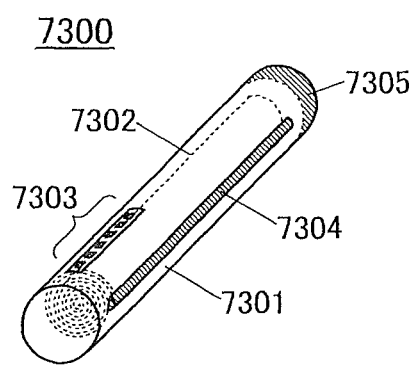
FIGS. 31A and 31B illustrate one example of an electronic device.

FIG. 31A illustrates an example of a portable display device. A display device 7300 includes a cylindrical housing 7301, a rolled flexible display portion 7302, operation buttons 7303, a display portion pull 7304, and a control portion 7305.

The display device 7300 includes the rolled flexible display portion 7302 in the cylindrical housing 7301.

The display device 7300 can receive a video signal with the control portion 7305 and can display the received video on the rolled flexible display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 31B:
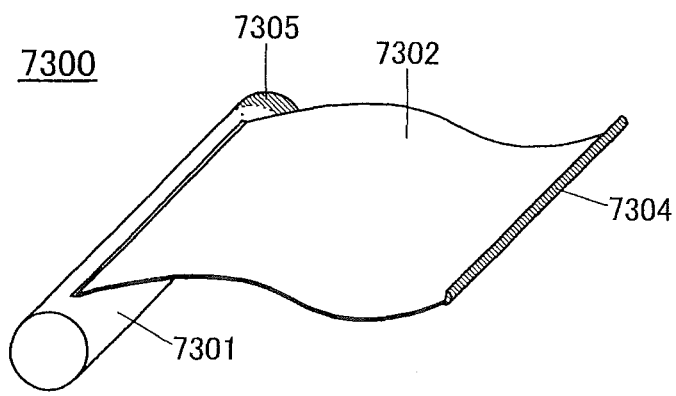

FIG. 31B illustrates a state where the rolled flexible display portion 7302 is pulled out with the display portion pull 7304. Videos can be displayed on the rolled flexible display portion 7302 in this state. Further, the operation buttons 7303 on the surface of the cylindrical housing 7301 allow one-handed operation.

Note that a reinforcement frame may be provided for an edge portion of the rolled flexible display portion 7302 in order to prevent the rolled flexible display portion 7302 from being curved when pulled out.

Note that in addition to this structure, a speaker may be provided for the housing so that sound is output with an audio signal received together with a video signal.

The rolled flexible display portion 7302 includes the display device of one embodiment of the present invention. Thus, there is no possibility that the rolled flexible display portion 7302 is bent in the vertical direction and the horizontal direction when extracted so that defects are caused in the region of the intersection between the bending axes in the vertical direction and the horizontal direction. As a result, the display device 7300 can be lightweight, repeatedly bendable, and highly reliable.

Figure 32A:
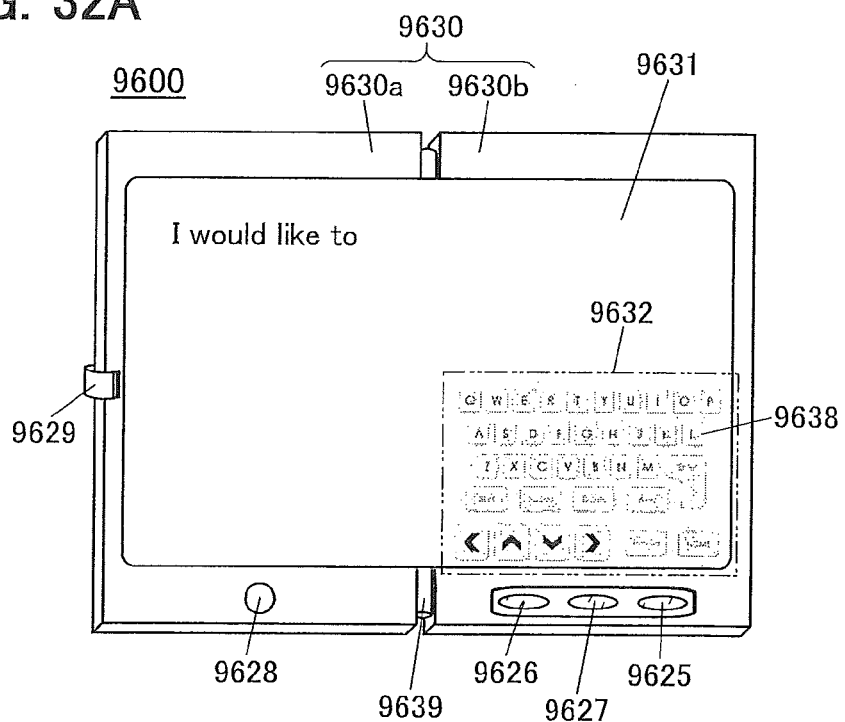
FIGS. 32A to 32C illustrate one example of an electronic device.
Figure 32B:
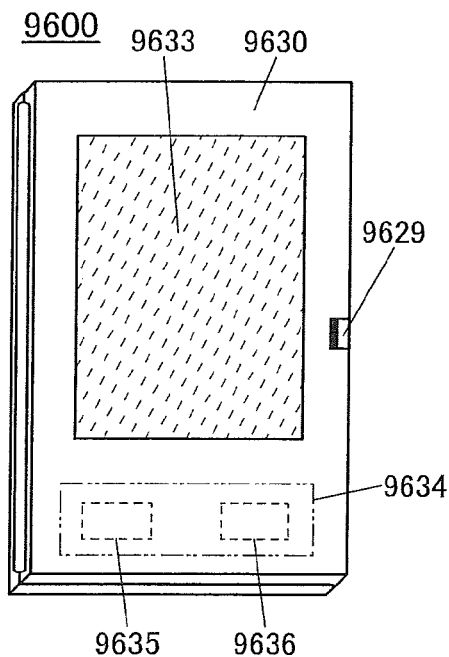

FIGS. 32A and 32B illustrate a double foldable tablet terminal 9600 as an example. FIG. 32A illustrates the double foldable tablet terminal 9600 which is unfolded. The double foldable tablet terminal 9600 includes a housing 9630, a display portion 9631, a display mode switch 9626, a power switch 9627, a power-saving mode switch 9625, a clasp 9629, and an operation switch 9628.

The housing 9630 includes a housing 9630a and a housing 9630b, which are connected with a hinge portion 9639. The hinge portion 9639 makes the housing 9630 double foldable.

The display portion 9631 is provided on the housing 9630a, the housing 9630b, and the hinge portion 9639. By the use of the display device disclosed in the present specification and the like for the display portion 9631, the tablet terminal in which the display portion 9631 is repeatedly bendable and which has high reliability can be provided.

Part of the display portion 9631 can be a touchscreen region 9632 and data can be input when a displayed operation key 9638 is touched. A structure can be employed in which half of the display portion 9631 has only a display function and the other half has a touchscreen function. The whole display portion 9631 may have a touchscreen function. For example, keyboard buttons may be displayed on the entire region of the display portion 9631 so that the display portion 9631 can be used as a data input terminal.

The display mode switch 9626 can switch the display between portrait mode, landscape mode, and the like, and between monochrome display and color display, for example. The power-saving mode switch 9625 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

FIG. 32B illustrates the double foldable tablet terminal 9600 which is folded. The double foldable tablet terminal 9600 includes the housing 9630, a solar cell 9633, and a charge and discharge control circuit 9634. As an example, FIG. 32B illustrates the charge and discharge control circuit 9634 including a battery 9635 and a DC-to-DC converter 9636.

By including the display device that is disclosed in the present specification and the like, the display portion 9631 is foldable. Since the double foldable tablet terminal 9600 is double foldable, the housing 9630 can be closed when the tablet terminal is not in use, for example; thus, the tablet terminal is highly portable. Moreover, since the display portion 9631 can be protected when the housing 9630 is closed, the tablet terminal can have high durability and high reliability for long-term use.

The tablet terminal illustrated in FIGS. 32A and 32B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on both surfaces of the housing 9630, in which case the battery 9635 can be charged efficiently. When a lithium ion battery is used as the battery 9635, there is an advantage of downsizing or the like.

Figure 32C:
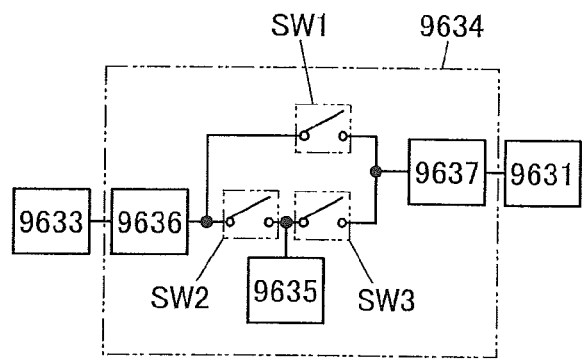

The structure and operation of the charge and discharge control circuit 9634 illustrated in FIG. 32B is described with reference to a block diagram of FIG. 32C. FIG. 32C illustrates the solar cell 9633, the battery 9635, the DC-to-DC converter 9636, a converter 9637, switches SW1 to SW3, and the display portion 9631. The battery 9635, the DC-to-DC converter 9636, the converter 9637, and the switches SW1 to SW3 correspond to the charge and discharge control circuit 9634 illustrated in FIG. 32B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). For example, the battery 9635 may be charged using a non-contact power transmission module that transmits and receives power wirelessly (without contact) or using another charge unit in combination.

It is needless to say that one embodiment of the present invention is not limited to the above-described electronic devices and lighting devices as long as the display device of one embodiment of the present invention is included.

This embodiment can be implemented in an appropriate combination with any of the structures described in other embodiments.

This application is based on Japanese Patent Application serial no. 2013-267177 filed with Japan Patent Office on Dec. 25, 2013, the entire contents of which are hereby incorporated by reference.

What is claimed is:

1. A display device comprising:
   a flexible substrate comprising a plurality of fibrous bodies; and
   a display element over the flexible substrate,
   wherein the plurality of fibrous bodies extend in one direction, and
   wherein flexibility in the one direction is lower than flexibility in another in-plane direction.

2. The display device according to claim 1,
   wherein the one direction is a lateral direction of the display device, and
   wherein the another in-plane direction is a longitudinal direction of the display device.

3. The display device according to claim 1,
   wherein the fibrous body comprises at least one of a glass fiber, a polyvinyl alcohol based fiber, a polyester based fiber, a polyamide based fiber, a polyethylene based fiber, an aramid based fiber, a polyparaphenylene benzobisoxazole fiber, and a carbon fiber.

4. The display device according to claim 1, wherein the flexible substrate comprises silicone rubber.

5. The display device according to claim 1, wherein the display element is a light-emitting element.

6. The display device according to claim 1, wherein the display element is electrically connected to a transistor.

7. The display device according to claim 6,
wherein the transistor comprises an oxide semiconductor, and
wherein the oxide semiconductor comprises a channel formation region.

8. An electronic device comprising:
the display device according to claim 1; and
at least one of a housing, an operation button, and a speaker.

9. A display device comprising:
a flexible substrate comprising a plurality of first fibrous bodies and a plurality of second fibrous bodies; and
a display element over the flexible substrate,
wherein the plurality of first fibrous bodies extend in one direction,
wherein the plurality of second fibrous bodies intersect the plurality of first fibrous bodies,
wherein the plurality of second fibrous bodies is softer than the plurality of first fibrous bodies, and
wherein flexibility in the one direction is lower than flexibility in another in-plane direction.

10. The display device according to claim 9,
wherein the one direction is a lateral direction of the display device, and
wherein the another in-plane direction is a longitudinal direction of the display device.

11. The display device according to claim 9,
wherein the fibrous body comprises at least one of a glass fiber, a polyvinyl alcohol based fiber, a polyester based fiber, a polyamide based fiber, a polyethylene based fiber, an aramid based fiber, a polyparaphenylene benzobisoxazole fiber, and a carbon fiber.

12. The display device according to claim 9, wherein the flexible substrate comprises silicone rubber.

13. The display device according to claim 9, wherein the display element is a light-emitting element.

14. The display device according to claim 9, wherein the display element is electrically connected to a transistor.

15. The display device according to claim 14,
wherein the transistor comprises an oxide semiconductor, and
wherein the oxide semiconductor comprises a channel formation region.

16. An electronic device comprising:
the display device according to claim 9; and
at least one of a housing, an operation button, and a speaker.

* * * * *